United States Patent
Okada et al.

(10) Patent No.: US 7,141,614 B2
(45) Date of Patent: Nov. 28, 2006

(54) PHOTOSENSITIVE RESIN COMPOSITION AND PHOTOSENSITIVE FILMS AND LAMINATES MADE BY USING THE SAME

(75) Inventors: Koji Okada, Otsu (JP); Kaoru Takagahara, Settsu (JP); Toshio Yamanaka, Settsu (JP)

(73) Assignee: Kaneka Corporation, Osaka (JP)

( * ) Notice: Subject to any disclaimer, the term of this patent is extended or adjusted under 35 U.S.C. 154(b) by 60 days.

(21) Appl. No.: 10/493,364

(22) PCT Filed: Oct. 24, 2002

(86) PCT No.: PCT/JP02/11070

§ 371 (c)(1), (2), (4) Date: Apr. 23, 2004

(87) PCT Pub. No.: WO03/038526

PCT Pub. Date: May 8, 2003

(65) Prior Publication Data

US 2004/0265731 A1  Dec. 30, 2004

(30) Foreign Application Priority Data

| Oct. 30, 2001 | (JP) | ............................ 2001-332859 |
| Nov. 12, 2001 | (JP) | ............................ 2001-346460 |
| Nov. 16, 2001 | (JP) | ............................ 2001-351211 |
| Nov. 30, 2001 | (JP) | ............................ 2001-365434 |
| Dec. 12, 2001 | (JP) | ............................ 2001-378014 |
| Feb. 26, 2002 | (JP) | ............................ 2002-049118 |
| Mar. 28, 2002 | (JP) | ............................ 2002-090279 |

(51) Int. Cl.
- *C08F 2/46* (2006.01)
- *G03C 1/73* (2006.01)
- *C08G 73/10* (2006.01)
- *B32B 27/28* (2006.01)
- *C08L 79/08* (2006.01)
- *C08L 83/04* (2006.01)

(52) U.S. Cl. .................... 522/46; 522/64; 522/141; 522/142; 524/708; 524/731; 524/792; 528/26; 528/322; 428/473.5; 430/281.1

(58) Field of Classification Search ............... 522/141, 522/142, 708, 731, 46, 64; 430/280.1, 281.1; 528/26, 322; 428/373.5; 524/708, 731, 524/792

See application file for complete search history.

(56) References Cited

U.S. PATENT DOCUMENTS

| 3,957,512 A | 5/1976 | Kleeberg et al. |
| 3,979,342 A | 9/1976 | Baidins et al. |
| 4,040,831 A | 8/1977 | Rubner et al. |
| 4,278,752 A | 7/1981 | Gervay et al. |
| 4,499,149 A * | 2/1985 | Berger .................... 428/447 |
| 4,586,997 A | 5/1986 | Lee |
| 4,829,131 A * | 5/1989 | Lee ............................ 525/426 |
| 5,045,435 A | 9/1991 | Adams et al. |
| 5,098,814 A * | 3/1992 | Tunney et al. ........... 430/275.1 |
| 5,385,808 A * | 1/1995 | Tokoh et al. ............. 430/283.1 |
| 5,589,319 A * | 12/1996 | Katou et al. ............. 430/288.1 |
| 5,914,354 A * | 6/1999 | Kato ............................ 522/99 |
| 6,096,480 A * | 8/2000 | Ishikawa et al. ......... 430/283.1 |
| 6,096,850 A * | 8/2000 | Chiang et al. ................. 528/38 |
| 6,319,656 B1 * | 11/2001 | Kikkawa et al. ............. 430/325 |
| 6,605,353 B1 | 8/2003 | Okada et al. |
| 6,743,841 B1 * | 6/2004 | Shimizu et al. ............. 524/136 |
| 2004/0235992 A1 * | 11/2004 | Okada et al. ................ 524/115 |

FOREIGN PATENT DOCUMENTS

| EP | 0 214 103 A2 | 3/1987 |
| EP | 0 317 941 A2 | 5/1989 |
| EP | 0 361 409 | 4/1990 |
| EP | 0 488 339 | 6/1992 |
| EP | 0 493 317 | 7/1992 |
| EP | 0 546 768 | 6/1993 |
| EP | 0 666 504 | 8/1995 |
| EP | 0 676 669 | 10/1995 |
| EP | 0 822 448 | 2/1998 |
| EP | 0 860 742 | 8/1998 |
| EP | 0 863 436 A1 | 9/1998 |
| EP | 0 953 590 A1 | 11/1999 |
| FR | 2 369 590 | 5/1978 |
| JP | 49-115541 | 11/1974 |
| JP | 51-040922 | 4/1976 |
| JP | 54-145794 | 11/1979 |
| JP | 59-160140 | 9/1984 |
| JP | 63-027826 | 2/1988 |
| JP | 63-027834 | 2/1988 |

(Continued)

*Primary Examiner*—Susan Berman
(74) *Attorney, Agent, or Firm*—Hogan & Hartson LLP

(57) ABSTRACT

A photosensitive resin composition of the present invention contains a (A) soluble polyimide and a (b) (meth)acrylic compound, the (A) soluble polyimide being soluble in an organic solvent and being synthesized by using an acid dianhydride component and at least one of a diamine component containing a siloxane structure or an aromatic ring structure, and a diamine component having, in its structure, a hydroxyl group a carboxyl group or a carbonyl group, and the (B) (meth)acrylic compound having at least one carbon-carbon double bond, and preferably contains at least one of a (C) photo reaction initiator and a (D) fire retardant. With this arrangement, the photosensitive resin composition of the present invention is capable of having excellent properties. Especially, the photosensitive resin composition of the present invention is so excellently useful that it can be used for electronic parts and the like.

36 Claims, 2 Drawing Sheets

FOREIGN PATENT DOCUMENTS

| | | |
|---|---|---|
| JP | 02-000870 | 1/1990 |
| JP | 03-168214 | 7/1991 |
| JP | 03-170547 | 7/1991 |
| JP | 03-186847 | 8/1991 |
| JP | 04-110348 | 4/1992 |
| JP | 04-120543 | 4/1992 |
| JP | 04-284455 | 10/1992 |
| JP | 05-247211 | 9/1993 |
| JP | 06-011830 | 1/1994 |
| JP | 08-253677 | 1/1996 |
| JP | 09-100350 | 4/1997 |
| JP | 10-265571 | 10/1998 |
| JP | 11-052572 | 2/1999 |
| JP | 2001-075270 | 3/2001 |
| JP | 2001-332859 | 11/2001 |
| JP | 2001-335619 | 12/2001 |
| JP | 2002-003516 | 1/2002 |
| JP | 2002-006490 | 1/2002 |
| JP | 2002-179742 | 6/2002 |
| JP | 2002-351073 | 12/2002 |
| JP | 2002-351074 | 12/2002 |
| WO | 9 317 368 | 9/1993 |
| WO | WO 01/40873 A1 | 6/2001 |

\* cited by examiner

PHOTOSENSITIVE RESIN COMPOSITION AND PHOTOSENSITIVE FILMS AND LAMINATES MADE BY USING THE SAME

TECHNICAL FIELD

The present invention relates to (a) a photosensitive resin composition having a polyimide, (b) a photosensitive film in which the same is used, and (c) a laminate in which the same is used. Especially, the present invention relates to (d) a photosensitive resin composition whose light exposure can be performed by using an ordinary light exposing apparatus, the photosensitive resin composition containing a polyimide-based resin and a (meth)acryl-based compound, (e) a photosensitive film and a laminate that are produced from the photosensitive resin composition, and that are employable as a photosensitive cover lay film or photosensitive dry film resist.

BACKGROUND ART

As a result of rapid developments in electronic devices in recent years, the electronic devices have become more sophisticated in function, able to work with high performance and yet downsized. In accordance with this, electronic parts are required to be downsized and lighter in weight. For this reason, in terms of wiring boards on which the electronic parts are mounted, flexible printed wiring boards (hereinafter, abbreviated as FPCs) that have flexibility, draw attention than ever before, compared with generally-used rigid printed wiring boards. Thus, demand for FPCs rapidly is increasing recently.

Incidentally, most of FPCs are produced from a copper-clad laminate (CCL). On a surface (conduction surface) of such an FPC having a CCL, a circuit (pattern circuit) is uncovered, which is made of copper and patterned in a predetermined pattern. There is a possibility that the pattern circuit thus uncovered is deteriorated. Thus, a cover lay film (insulating protective film) is layered on the surface. The cover lay film also has a function to attain better flexibility.

As a method of layering the cover lay film on the surface of the FPC, the following method is generally used: first, the cover lay film is processed into a predetermined shape, and an adhesive layer is formed on one surface thereof; the cover lay film is placed on the FPC with accurate positioning; then, the cover lay film is thermo compression-bonded on the FPC by pressing or the like.

However, in the generally-used method, an epoxy adhesive agent, an acrylic adhesive agent, or the like is used popularly. Some of those adhesive agents have low heat resistance property such as soldering heat resistance, adhesive strength when subjected to a high temperature, whereas the others are poor in flexibility. Thus, there is a problem that use of those adhesive agents prevents full utilization of property of a polyimide film used as the cover lay film.

Moreover, in case where the cover lay film is processed into a predetermined shape before layering, it is necessary that the cover lay film have a hole or a window in such a position that corresponds to a junction section of the pattern circuit on the surface of the FPC, the junction section being a section to which a terminal section or various parts are to be jointed. However, it is difficult to form a hole or the like in the cover lay film that is so thin. Further, the hole or the like of the cover lay film is almost manually positioned with the jointing part for the terminal section. Thus, it is a problem that such manual operation reduces not only workability in layering the cover lay film on the FPC, but also accuracy in positioning, and further such manual operation leads to a high cost.

Furthermore, as a method other than the method in which the cover lay film is processed before layering, known is a method in which the cover lay film is processed by etching after layering. To explain specifically, a hole, a window, or the like is formed in a predetermined position of the cover lay film by laser etching, plasma etching, or the like method, after the cover lay film is adhered to the FPC by thermo compression bonding. This method improves accuracy in positioning. However, it is a drawback of this method that the formation of the hole or the window in this method takes a long time and requires an expensive processing apparatus and a higher production cost.

Use of a photosensitive resin composition is known as an art to solve the problems. Specifically, the photosensitive resin composition is used as follows:

(1) photosensitive resin composition is applied on a surface of an FPC so as to form a resin layer thereon and to use the resin layer as the cover lay layer; or (2) a photosensitive film produced in advance is layered on a surface of an FPC, then exposed to light and developed with a photomask used, so as to form a resin layer thereon and use the resin layer as a cover lay layer.

Moreover, besides the formation of the cover lay layer, another usage of the photosensitive film is to use the photosensitive film as a film-like shaped photo resist for use in forming, by etching copper foil, a circuit made of copper. In this case, the photosensitive film is peeled off from a printed wiring board or the like after used as a photo resist for the etching.

In the use of such photosensitive resin composition, it is possible to utilize the photosensitive resin composition as the photo resist in exposing and development the resin layer layered on the surface of a CCL on which a circuit is formed. Thus, it is possible to form a hole or a window highly accurately in a predetermined position of the CCL. Furthermore, it is possible to use the resin layer as the cover lay film, by, if necessary, thermally curing the resin layer thereafter. To sum up, the photosensitive cover lay film can be used, not only as an insulating protective film, but also as the film-like shaped photo resist (photosensitive dry resist film). This makes it possible to improve workability and accuracy in positioning.

Especially, the use of a photosensitive cover lay film of dry film type gives the following advantages compared with the method in which the photosensitive resin composition is applied: the use of the photosensitive cover lay film of dry film type eliminates labor and time for applying and drying; and a large number of holes can be formed at once by developing the photosensitive cover lay film of dry film type. Thus, it is possible to manufacture the FPCs more efficiently.

However, the photosensitive resin composition and the photosensitive cover lay film are produced from (meth) acrylic type resin, generally. For example, photosensitive cover lay films whose main component is commercially available (meth)acrylic type resin, are known, which are disclosed in Japanese Publications of Unexamined Patent Applications, Tokukaihei No. 7-278492 (published on Oct. 24, 1995), Tokukaihei No. 7-253667 (published on Oct. 3, 1995), Tokukaihei No. 10-254132 (published on Sep. 25, 1998), Tokukaihei No. 10-115919 (published on May 6, 1998) and the like.

Moreover, apart from the (meth)acryl type resin, a photosensitive cover lay film whose main component is epoxy type resin is also known, for example.

However, those photosensitive cover lay films have such problems that the photosensitive cover lay films are, after curing, inadequate in soldering heat resistance, folding resistance (frangibility, flexing resistance), chemical resistance, electric insulating property, flame resistance, and the like. There has been a demand for improvement of those photosensitive cover lay films.

In view of this, arts in which a resin composition containing the photosensitive polyimide is used have been conventionally developed in order to solve the problems.

Specifically, for example, photosensitive polyimides into which a methacryloyl group is introduced via an ester bonding are disclosed in Japanese Publications of Patents, Tokukousho No. 55-030207 (Japanese Publication of Unexamined Patent application, Tokukaisho No. 49-115541, published on Nov. 5, 1974), and Tokukousho, No. 55-041422 (Japanese Publication of Unexamined Patent application, Tokukaisho No. 51-40922, published on Apr. 6, 1976).

Moreover, in Japanese Publications of Unexamined Patent Applications, Tokukaisho No. 54-145794 (published on Nov. 14, 1979), Tokukaisho No. 59-160140 (published on Sep. 10, 1984), Tokukaihei No. 03-170547 (published on Jul. 24, 1991), Tokukaihei 03-186847 (published on Aug. 14, 1991), Tokukaisho No. 61-118424 (published on Jun. 5, 1986), disclosed are photosensitive polyimides in which (a) an amine compound having a methacryloyl group, or (b) a diisocyanate compound is introduced at a position of a carboxyl group of a polyamic acid.

However, production of the photosensitive polyimides disclosed in those publications needs imidization of a polyamic acid after exposure to light and development. Therefore, there are (1) heat-causing problems: it is necessary to apply a temperature of 250° C. or higher on the FPCs. In general FPCs, application of a high temperature of 250° C. or higher changes crystalline structure of copper thereby deteriorating the circuit made of copper, and (2) problems associated with the imidization: some photosensitive polyimides require removal of an acryloyl group by heat, and the removal of the acryloly group causes signification reduction of film thickness.

Incidentally, besides being layered on the FPC, the photosensitive cover lay film is layered, for example, on a head section of a hard disc apparatus, and the like. The hard disc apparatus is used widely in personal computer and the like. To be used as such in those electronic parts and the like, a flame resistance is required for fear of inflammation due to long-time exposure to the electronic parts to a high temperature. Thus, the photosensitive cover lay film should have a high flame resistance.

As an art that also attempts to improve the flame resistance, Japanese publication of Unexamined Patent Application, Tokukai, 2001-335619, (published on Dec. 4, 2001) discloses a photosensitive cover lay film in which an epoxy-modified polyimide is used. The photosensitive cover lay film disclosed in the publication has sufficient heat resistance, chemical resistance, and folding resistance. However, the photosensitive cover lay film shows a poor fluidity during thermo compression bonding. Thus, it is necessary to press, with a high pressure, the photosensitive cover lay film in order to bond the photosensitive cover lay film with a CCL by pressing. Thus, the art is not practical.

Further, in using the photosensitive resin composition or the photosensitive cover lay film, how to expose them to the light and develop them is also an important factor. In general an alkali aqueous solution is used in light-exposing and development. It is an advantage that the photosensitive cover lay film whose main component is the (meth)acryl resin, can be surely developed because the (meth)acryl type resin has a carboxyl group, which is a hydrophilic group. However, as described above, the photosensitive cover lay film whose main component is the (meth)acryl resin has a problem that the film, after curing, becomes poor in heat resistance, chemical resistance, and folding resistance.

As described above, in case the photosensitive resin composition, or the photosensitive film produced therefrom is used in the electronic parts, it is not easy to attain sufficient properties both before and after curing. Thus, there is a limit in raw materials to use for the production of the photosensitive resin composition and the photosensitive film.

The present invention is contrived in view of the foregoing problems. An object of the present invention is to provide (a) a photosensitive resin composition that contains a polyimide, that has excellent properties, and that has a high practicability to be suitably used in electronic parts and the like, (b) a photosensitive cover lay, a film photosensitive film, and a laminate, which are produced from the photosensitive resin composition, the film photosensitive film being suitable for use as a photosensitive dry resist film.

DISCLOSURE OF INVENTION

The inventors of the present invention, as a result of diligent study in view of the aforementioned problem, found out that use of a composition in which at least a (A) soluble polyimide having a particular structure and a (B) (meth) acrylic compound containing at least one carbon-carbon double bond makes it possible to attain a photosensitive film and a laminate having excellent properties, which are suitably employable as a photosensitive cover lay film and a photosensitive dry film resist. The present invention is based on the finding.

Specifically, a photosensitive resin composition of the present invention contains a (A) soluble polyimide and a (B) (meth)acrylic compound, the (A) soluble polyimide (i) being soluble in an organic solvent and (ii) having at least one of a structural unit represented by Formula (1):

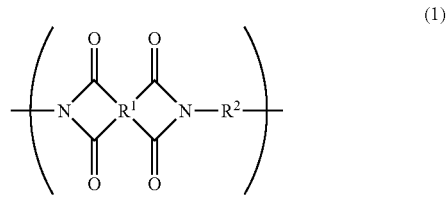

and a structural unit represented by Formula (2):

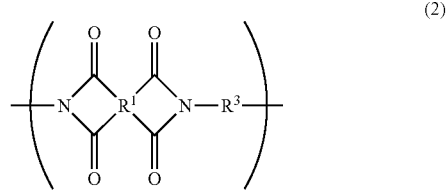

(where, in each formula, $R^1$ is a tetravalent organic group, $R^2$ is a divalent organic group having a siloxane structure or an aromatic ring structure, $R^3$ is a divalent group having, in its structure, a hydroxyl group, a carboxyl group, or a carbonyl group), and the (B) (meth)acrylic compound having at least one carbon-carbon double bond.

Furthermore, the photosensitive resin composition of the present invention preferably contains a (C) photo reaction initiator, and more preferably contains a (D) fire retardant.

Moreover, a photosensitive film of the present invention is produced by forming the photosensitive resin composition in a film-like shape, and a laminate of the present invention includes a photosensitive layer produced from the photosensitive resin composition.

In the above arrangements, the components (A) and (B) are essentially contained, and the component (C) is contained more preferably. Thus, the arrangements attain a photosensitive resin composition in which a sufficient mechanical strength is realized, together with excellent heat resistance, excellent processability, and excellent adhesive property. A photosensitive film produced from the photosensitive resin composition has excellent properties such as (1) being capable of being, directly and without using an adhesive agent, laminated on a target object to which the photosensitive film is to be laminated, (2) having excellent heat resistance and flexibility after being cured, (3) being able to be developed with an alkali aqueous solution, (4) having excellent heat resistance and chemical resistance after curing the film, and (5) the like properties.

Furthermore, by the arrangement in which the component (D) is contained, it is possible to let the cured film to have an excellent flame resistance. Further, by using a non-halogen type compound as the component (D), it is possible not only to satisfy the strict flame resistance standard but also to attain a non-pollution-causing property, low toxic property, highly safe property and the like properties.

The photosensitive resin composition having the above arrangement, and the photosensitive film and laminate in which the photosensitive resin composition is used, are applicable especially as a photosensitive cover lay film and a photosensitive dry film resist, and can be used, for example, (i) in a printed substrate, especially, a flexible printed wiring board, (ii) as a suspension in a head of a hard disc apparatus, and (iii) for the like.

For a fuller understanding of the nature and advantages of the invention, reference should be made to the ensuing detailed description taken in conjunction with the accompanying drawings.

BEST MODE FOR CARRYING OUT THE INVENTION

Figure 1:
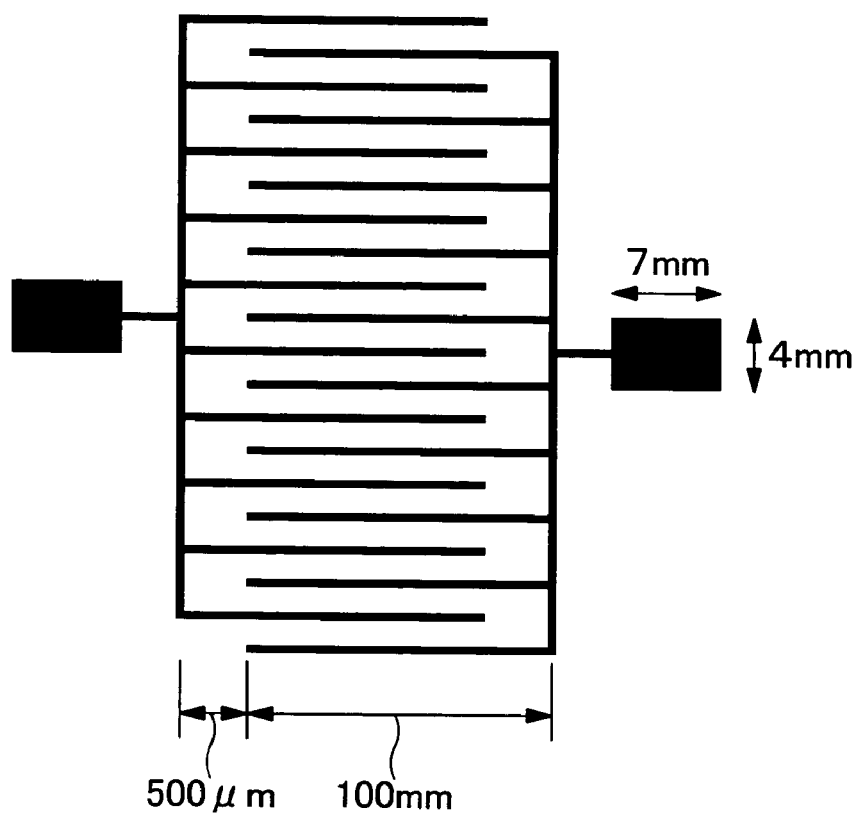
FIG. 1 is a plan view illustrating an example of a circuit having comb-shaped pattern used in an FPC, when using a photosensitive film of an embodiment of the present invention.

An embodiment of the present invention is described in detail below. Note that the present invention is not limited to this.

A photosensitive resin composition of the present invention contains at least a (A) soluble polyimide that is soluble in an organic solvent, the (A) soluble polyimide synthesized from an acid dianhydride component and at least one of (i) a diamine component containing a siloxane structure and an aromatic ring structure, and (ii) a diamine component having, in its structure, a hydroxyl group, a carboxyl group, or a carbonyl group, and a (B) (meth)acrylic compound having at least one carbon-carbon double bond.

Moreover, a photosensitive film of the present invention is produced from the photosensitive resin composition. A laminate of the present invention is so arranged as to include (a) a photosensitive layer that is produced from the photosensitive resin composition, or (b) the photosensitive film as a photosensitive layer.

<(A) Soluble Polyimide>

To begin with, a (A) soluble polyimide denotes a polyimide that is so soluble to a below-exemplified organic solvent that, at a temperature in a range of 20° C. to 50° C., 100 g of the organic solvent dissolves therein 11.0 g or more, preferably 5.0 g or more, more preferable 10 g or more of the soluble polyimide. If the soluble polyimide is less soluble, there is a possibility that it becomes difficult to produce the photosensitive film with a desired thickness.

Examples of the organic solvent for dissolving the (A) soluble polyimide are: (a) formamide-based solvents such as N,N-dimethylformamide, N,N-diethylformamide, and the like, (b) acetoamide-based solvents such as N,N-dimethylacetamide, N,N-diethylacetamide, and the like, (c) pyrrolidone-based solvents such as N-methyl-2-pyrrolidone, N-vinyl-2-pyrrolidone, and the like; phenol-based solvents such as phenol, o-, m-, or p-cresol, xylenol, phenol halides, catechol, and the like; ether-based solvents such as tetrahydrofuran, dioxane, dioxolane, and the like; alcohol-based solvents such as methanol, ethanol, butanol, and the like; cellosolve-based solvents such as butyl cellosolve and the like; hexamethylphosphoramide; and γ-butyrolactone.

Especially, in the present invention, it is preferable to use tetrahydrofuran as the solvent for dissolving the (A) soluble polyimide therein. That is, the (A) soluble polyimide of the present invention is preferably a soluble polyimide that is so soluble to tetrahydrofuran that, at a temperature at 20° C., 100 g of tetrahydrofuran dissolves therein 1.0 g or more, preferably 5.0 g or more, more preferable 10 g or more of the soluble polyimide.

A (A) soluble polyimide used in the present invention is a soluble polyimide (i) being soluble in an organic solvent and (ii) having at least one of a structural unit represented by Formula (1):

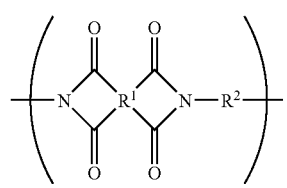

and a structural unit represented by Formula (2):

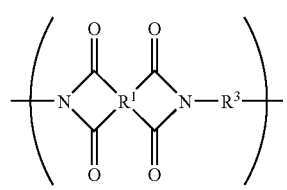

Note that each $R^1$ in Formulas (1) and (2) is independently a tetravalent organic group. $R^2$ is a divalent organic group containing a siloxane structure or an aromatic ring structure, $R^3$ is a divalent group containing a hydroxyl group, a carboxyl group, or a carbonyl group in its structure.

The photosensitive resin composition of the present invention can realize excellent properties, provided that the (A) soluble polyimide thus arranged is used in the photosensitive resin composition.

<(A-1) Soluble Polyimide>

A specific example of the (A) soluble polyimide containing the structural unit of Formula (1) may be a polyimide containing a structural unit represented by Formula (3):

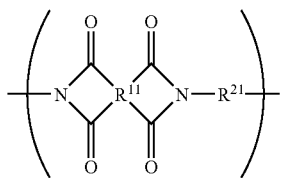

(3)

For easy explanation, this polyimide is referred to as (A-1) soluble polyimide.

In Formula (3), $R^{11}$ is a tetravalent group containing an aromatic ring structure or an alicyclic structure, $R^{21}$ is at least one of (i) a siloxane structure that contains a siloxane bonding (—Si—O—), and (ii) an aromatic ring structure that contains a benzene ring. As a specific example, a siloxane structure may be very preferably represented by Formula (4):

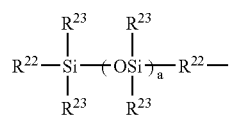

(4)

Note that, in Formula (4), each $R^{22}$ is independently a divalent hydrocarbon group or a divalent phenyl group, each $R^{23}$ is independently an alkyl group having one to three carbon atoms, or a phenyl group, and a is an integer of 3 to 30.

Moreover, as a specific example of the aromatic ring structure as $R^{21}$, a structure represented in Formula (5) may be given very preferably:

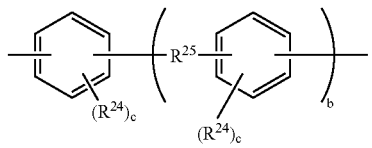

(5)

Note that, in Formula (5), each $R^{24}$ is independently a hydroxyl group or a carboxyl group, $R^{25}$ is a direct bond or a divalent organic group selected from Group (6):

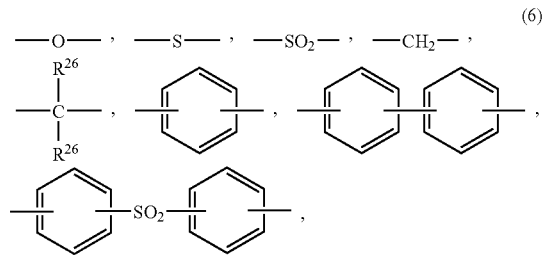

(6)

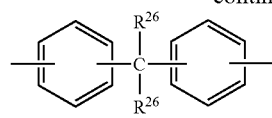

where b is an integer of 0 to 3, c is an integer of 1 or 2. Further, each $R^{26}$ in group (6) is independently a hydrogen atom, a methyl group, or a methyl halide group. In the methyl halide, a number of hydrogen substituted with a halide/s may be in a range of 1 to 3.

As described above, with the arrangement in which the soluble polyimide is the polyimide containing at least one of the structure represented by Formula (4) and the structure represented by Formula (5), it is possible to give high heat resistance and high chemical resistance to the photosensitive resin composition and photosensitive film obtained from the polyimide.

Specifically, the polyimide (A-1) may be a first polyimide (A-1-1) or a second polyimide (A-1-2), the first polyimide (A-1-1) having a recurring unit presented by Formula (7):

(7)

(where $R^{11}$ is identical with $R^{11}$ in Formula (3), $R^{22}$ and $R^{23}$ are identical with $R^{22}$ and $R^{23}$ in Formula (4), and a is any one of integers 3 to 30), and the second polyimide (A-1-2) having a recurring unit represented by Formula (8):

(8)

(where $R^{11}$ is identical with $R^{11}$ in Formula (3), $R^{24}$ and $R^{25}$ are respectively identical with $R^{24}$ and $R^{25}$ in Formula (5), b is any one of integers 0 to 3, and c is an integer of 1 or 2).

In other words, the polyimide (A-1-1) is the (A-1) soluble polyimide in which $R^{21}$ in Formula (3) is the siloxane structure represented by Formula (4), and the polyimide(A-1-2) is the (A-1) soluble polyimide in which $R^{21}$ in Formula (3) is the aromatic ring structure represented by Formula (5).

The photosensitive resin composition of the present invention is so arranged that as to contain at least one of the first polyimide(A-1-1) and the second polyimide(A-1-2), as the (A-1) soluble polyimide. However, it is more preferable that the photosensitive resin composition have both the two types of the polyimides. It is more preferable that, besides the two types of the polyimides, the photosensitive resin composition further contain a polyimide other than the two types of the polyimides. Specifically, the other polyimide is a polyimide in which $R^{21}$ is a structure (divalent organic group) other than the siloxane structure represented by Formula (4), and the aromatic ring structure represented by Formula (5). For easy explanation, the other polyimide is denoted as a "third polyimide". Therefore, the photosensitive resin composition of the present invention may contain a polyimide (the third polyimide) that is other than the (A) soluble polyimide. Note that it is possible to describe the third polyimide as a polyimide that has a recurring unit having a structure represented by Formula (3) in which $R^{20}$ is replaced with $R^{21}$.

Here, there is no particular limit in how much the soluble polyimides (A-1) of two types are contained. However, it is preferable that first polyimide(A-1-1) content and second polyimide(A-1-2) content are respectively in a range of 5 mol % to 80 mol %, and in a range of 0.5 mol % to 80 mol %, where the total amount of the first polyimide(A-1-1) and the second polyimide(A-1-2) (the total amount of the (A-1) soluble polyimide) is 100 mol %. Moreover, third polyimide content is the rest. With this arrangement, it is possible to attain more improved property of the resultant photosensitive resin composition and photosensitive film.

<(A-2) Soluble Polyimide>

Specifically, the (A) soluble polyimide having a structural unit of Formula (2) may be a polyimide having a recurring unit represented by Formula (9):

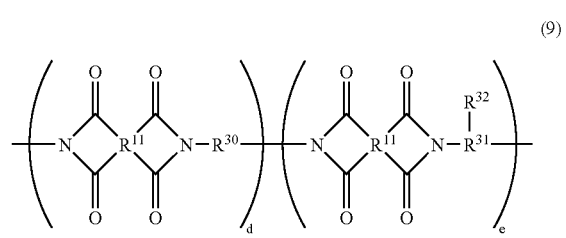

(9)

Note that the polyimide is referred to as a "(A-2) soluble polyimide", for easy explanation.

In Formula (9), $R^{11}$ is identical with $R^{11}$ in Formula (3), $R^{30}$ is a divalent organic group, $R^{31}$ is trivalent organic group, $R^{32}$ is a hydroxyl group, a carboxyl group, or a monovalent organic group selected from Group (10) listed below, d is an integer not less than 0, and e is an integer not less than 1:

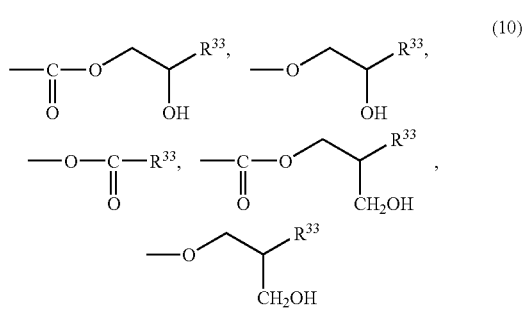

(10)

Further, $R^{33}$ in Group (10) is a monovalent organic group having at least one functional group selected from the group consisting of an epoxy group, a carbon-carbon triple bond, and a carbon-carbon double bond.

The (A-2) soluble polyimide is arranged such that $R^{31}$ in Formula (9) has a structure that is $R^3$ in Formula (2) described above, that is, a divalent organic group having a hydroxyl group, a carboxyl group or a carbonyl group. More preferably, $R^{31}$ in Formula (9) is an aromatic ring structure in Formula (11) or (12). Moreover, $R^{30}$ in Formula (9) may be a siloxane structure of Formula (13), besides the aromatic ring structure of Formula (11) or (12):

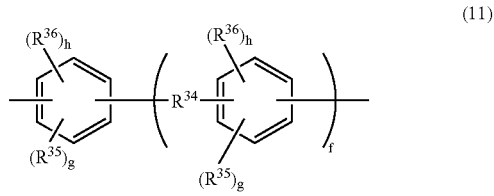

(11)

$R^{34}$ in Formula (11) is a direct bond, —$CH_2$—, —$C(CH_3)_2$—, —$C(CF_3)_2$—, —O—, —CO—, —COO—, or —$SO_2$—. Each $R^{35}$ in Formula (11) is independently a hydroxyl group or a carboxyl group. Each $R^{36}$ in Formula (11) is independently a hydrogen atom, a hydroxyl group, a carboxyl group, a halogen atom, a methoxy group, or an alkyl group having one to five carbon atoms. In Formula (11), f is an integer of 0 to 4, each g and each h is independently an integer of 0 to 4.

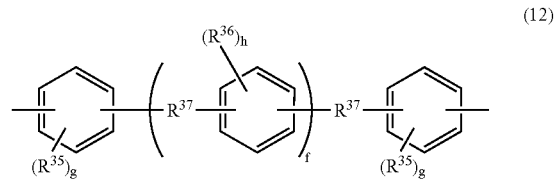

(12)

Similarly, $R^{35}$ and $R^{36}$ in Formula (12) are respectively identical with $R^{35}$ and $R^{36}$ in Formula (11). $R^{37}$ in Formula (12) is a direct bond, —CO—, —O—, —$C(CF_3)_2$—, —$C(CH_3)_2$—, —COO—, or —SO2—. In Formula (12), f, g, and h are respectively identical with f, g and h in Formula (11).

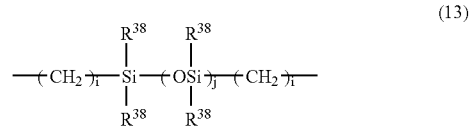

(13)

Similarly, in Formula (13), each $R^{38}$ is independently an alkyl group having one to twelve carbon atoms, a phenyl group, or a methoxy group, i is an integer of 1 to 5, and j is an of 1 to 20.

As described above, by the arrangement in which the (A) soluble polyimide is the polyimide that have at least any one of the structures represented by Formulae (11), (12), and (13), it is possible to give high heat resistance and high chemical resistance to the resultant photosensitive resin composition and photosensitive film.

Moreover, solubility to an alkali aqueous solution is improved because the (A-2) soluble polyimide has a hydroxyl group or a carboxyl group in its side chain. Thus, it is possible to perform alkali development of the photosensitive resin composition or the photosensitive film of the present invention.

Moreover, by the arrangement in which the (A-2) soluble polyimide is a modified polyimide having a monovalent organic group selected from Group (10), it is possible to give a high heat resistance, excellent mechanical properties, and excellent electric properties, to the photosensitive resin composition that has been cured, or the cured photosensitive film that has been cured.

<Structure of $R^1$>

Here, the (A-1) soluble polyimide and the (A-2) soluble polyimide are the (A) soluble polyimide in which $R^1$ in Formula (1) and $R^2$ in Formula (2) are specified. $R_1$ and $R^2$ are structures derived from a diamine component that is one of two monomers components that are used as raw materials, as clearly understood from a later described production method of the (A) soluble polyimide.

The (A) soluble polyimide of the present invention is arranged such that the structure derived from the diamine component has each structure described above. As to $R^1$ in Formulae (1) and (2) (corresponding to $R^{11}$ in Formula (3) or (9)), that is, a structure derived from an acid anhydride that is another monomer component used as a raw material, may be a tetravalent organic group regardless of whether the (A) soluble polyimide is the (A-1) soluble polyimide or the (A-2) soluble polyimide. However, it is preferable that, in Formula (3) or (9), $R^{11}$ is a tetravalent group selected from Group (14):

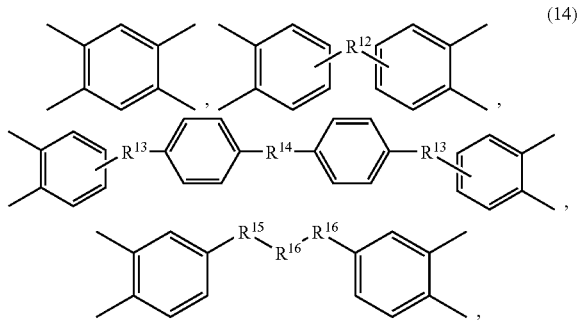

(14)

It is especially preferable that, in Formula (3) or (9), $R^{11}$ is a tetravalent group selected from Group (15):

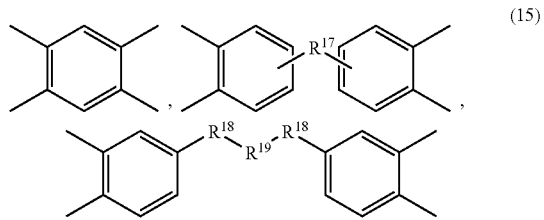

(15)

In Group (14), $R^{12}$ is a direct bond, —O—, —CH$_2$—, —CO—, —C(CH$_3$)$_2$—, —C(CF$_3$)$_2$—, —SO$_2$, —SO$_2$—, or a divalent organic group; each $R^{13}$ is independently —O—, or —COO—; $R_1^4$ is a direct bond, —O—, —CH$_2$—, —CO—, —C(CH$_3$)$_2$—, —CH$_2$—C(CH$_3$)$_2$—CH$_2$—, a straight-chain alkyl group having 1 to 20 carbon atoms, —C(CF$_3$)$_2$—, —SO$_2$, —SO$_2$, or a divalent organic group; each $R^{15}$ is independently —COO— or —O—; $R^{16}$ is —CH$_2$CH$_2$— or —C$_6$H$_4$—C(CH$_3$)$_2$—C$_6$H$_4$— or a divalent organic group. Similarly, in Group (15), $R^{17}$ is a direct bond —C(CF$_3$)$_2$—, —CO—, or —O—; $R^{18}$ is —COO— or —O—; $R^{19}$ is —CH$_2$CH$_2$— or —C$_6$H$_4$—C(CH$_3$)$_2$—C$_6$H$_4$—, or a divalent organic group.

Especially, it is preferable that the (A-1) soluble polyimide contains a tetravalent organic group $R^{11}$ selected from Group (15), and the tetravalent organic group shares, by molar ratio, 10 mol % or more in the total amount of $R^1$ contained in the (A) soluble polyimide. With this arrangement, it is possible to attain more improved properties in the resultant photosensitive resin composition and photosensitive film.

<Other Characteristics of the (A) Soluble Polyimide>

There is no particular limit in weight-average molecular weight of the (A) soluble polyimide of the present invention. However, the weight-average molecular weight of the (A) soluble polyimide of the present invention should be in a range of 10,000 to 300,000, while the weight-average molecular weight of the (A) soluble polyimide of the present invention is preferably in a range of 10,000 to 150,000, and more preferably in a range of 30,000 to 100,000.

Moreover, it is preferable that the (A) soluble polyimide has a boiling point of 120° C. and is soluble in an organic solvent.

Moreover, in the present invention, especially in the arrangement in which the first polyimide(A-1-1) and the second polyimide(A-1-2) are used as the (A) soluble polyimide, it is preferable that the (A) soluble polyimide has a log-mean viscosity (0.5 g/100 ml) of 0.16 or more. With this arrangement, it is possible to attain the photosensitive resin composition and photosensitive film of more improved properties.

<Production Method of (A) Soluble Polyimide>

Described below is a production method of the (A) soluble polyimide discussed above.

In general, polyimides are prepared by dehydrating a polyamic acid for imidization, the polyamic acid having been prepared by reacting a diamine and a tetracarboxylic dianhydride (acid dianhydride) in an organic solvent. Especially, a polyimide prepared from an aromatic tetracarboxylic dianhydride and an aromatic diamine is preferable because this polyimide easily attain a high molecular weight. On the other hand, use of aliphatic tetracarboxylic dianhydrides, which have a low reactivity, often faces a difficulty to attain a polyimide having a high molecular weight. Moreover, aliphatic diamines, which are highly basic, are precipitated as a salt out of a solution system in synthesizing the polyamic acid, which is a precursor of the polyimide. Thus, use of aliphatic diamines has a difficulty to attain a polyimide having a high molecular weight.

Thus, it is preferable also in the present invention that the polyimide prepared from an aromatic tetracarboxylic dianhydride and an aromatic diamine. Note that the tetracarboxylic dianhydride is just referred to as an acid dianhydride, without limiting the acid dianhydride to aromatic or aliphatic one.

<Polymerization of Polyamic Acid>

The (A) soluble polyimide can be prepared from a polyamic acid that is a precursor thereof. The polyamic acid is prepared by reacting, in an organic solvent, a diamine with an acid dianhydride. Specifically, under an inert atmosphere of argon, nitrogen, or the like, the diamine is dissolved in an organic solvent, or diffused in an organic solvent to a slurry. Then, the acid dianhydride dissolved in an organic solvent, diffused in an organic solvent to a slurry, or being in a solid state is added into the diamine in the solvent, or into the slurry of the diamine. It is preferable that the polyamic acid thus obtained is a polyamic acid solution in which the polyamic acid is dissolved in the organic solvent.

In this case, obtained is a polyamic acid whose structure is constituted of an acid dianhydride and a diamine, if the diamine and the acid anhydride are substantially equimolar. Moreover, in case where two types or more of acid dianhydrides and two types or more of diamines are used, it is possible to arbitrarily obtain a polyamic acid copolymer, by substantially equimolarly regulating a molar ratio between a total amount of the diamines and a total amount of the acid dianhydrides. There is no particular limit in how to carry out the polymerization by using the diamines and the acid dianhydrides, by using the diamine and the acid dianhydrides, or by using the diamines and the acid dianhydride.

For example, the solution of a polyamic acid polymer may be prepared as follows: diamine-1 and diamine-2 are added in an organic polar solvent in advance; then the acid dianhydride is added therein; and polymerization is carried out. Moreover, the solution of a polyamic acid polymer may be prepared as follows: diamine-1 is added in an organic polar solvent in advance; the acid dianhydride is added therein, then a resultant solution is stirred for a while; then, diamine-2 is added; and polymerization is carried out. Alternatively, the solution of a polyamic acid polymer may be prepared as follows: an acid dianhydride is added in advance; then, diamine-1 is added, and then a resultant solution is stirred for a while; then, diamine-2 is added, and then a resultant solution is stirred for a while; then, diamine-3 is added; then polymerization is carried out.

There is no particular limit in a temperature at which the reaction of the diamine and the acid anhydride is carried out. However, it is preferable that the reaction of the diamine and the acid anhydride is carried out at a temperature in a range of $-20°$ C. to $90°$ C. Moreover, there is no particular limit in how long the reaction of the diamine and the acid anhydride is performed, provided that the reaction is performed in a period in a range of 30 minutes to 24 hours approximately.

An average molecular weight of the polyamic acid thus obtained is preferably in a range of 5,000 to 1,000,000, and more preferably in a range of 5,000 to 300,000. An average molecular weight of the polyamic acid less than 5,000 causes a low molecular weight of the (A) soluble polyimide finally obtained. When the (A) soluble polyimide having such a low molecular weight is used as it is, it tends to result in that a film after curing is fragile. On the other hand, an average molecular weight of the polyamic acid more than 1,000,000 tends to cause a high viscosity of the polyamic acid solution thus obtained. The polyamic acid solution thus obtained would become difficult to handle due to the high viscosity.

<Organic Polar Solvent>

There is no particular limitation in which type of the organic polar solvent is used in a synthesis reaction of the polyamic acid (reaction of the diamine and the acid dianhydride). Examples of the organic polar solvents are: sulfoxide-based solvents such as dimethyl sulfoxide, diethyl sulfoxide, and the like; formamide-based solvents such as N,N-dimethylformamide, N,N-diethylformamide, and the like; acetamide-based solvents such as N,N-dimethylacetamide, N,N-diethylacetamide, and the like; pyrrolidone-based solvents such as N-methyl-2-pyrrolidone, N-vinyl-2-pyrrolidone, and the like; phenol-based solvents such as phenol, o-, m-, or p-cresol, xylenol, phenol halide, catechol, and the like; ether-based solvents such as tetrahydrofuran, dioxsane, dioxolane, and the like; alcohol-based solvents such as methanol, ethanol, butanol, and the like; cellosolve-based solvents such as butyl cellosolve, and the like; hexamethylphosphoramide, γ-butyrolactone, and the like.

Those organic polar solvents may be used solely or in appropriate combination as a mixture. Further, besides those organic polar solvents, aromatic hydrocarbons such as xylene, toluene, and the like. That is, there is no particular limitation in type of solvent used for the synthesis reaction of the polyamic acid, provided that the solvent dissolves the polyamic acid.

In a preferable production method of the (A) soluble polyimide (the preferable production method is described later), removal of the organic solvent and imidization are carried out at once by heating, under reduced pressure, the polyamic acid solution thus obtained by synthesizing the polyamic acid. Therefore, in terms of production steps, it is more advantageous to select the organic solvent that can dissolve the polyamic acid therein, and, if possible, that has a lower boiling point.

<Imidization of the Polyamic Acid>

The photosensitive resin composition and photosensitive film of the present invention is prepared from the (A) soluble polyimide that has been imidized. Thus, in the present invention, it is necessary to imidize the polyamic acid. Conventionally, the imidization is carried out after bonding the photosensitive resin composition and photosensitive film onto an FPC or the like. Thus, conventionally, it is necessary to expose the polyamic acid to a high temperature of $250°$ C. or more for a long time. The exposure sometime deteriorates (i) a copper foil on a surface of the FPC and (ii) that part of the surface of the FPC which is made of a compound other than the polyimide. In the present invention, no such deterioration of the FPC or the like is caused, because the photosensitive resin composition or photosensitive film that has been imidized is used in the present invention.

The imidization of polyamic acid produces water. The water thus produced easily causes hydrolysis of the polyamic acid, thereby resulting in a low molecular weight. Thus, it is preferable to carry out the imidization while removing the water thus produced.

There is no particular limitation in how to carry out the imidization while removing the water. For example, the following three methods are adoptable.

(1) A method in which the water is removed by azeotrope with an azeotrope solvent such as toluene, xylene, or the like.

(2) A chemical imidization method in which (i) an aliphatic acid dianhydride such as acetic anhydride, or the like, and (ii) a tertiary amine such as triethylamine, pyridine, picoline, isoquinoline, or the like, are added.

(3) A method in which imidization is carried out by heat application under reduced pressure.

In the method (1) in which the water is removed by azeotrope, the water produced from the imidization is purposefully removed out of a system by heating the water and the azeotrope solvent above their boiling points. This method is quite effective for a polyimide that is dissolved in a solvent during heating.

In the chemical imidization method (2), the imidization is carried out while chemically removing the thus produced water by turning the aliphatic dianhydride into a fatty acid. After the imidization, the polyimide solution is introduced into a solvent that is a poor solvent with respect to a polyimide, thereby precipitating the polyimide so as to purify the polyimide by removing the aliphatic acid dianhydride and the tertiary amine that remain in a system.

In the method (3) in which the heat is applied under reduced pressure, the water produced from the imidization is heated under the reduced pressure, so as to be removed out of a system purposefully.

Any of the methods (1) to (3) may be adopted. However, the method (3) is most preferable, because it is possible to avoid reduction in the molecular weight by purposefully removing the water and inhibiting the hydrolysis.

In the method (3), a large molecular weight of the polyimide can be expected, even in a case where (i) a tetracarboxylic acid, (ii) an acid dianhydride whose one anhydride is opened by addition of hydrogen, or (iii) the like, is present in the acid dianhydride used as the raw material. To be specific, in case where an acid dianhydride whose one anhydride is opened by addition of hydrogen is present in the acid dianhydride, there is a possibility that the polymerization reaction of the polyamic acid is stopped thereby resulting in a polyamic acid of a low molecular weight. Even in this case, by applying the heat application under the reduced pressure during the imidization, the opened ring of the acid dianhydride may be closed again so as to turn the acid dianhydride having the opened ring into an acid dianhydride. Therefore, there is a possibility that, during the imidization, the acid dianhydride reacts with an amine remained in the system. Thus, there is a possibility that the molecular weight of the polyimide may become larger than the molecular weight of polyamic acid before imidization.

The following specifically explains how the imidization is carried out in the method (3). Without particular limitation, any method in which heat is applied to dryness under reduced pressure. In case a batch-type method is adopted, a vacuum oven may be used. In case a continuous-type method is adopted, for example, an extruder having a decompressor may be used, for example. An extruder having two or three screws is preferable. An amount to produce decides which type of methods is to be used.

Note that the "extruder having a decompressor" performs heat application and fusion extrusion of thermoplastic resin. The extruder may be an apparatus constructed by combining a general fusion extruder, for example, having two or three screws, with a device for removing the solvent under the reduced pressure. Such apparatus may be constructed by attaching a decompressor to a conventional fusion extruder, or such apparatus in which a function of decompressing additionally may be manufactured. By using the apparatus, the polyamic acid is imidized while the extruder mixes and kneads the polyamic acid solution. Thereby, the solvent and the water produced during the imidization are removed, thus leaving the produced soluble polyimide in a last stage of the imidization.

There is no particular limitation in heating conditions as to how much temperature is applied during the imidization, provided that the temperature applied is in a range of 80° C. to 400° C. While it is necessary that a lower limit of the temperature be 80° C., the lower limit of the temperature is preferably 100° C. or higher, and more preferably 120° C. or higher. As long as the lower limit is at the temperature, efficient imidization can be attained while it is also possible to remove the water efficiently. On the other hand, an upper limit of the temperature is set at a temperature equal to or higher than a temperature at which thermolysis of the polyimide to be used takes place. In general, the imidization is almost completed in a range of 250° C. to 350° C. Thus, the upper limit of the temperature is set within this range.

As to the pressure reached by the decompression, a lower pressure is more preferable. However, the pressure is not particularly limited, provided that the pressure allows efficient removal of water that is produced during the imidization performed with the heating condition. Specifically, it is necessary that the pressure of the heat application under the reduced pressure be in a range of 0.09 Mpa to 0.0001 Mpa. It is preferable that the pressure of the heat application under the reduced pressure is in a range of 0.08 Mpa to 0.0001 Mpa. And it is more preferable that the pressure of the heat application under the reduced pressure is in a range of 0.07 Mpa to 0.0001 Mpa.

<Introduction of Functional Group>

In order to give a better reactivity and curing property to the (A) soluble polyimide thus obtained in the manner described above, an arrangement in which a modified polyimide is used is preferable. The modified polyimide is obtained by reacting (i) a soluble polyimide to which a hydroxyl group and/or a carboxyl group is introduced, with (ii) a compound having an epoxy group that is reactive with the soluble polyimide. The modified polyimide is excellent in reactivity and curing property because later-described functional groups are introduced in the modified polyimide.

It is preferable that the compound having an epoxy group further has two or more photo polymerization and/or thermal polymerization functional groups selected from the group consisting of an epoxy group, a carbon-carbon triple bond, and a carbon-carbon double bond. By introducing such photo polymerization and/or thermal polymerization functional groups, it is possible to give a good curing property and bonding property to the resultant photosensitive resin composition or photosensitive film.

Specifically, the modified polyimide that can be used as the (A) soluble polyimide in the present invention, is obtained by reacting, with a compound having an epoxy group, the (A-2) soluble polyimide dissolved in an organic solvent, the (A-2) soluble polyimide having at least one recurring unit represented by Formula (9). Here, it is preferable that the compound having an epoxy group is (i) epoxy resin having two or more epoxy groups, and (ii) a compound that has an epoxy group and further has two or more functional groups selected from the group consisting of a carbon-carbon triple bond and a carbon-carbon double bond.

The epoxy resin having two or more epoxy groups is not particularly limited, provided that the epoxy resin has two or more epoxy groups in its molecule.

Specific examples are: bis phenol-based epoxy resin such as Epicoate 828 (product name, made by Yuka Shell Corp.) and the like, ortho cresol novolak-based epoxy resin such as 180S65 (product name, Yuka Shell Corp.); bis phenol A novolak-based epoxy resin such as 157S70 (product name, Yuka Shell Corp.) and the like; trishydroxyphenylmethane novolak-based epoxy resin such as 1032H60 (product name, Yuka Shell Corp.); naphthalenealkyl novolak-based epoxy resin such as ESN 375 (product name, made by Nippon Steel Chemical Co., Ltd.) and the like; glycidyl amine-based resin such as tetraphenyrolethane 1031S (product name, Yuka Shell Corp.), YGD 414S (product name Toto Chemicals Corp.), trishydroxyphenylmethane EPPN 502H (product name, Nippon Kayaku Co., Ltd.), Special bisphenol VG 3101L (product name, made by Mitsui Chemicals Inc.), special naphthol NC 7000 (product name, Nippon Kayaku Co., Ltd.), TETRAD-X, TETRAD-C (product names, Mitsubishi Gas Chemical Company Inc.), and the like; and the like.

There is no particular limitation as to an amount of the epoxy resin to add. However, it is preferable that the amount of the epoxy resin is within a range of 1 to 30 parts by weight with respect to 100 parts by weight of the (A-2) soluble polyimide. If the amount of the epoxy resin is less than 1 part by weight, it cannot be expected that the resultant photosensitive resin composition or photosensitive film have an improved bonding strength with respect to the copper foil. On the other hand, the amount of the epoxy resin exceeding 30 parts by weight is not preferable because the cured film tends to be hard and fragile if the amount of the epoxy resin is more than 30 parts by weight.

The compound having an epoxy group and a carbon-carbon double bond is not particularly limited, provided that the compound has an epoxy group and a double bond in its molecule. Specifically, examples of the compound having an epoxy group and a carbon-carbon double bond are: acrylglycidyl ether, glycidyl acrylate, glycidyl methacrylate, glycidyl vinyl ether, and the like.

Further, the compound having an epoxy group and a carbon-carbon triple bond is not particularly limited, provided that the compound has an epoxy group and a triple bond in its molecule. Specifically, examples of the compound having an epoxy group and a carbon-carbon triple bond are: propargyl glycidyl ether, glycidyl propionate ethynylglycidyl ether, and the like.

Moreover, the curing progresses efficiently by an arrangement in which an epoxy curing agent is added in an amount in a range of 1% to 10% by weight with respect to an amount of the epoxy resin to be added. The epoxy curing agent is not particularly limited, and may be any well known epoxy curing agent such as: amine compounds such as 4,4'-diaminodiphenylmethane and the like; imidazole compounds; acid dianhydrides; phenol resin; acidic curing agents; and the like. Moreover, various coupling agents may be mixed in.

There is no particular limitation in the organic solvent used for dissolving the (A-2) soluble polyimide therein so as to react the (A-2) soluble polyimide with the compound having the epoxy group, provided that the organic solvent is inert with the epoxy group and dissolves the (A-2) soluble polyimide having the hydroxyl group and/or carboxyl group. Specifically, examples of the organic solvent are: ether-based solvents such as tetrahydrofuran, dioxsane, and the like; alcohol-based solvents such as methanol, ethanol, butanol and the like; cellosolve solvents such as butyl cellosolve and the like; hexamethylphosphoramide, γ-butyrolactone; aromatic hydrocarbons such as xylene, toluene, and the like; and the like. Those organic solvents may be used solely or in appropriate combination thereof as a mixture. Because the organic solvent is removed in a later stage, to select an organic solvent that has a lower boiling point is more advantageous in terms of production.

A reaction temperature at which the (A-2) soluble polyimide dissolved in the organic solvent is reacted with the compound having the epoxy group, is preferably is carried out at a temperature in a range of 40° C. to 130° C. In this range of temperature, the epoxy group reacts with the hydroxyl group/carboxyl group. Especially, for the compound having the epoxy group and the double bond or the triple bond, it is desirable that the reaction is carried out at a temperature at which the double bond or the triple bond is not cross-linked or polymerized by heat. Specifically, a temperature in a range of 40° C. to 100° C. is preferable, whereas a temperature in a range of 50° C. to 80° C. is more preferable. Moreover, reaction time is not particularly limited, provided that a lower limit of the reaction time is about one hour and an upper limit of the reaction time is about 15 hours.

A modified polyimide solution can be obtained in the manner described above. In case where a target object on which the modified polyimide is to be layered is the copper foil, the modified polyimide solution may be so arranged as to appropriately contain thermosetting resin or thermoplastic resin for giving the modified polyimide solution better development property and better bonding property with respect to the copper foil. Thermosetting resin may be epoxy resin, acryl resin, cyanate ester resin, bismaleimide resin, bis allyl nadiimide resin, phenol resin, and the like. Thermoplastic resin may be polyester, polyamide, polyurethane, polycarbonate, and the like.

<Acid Dianhydride>

The acid dianhydride used for obtaining the (A) soluble polyimide (and the polyamic acid that is the precursor thereof) of the present invention is not particularly limited. For giving the soluble polyimide solution a better heat resistance, it is preferable to use an acid dianhydride having one to four aromatic rings, or a cycloaliphatic dianhydride. Especially, in order to give the (A) soluble polyimide a higher solubility with respect to the organic solvent, it is preferable to arrange such that, in addition to the acid dianhydride, an acid dianhydride is used which has two or more aromatic rings and is selected from compounds represented by structures in Group (101):

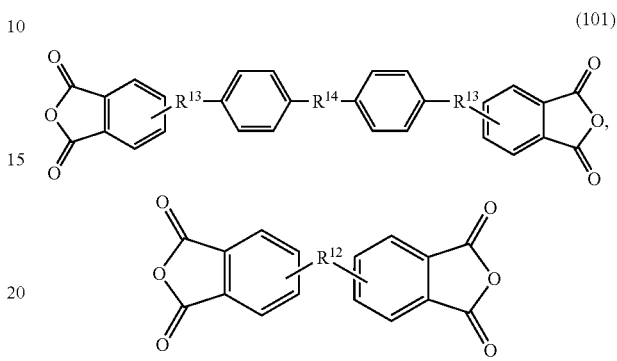

(101)

Further, it is more preferable to arrange such that in addition to the acid dianhydride, an acid dianhydride is used which has four or more aromatic rings.

Alternatively, as to the acid dianhydride used for preparing the (A) soluble polyimide (and the polyamic acid) of the present invention, it is possible to use, in addition to the acid dianhydride, an acid dianhydride selected from compounds having the following structures shown in Group (102):

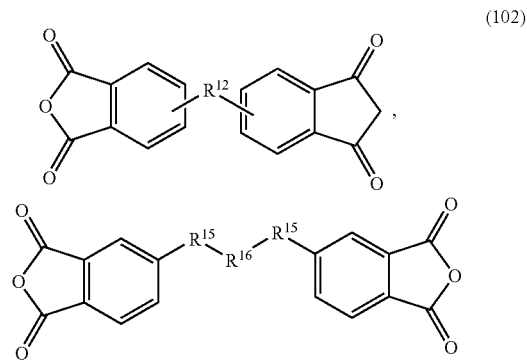

(102)

Especially, in the (A-1) soluble polyimide represented by Formula (3), it is especially preferable that the pyromellitic dianhydride and the acid dianhydride that is selected from Group (102) are used to share at least 10 mol % or more in $R^{11}$.

Note that $R^{12}$, $R^{13}$, $R^{14}$, $R^{15}$, and $R^{16}$ in Groups (101) and (102) are identical with $R^{12}$, $R^{13}$, $R^{14}$, $R^{15}$, and $R^{16}$ in Group (14).

Especially, in Group (102), it is preferable that the acid dianhydride is an acid dianhydride represented by Formula (103):

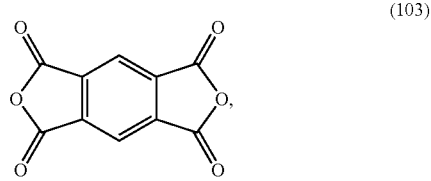

(103)

-continued

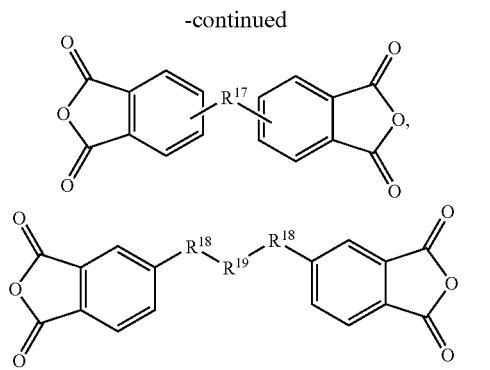

(where $R^{17}$ is any one of a direct bond, —C(CF$_3$)$_2$—, —CO—, and —O—, $R^{18}$ is —COO— or —O—, $R^{19}$ is —CH$_2$CH$_2$—, —C$_6$H$_4$—C(CH$_3$)$_2$—C$_6$H$_4$—, or a divalent organic group).

Especially, the divalent organic group of $R^{19}$ may have the following structures:

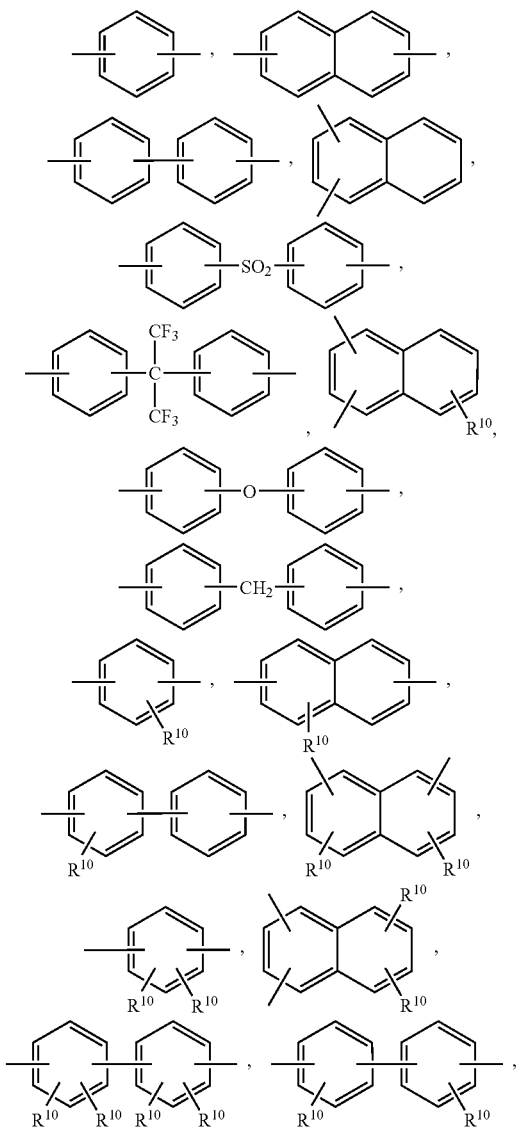

-continued

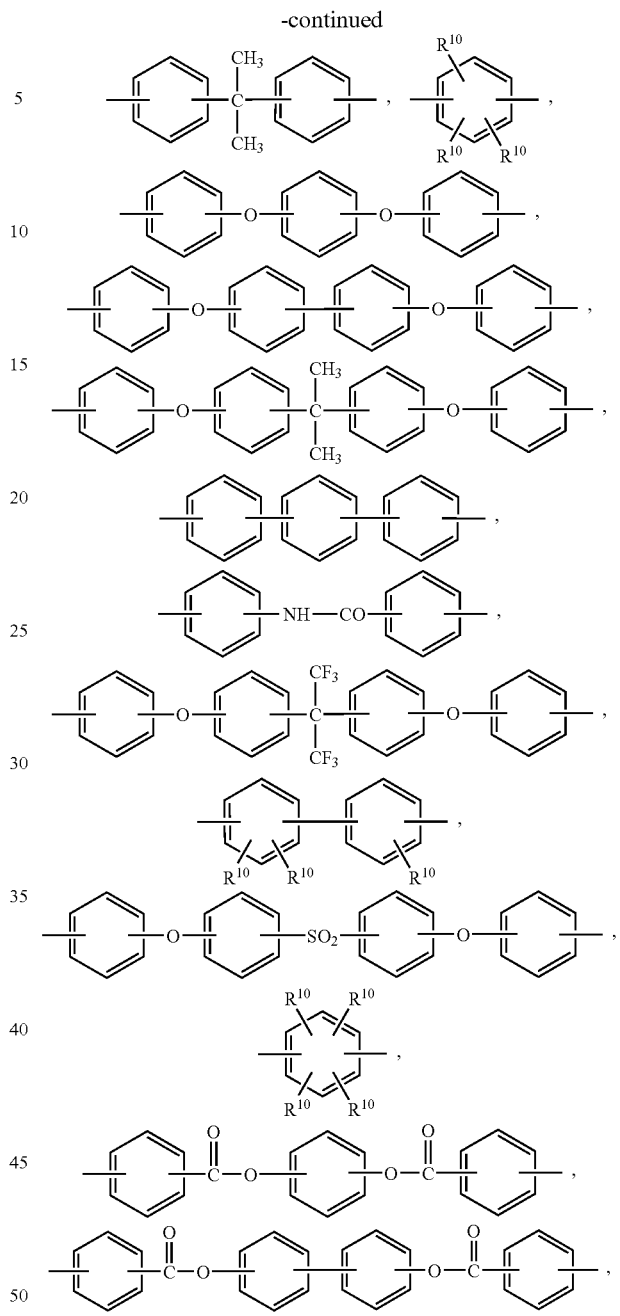

Note that each $R^{10}$ in each structure is independently any one of a hydrogen atom, a halogen atom, a methoxy group, and an alkyl group having 1 to 16 carbon atoms.

Moreover, specifically, the acid dianhydride having one to four aromatic rings or the cycloaliphatic acid dianhydride may be the following compounds.

For example, aliphatic or cycloaliphatic tetracarboxylic dianhydrides such as 2,2'-hexafluoropropyridine diphthalic dianhydride, 2,2-bis(4-hydroxyphenyl)propanedibenzoate-3,3',4,4'-tetra carboxylic dianhydride, butanetetracarboxylic dianhydride, 1,2,3,4-cyclobutanetetracarboxylic dianhydride, 1,3-dimethyl-1,2,3,4-cyclobutanetetracarboxylic acid, 1,2,3,4-cyclopentanetetracarboxylic dianhydride, 2,3,5-tricarboxycyclopenthylacetic dianhydride, 3,5,6-tricarboxyl-norbornane-2-acetic dianhydride, 2,3,4,5-tetrahydrofuran tetracarboxylic dianhydride, 5-(2,5-dioxotetrahydrofural-3-methyl-3-cyclohexene-1,2-di carboxylic dianhydride, bicyclo[2,2,2]-octo-7-en-2,3,5,6-tetracarboxylic acid dianhydride, and the like; pyromellitic dianhydride, 3,3', 4,4'-benzophenonetetracarboxylic dianhydride, 3,3',4,4'-biphenylsulfoneteteracarboxylic dianhydride, 1,4,5,8-naphthalenetetracarboxylic dianhydride, 2,3,6,7-naphthalenetetracarboxylic dianhydride, 3,3'4,4'-biphenylether tetracarboxylic dianhydride, 3,3',4,4'-dimethyldiphenylsilanetetracarboxylic dianhydride, 3,3',4,4'-tetraphenylsilanetetracarboxylic dianhydride, 1,2,3,4-furantetracarboxylic dianhydride, 4,4'-bis(3,4-dicarboxylphenoxy) diphenylsulfide dianhydride, 4,4'-bis(3,4-dicarboxyphenoxy) diphenylsulfone dianhydride, 4,4'bis(3,4-dicarboxyphenoxy) diphenylpropane dianhydride, 3,3',4,4'-perfluoroisopropyrridine diphthalic dianhydride, 3,3'4,4'-biphenyltetracarboxylic dianhydride, bis(phthalic) phenylphosphinateoxide dianhydride, p-phenylene-bis(triphenylphthalic) dianhydride, m-phenylene-bis(triphenylphthalic) dianhydride, bis(triphenylphthalic)-4,4'-diphenyl ether dianhydride, bis(triphenylphthalic)-4,4'-diphenylmethane dianhydride, and the like, 1,3,3a,4,5,9b-hexahydro-2,5-dioxo-3-franyl)-naphtho[1,2-c]fran-1,3-dione, 1,3,3a,4,5,9b-hexahydro-5-methyl-5-(tetrahydro-2,5-dioxo-3-franyl)-naphtho[1,2-c]fran-1,3-dione, 1,3,3a,4,5,9b-hexahydro-8-methyl-5-(tetrahydro-2,5-dioxo-3-franyl) -naphto[1,2-c]fran-1,3-dion, and the like. Those dianhydrides may be used solely, or in combination by using two or more of them.

Moreover, especially in case where the (A) soluble polyimide contains the siloxane structure represented by Formula (4), that is, in case where the (A) soluble polyimide is "polyimide siloxane", it is possible to preferably use the following compounds as the acid dianhydride:

For example, 1,4,5,8-naphthalenetetracarboxylic dianhydride, 2,3,6,7-naphthalenetetracarboxylic dianhydride, 3,3',4,4'-dimethyldiphenylsilanetetracarboxylic dianhydride, 3,3'4,4'-tetraphenylsilanetetracarboxylic dianhydride, 1,2,3,4-furantetracarboxylic dianhydride, 4,4'-bis(3,4-dicarboxyphenoxy)diphenylsulfide dianhydride, 4,4'-bis(3,4-dicarboxyphenoxy)diphenylsulfone dianhydride 4,4'-bis(3,4-dicarboxyphenoxy)diphenylpropane dianhydride, bis(phthalic)phenylphosphinateoxide dianhydride, p-phenylene-bis(triphenyl phthalic) dianhydride, m-phenylene-bis(triphenyl phthalic) dianhydride, bis(triphenyl phthalic)-4,4'-diphenyl ether dianhydride, bis(triphenyl phthalic)-4,4'-diphenylmethane dianhydride, and the like, aromatic tetracarboxylic dianhydrides. Those dianhydrides may be used solely or in combination by using two or more of them.

<Diamine>

The diamine that is used for preparing the (A) soluble polyimide (and the polyamic acid that is the precursor thereof) of the present invention is not particularly limited. However, it is preferable that at least part of a total diamine component is a diamine having a hydroxyl group and/or a carboxyl group in its molecule. With the arrangement, it is possible to cause the resultant (A) soluble polyimide to have a hydroxyl group and/or a carboxyl group. Therefore, it is possible to attain (i) the resultant photosensitive resin composition having a better solubility with respect to alkali aqueous solutions, and (ii) the above mentioned denature polyimide. Especially, the better solubility with respect to the alkali aqueous solutions allows to develop the resultant photosensitive resin composition or photosensitive film by using an alkali aqueous solution.

For attaining a good balance between the heat resistance and the development property by using the alkali aqueous solution, it is preferable that the diamine having a hydroxyl group and/or carboxyl group is an aromatic diamine represented by the following Formula (104):

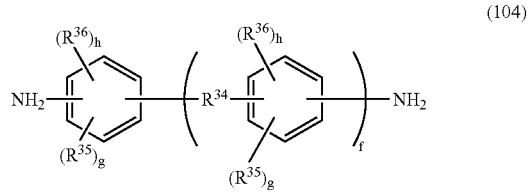

(104)

Especially, it is possible to attain a polyimide having a better solubility with respect to the alkali aqueous solution, by the use of diamine in which $R^{36}$ in Formula (104) is a hydroxyl group or a carboxyl group. Those diamine compounds may be used solely or in combination by using two or more of them.

Note that in Equation (104), $R^{34}$, $R^{35}$, $R^{36}$, f, g, and h are identical with $R^{34}$, $R^{35}$, $R^{36}$, f, g, and h in Formula (11).

Moreover, the other aromatic diamine may be an aromatic diamine represented by Formula (105):

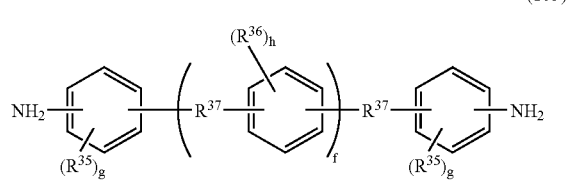

(105)

Note that in Formula (105), $R^{35}$, $R^{36}$, $R^{37}$, f, g, and h are identical with $R^{35}$, $R^{36}$, $R^{37}$, f, g, and h in Formula (12).

Moreover, for both of the aromatic diamines represented by Formulas (104) and (105), an amount of the aromatic diamine to be used is preferably in a range of 5 mol % to 95 mol %, and more preferably in a range of 10 mol % to 70 mol %, with respect to a total diamine component, for attaining a higher solubility of the resultant (A) soluble polyimide with respect to the organic solvent.

Moreover, for attaining a higher solubility of the (A) soluble polyimide with respect to the organic solvent, it is preferable that the aromatic diamine represented by Formula (104) is used in a range of 5 mol % to 95 mol % with respect to a total diamine component, and it is more preferable that the aromatic diamine represented by Formula (104) is used in a range of 10 mol % to 70 mol %, with respect to a total diamine component.

Furthermore, for attaining better flexibility of the cured film, it is more preferable that, as the acid dianhydride used for preparing the (A) soluble polyimide (and the polyamic acid that is the precursor thereof), (siliconediamine) is contained as a siloxanediamine represented by Formula (106):

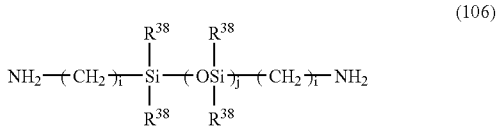

(106)

Note that in Formula (106), $R^{38}$, i, and j are identical with $R^{38}$, i, and j in Formula (13).

It is preferable for attaining lower elasticity of the film that the siloxanediamine represented by Formula (106) is used in a range of 5 mol % to 95 mol % with respect to the total diamine component. If the amount of the siloxanediamine is less than 5 mol %, it is not possible to attain sufficient effect of the addition of the siloxanediamine. If the amount is more than 50 mol %, the film tends to become too soft and the elasticity thereof tends to become too low, and a thermal expansion efficient thereof tends to become a large.

Further, for obtaining especially the (A-1) soluble polyimide as to the (A) soluble polyimide, it is preferable to use an aromatic diamine represented by the following Formula (107) and the siloxanediamine represented by the following Formula (108):

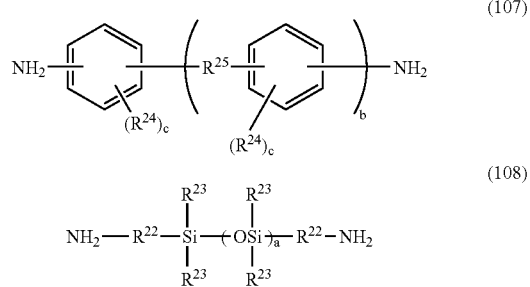

Note that in Formula (107) $R^{24}$ and $R^{25}$, b, and c are identical with $R^{24}$ and $R^{25}$, b, and c in Formula (5). Similarly, in Formula (108), $R^{22}$ and $R^{23}$, and a are identical with $R^{22}$ and $R^{23}$, and a in Formula (4).

Moreover, in the siloxanediamine of Formula (108), a may be 3 to 30. However, it is preferable that a is in a range of 5 to 20, and it is more preferable that a is in a range of 6 to 16. if a is below the range, the improved flexibility and solubility that are typically attained by siloxane boding cannot be expected. Moreover, it is not preferable that a is above the range, because a above the range tends to cause lower heat resistance. Further, in Formula (108), it is especially preferable that $R^{23}$ is a methyl group, and $R^{22}$ is —$(CH2)_n$— (where n is an integer of 2 to 6).

Of the aromatic diamines, the most preferable is the aromatic diamine represented by Group (109):

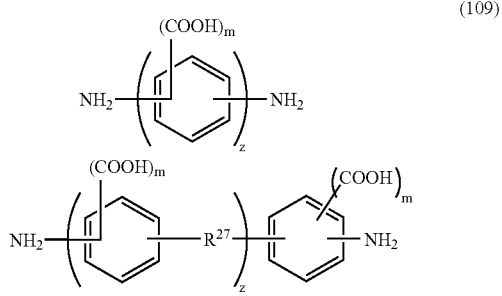

(where $R^{27}$ is —O—, —S—, —CO—, —$CH_2$—, —$SO_2$—, —$C(CH_3)_2$—, —$C(CF_3)_2$—, —O—$CH_2$—$C(CH_3)_2$—$CH_2$—O—, each z is independently an integer of 1 to 3, and m is an integer of 1 to 4). The aromatic diamine represented by Formula (109) is suitable because it is easy to obtain the aromatic diamine industrially.

Specific examples of the aromatic diamine are: diaminophthalic acids such as 2,5-diaminoterephthalic acid and the like; carboxybiphenyl compounds such as 3,3-diamino-4,4-dicarboxybiphenyl, 4,4-diamino-3,3-dicarboxybiphenyl, 4,4'-diamino-2,2'-dicarboxybiphenyl, 4,4'-diamino-2,2'5,5'-tetracarboxybiphenyl, and the like, carboxydiphenyl alkanes such as carboxydipheny methanes and the like such as 3,3'-diamino-4,4'-dicarboxydiphenylmethane, 2,2-bis[3-amino-4-carboxyphenyl]propane, 2,2-bis[4-amono-3-carboxyphenyl]propane, 2,2-bis[3-amino-4-carboxyphenyl]hexafuluoropropane, 4,4'-diamino-2,2',5,5'-tetracarboxydiphenylmethane, and the like; carboxydiphenyl ether compounds such as 3,3'-diamino-4,4'-dicarboxydiphenylether, 4,4'-diamino-3,3'-dicarboxydiphenylether, 4,4'diamino-2,2'-dicarboxydiphenylether, 4,4'-diamino-2,2',5,5'-tetracarboxydiphenyether, and the like; diphenylsulfone compounds such as 3,3'-diamino-4,4'-dicarboxydiphenylsulfone, 4,4'-diamino-3,3'-dicarboxydiphenylsulfone, 4,4'diamino-2,2'-dicarboxydiphenylsulfone, 4,4'diamino-2,2'5,5'-teteracarboxydiphenylsulfone, and the like; bis[(carboxypheny)phenyl]alkane compounds such as 2,2-bis[4-(4-amino-3-carboxyphenoxy) phenyl] propane, and the like; bis[(carboxyphenoxy)phenyl]sulfone compounds 2,2-bis[4-(4-amino-3-carboxyphenoxy)phenyl] sulfone and the like; diamino phenols such as 2,4-diaminophenol and the like; hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybipheny, 4,4'-diamino-2,2'5,5'-tetrahydroxybiphenyl, and the like hydroxydiphenyalkanes such as hydroxydiphenylmethanes such as 3,3'-diamino-4,4'-dihydroxydiphenylmethane, 4,4'-diamino-3,3'-dihydroxydiphenylmethane, 4,4'-diamino-2,2'-dihydroxydiphenylmethane, 2,2-bis [3-amino-4-hydroxyphenyl] propane, 2,2-bis[4-amino-3-hydroxyphenyl] propane, 2,2-bis[3-amino-4-hydroxyphenyl] hexafluoropropane, 4,4'-diamino-2,2'5,5'-tetrahydroxydiphenylmethane and the like; hydroxydiphenylether compounds such as 3,3'-diamino-4,4'-dihydroxydiphenyl ether, 4,4'-diamino-3,3'-dihydroxydiphenylether, 4,4'-diamino-2,2'-dihydroxydiphenylether, 4,4'-diamino-2,2'5,5'-tetrahydroxydiphenylether, and the like; diphenylsulfone compounds such as 3,3'-diamino-4,4'-dihydroxydiphenylsulfone, 4,4'-diamino-3,3'-dihydroxydiphenylsulfone, 4,4'-diamino-2,2-dihydroxydiphenysulfone, 4,4'-diamino-2,2',5,5'-tetrahydroxyphenylsulfone, and the like; bis[(hydroxyphenyl)phenyl]alkane compounds such as 2,2-bis[4-(4-amino-3-hydroxyphenoxypheny)propane, and the like; bis(hydroxyphenoxyl)phenyl compounds such as 4,4-bis(4-amino-3-hydroxyphenoxy)biphenyl and the like; bis[(hydroxyphenoxyl)phenyl]sulfone compounds such as 2,2-bis[4-(4-amino-3-hydroxyphenoxy)phenyl]sulfone, and the like; diaminobenzoic acids such as 3,5-diaminobenzoic acid and the like; bis(hydroxyphenoxy)biphenyl compounds such as 4,4'-diamino-3,3'-dihydroxydiphenylmethane, 4,4'-diamino-2,2'-dihydroxydiphenylmethane, 2,2,-bis [3-amino-4-carboxyphenyl] propane, 4,4'-bis(4-amino-3-hydroxyphenoxy)biphenyl, and the like. Those diamines may be used solely or in combination by using two or more of them.

Moreover, in case the aromatic diamine is used, the arrangement in which the aromatic diamine is a diamine having an amino group at m-position (3-) tends to attain a small light absorbance of the resultant (A) soluble polyimide in a wavelength band of g ray and i ray. Because of this, this arrangement is so advantageous for designing photosensitive resin.

Other diamines that can be used in synthesis of the (A) soluble polyimide of the present invention is not particularly limited. Specific examples of the other diamines are aromatic diamines such as p-phenylenediamine, m-phenylenediamine, 4,4'-diaminodiphenylmethane, 4,4'-diaminophenylethane, 4,4'-diaminophenylether, 4,4'-didiaminophenylsulfide, 4,4'didiaminophenysulfone, 1,5-diaminonaphthalene, 3,3-dimethyl-4,4'-diaminobiphenyl, 5-amino-1-(4'-aminophenyl)-1,3,3-trimethylindan, 6-amino-1-(4'-aminophenyl)-1,3,3-trimethylindan, 4,4'-diaminobenzanilide, 3,5-diamino-3'-trifluoromethylbezanilide, 3,5-diamino-4'-trifluoromethylbezanilide, 3,4'-diaminodiphenyl ether, 2,7-diaminofluorene, 2,2-bis(4-aminophenyl)hexafluoropropane, 4,4-methylene-bis(2-chloroaniray), 2,2'5,5'-tetrachloro-4,4'-diaminobiphenyl, 2,2'-dichloro-4,4'-diamino-5,5'-dimethoxybiphenyl, 3,3'dimethoxy-4,4'-diaminobiphenyl, 4,4'-diamino-2,2'-bis (trifluromethyl)biphenyl, 2,2-bis[4-(4-aminophenoxy)phenyl]propane, 2,2-bis[4-(4-aminophenoxy)phenyl]hexafluoropropane, 1,4-bis(4-aminophenoxy) benzene, 4,4'-bis(4-aminophenoxy)-biphenyl, 1,3'-bis(4-aminophenoxy) benzene, 9,9-bis(4-aminophenyl) fluorene, 4,4'-(p-phenyleneisopropylidene)bisaniray, 4,4'-(m-phenyleneisopropylidene)bisaniray, 2,2'-bis[4-(4-amino-2'-trifluoromethylphenoxy) phenyl]hexafluoropropane, 4,4'-bis [4-(4-amino-2-trifluoromethyl)phenoxy]-octafluorobiphenyl, and the like; aromatic diamines having two amino groups bonded with an aromatic ring such as diaminotetraphenylthiophene and the like, and having a hetero atom other than a nitrogen atom of the amino group; 1,1-meta-xylenediamine, 1,3-propanediamine, tetramethylenediamine, pentamethylenediamine, octamethylenediamine, nonamethylenediamine, 4,4-diaminoheptamethylenediamine, 1,4-diaminocyclohexane, isophoronediamine, tetrahydrodicyclopentadienylenediamine, hexahydro-4,7-methanoindanilenedimethylenediamine, tricyclo[6,2,1,02.7]-undesilenedimethyldiamine, 4,4'-methylenebis(cyclohexylamine) and the like; aliphatic diamine and cycloaliphatic diamine; and the like. Those diamine may be used solely or in combination by using two or more of them.

Here, the (A-1) soluble polyimide is polyimide siloxane having a carboxyl group (COOH) and a hydroxyl group (OH). The polyimide siloxane has a COOH equivalent in a range of 250 to 3000, preferably in a range of 300 to 2000, and most preferably in a range of 300 to 1500. Note that the COOH equivalent denotes an average molecular amount per COOH.

A COOH equivalent above the range will cause the (A-1) soluble polyimide to be insoluble in the alkali aqueous solution that is used as the developer, thereby prohibiting the development. Thus, the COOH equivalent above the range is not preferable. Moreover, a COOH equivalent below the range will cause the (A-1) soluble polyimide to have a lower heat resistance. In addition, a large number of water-absorbing COOH in the (A-1) soluble polyimide causes the (A-1) soluble polyimide to be hygroscopic. Thus, the COOH equivalent below the range is not preferable.

Similarly, an OH equivalent in the polyimide siloxane ((A-1) soluble polyimide) is in a range of 250 to 3000, preferably in a range of 300 to 2000, most preferably in a range of 300 to 1500. Note that the OH equivalent is an average molecular weight per OH.

An OH equivalent above the range will causes the (A-1) soluble polyimide to be insoluble in an alkali solution that is used as the developer, thereby inhibiting the development. Thus, the OH equivalent above the range is not preferable. Moreover, an OH equivalent below the range will cause the (A-1) soluble polyimide to have a lower heat resistance. In addition, a large number of water-absorbing OH in the (A-1) soluble polyimide causes the (A-1) soluble polyimide to be hygroscopic. Thus, the OH equivalent below the range is not preferable.

In order to attain the COOH equivalent and the OH equivalent, it is desirable to use a diamine which has two or more COOH or OH in its molecule. The use of this diamine enables copolymerization of another kind of diamine in realizing a predetermined carboxylic acid equivalent, thereby making it easier to design property.

<Soluble Polyimide Content (Amount of Soluble Polyimide in Composition)>

(A) soluble polyimide content (the content includes the modified polyimide) in the photosensitive resin composition of the present invention is preferably in a range of 30% to 70% by weight, more preferably in a range of 40% to 60% by weight, and further preferably in a range of 45% to 60% by weight, based on a total amount (100% by weight) of the (A) soluble polyimide, the (B) (meth)acrylic compound, the (C) photo reaction initiator, and the (D) fire retardant. If the (A) soluble polyimide content is less than 30% by weight, it will become difficult to give the cured film fire retarding property. Further, it will result in a poor mechanical property of the cured film. On the other hand, the (A) soluble polyimide content more than 70% by weight tends to cause the photosensitive film to have a poor development property.

<(B) (meth)acrylic Compound>

Next, it is so arranged that (B) (meth)acrylic compound of the present invention is a multifunctional (meth)acrylic compound having at least one carbon-carbon double bond. By the arrangement in which the photosensitive resin composition and photosensitive film contains such compound, it is possible to attain excellent photosensitivity of the photosensitive resin composition and photosensitive film, thereby improving usefulness of the photosensitive resin composition and photosensitive film.

The (B) (meth)acrylic compound is not limited to specific examples. However, especially, the (B) (meth)acrylic compound is so arranged as to be at least one of (1) a later-described imide(meth)acrylate compound, and (2) (meth) acrylic compound having a structure having no imide ring (hereinafter, referred to as non-imide (meth)acrylic compound for easy explanation). It is preferable that both of them are used.

<(1) Imide(meth)acrylate Compound>

The arrangement in which the photosensitive resin composition and photosensitive film contain (1) the imide(meth) acrylate compound gives fire retarding property, soldering heat resistance, and folding resistance to the cured photosensitive film.

Provided that (1) the imide(meth)acrylate compound is a (meth)acrylate compound having an imide ring, that (1) the imide(meth)acrylate compound is not particularly limited. However, it is preferable that that (1) the imide(meth) acrylate compound is an imide(meth)acrylate compound having a structure represented by Formula (16) or a structure represented by Formula (18):

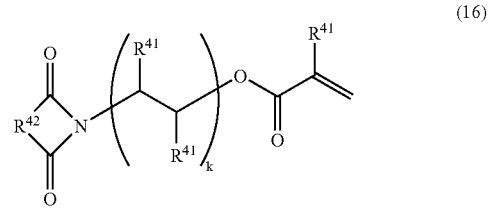

(16)

-continued (18)

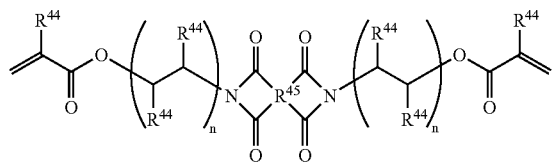

The use of imide(meth)acrylate having the structures improves post-curing chemical resistance and heat resistance.

Note that, in Formula (16), each $R^{41}$ is independently a hydrogen atom or a methyl group, and $R^{42}$ is a divalent organic group selected from the following Group (17) and k is an integer of not less than 0:

(17)

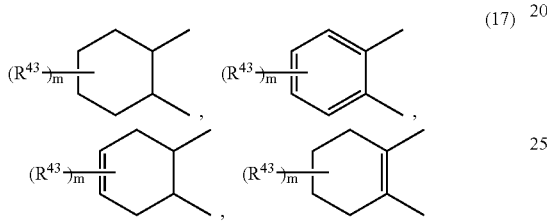

(where $R^{43}$ is a monovalent organic group, m is an integer of 1 to 4).

Moreover, in Formula (18), each $R^{44}$ is independently a hydrogen atom or a methyl group, $R^{45}$ is a tetravalent group selected from the following Group (19), and n is an integer of not less than 0:

(19)

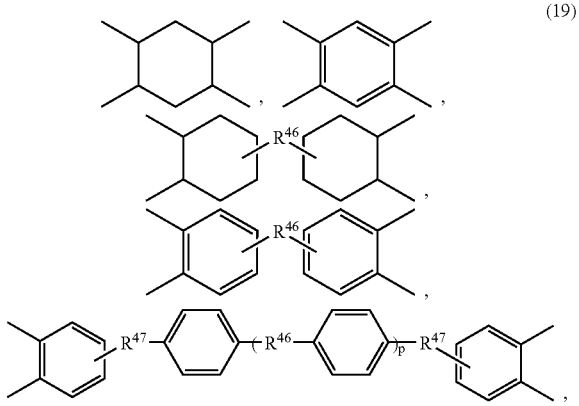

(where each $R^{46}$ and each $R^{47}$ is independently a divalent organic group, p is an integer of 0 to 5).

Further, in Group (17), the organic group $R^{43}$ is not particularly limited provided that the organic group $R^{43}$ is a monovalent group. Preferably, the organic group $R^{43}$ may be a hydrogen atom; alkyl groups such as a methyl group, an ethyl group, a propyl group, a butyl group, a pentyl group, and the like; alkyl ether groups such as a methoxy group, an ethoxy group, and the like; allyl groups; allyl ether groups; hydroxyl groups, carboxyl groups; halogen atoms; and the like. Above all, the organic group $R^{43}$ may be preferably a hydrogen atom, a methyl group, a methoxy group, a hydroxyl group, a carboxyl group, and a halogen atom.

Moreover, in Group (19), the organic group $R^{46}$ is not particularly limited provided that the organic group $R^{46}$ is a divalent organic group. Preferably, the organic group $R^{46}$ may be a direct bonding, —$CH_2$—, —$C(CH_3)_2$—, —$C(CF_3)_2$—, —O—, —CO—, —$SO_2$—, —(CO)O—$C_mH_{2m}$—O(CO)— (m is an integer not less than 1), and the like. Further, the organic group $R^{47}$ is not particularly limited, provided that the organic group $R^{47}$ is a divalent organic group. Preferably, organic group $R^{47}$ may be —O—, —COO—, and the like.

The (B) component used in the present invention: the imide(meth)acrylate compound can be synthesized by reacting an imide alcohol with an acrylic acid or a methacrylic acid, the imide alcohol being represented by Formula (110) or (111):

(110)

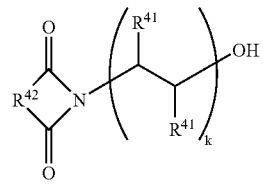

(where $R^{41}$ is hydrogen or a methyl group, $R^{42}$ is a divalent organic group represented by Group (17), k is an integer of not less than 0), (17)

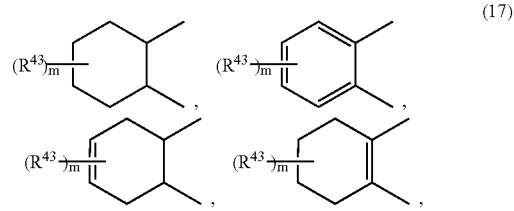

(111)

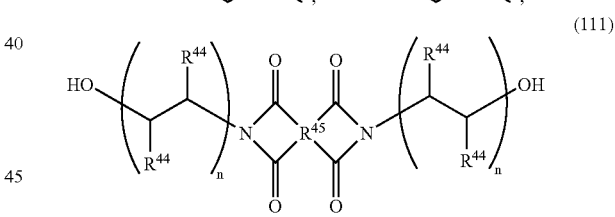

(where $R^{44}$ is hydrogen or a methyl group, $R^{45}$ is a tetravalent organic group represented by Group (19), and b is an integer of not less than 0).

The reaction is an esterification reaction. The reaction is started off from a mixture of (i) the imide alcohol represented by at least one of Formulas (110) and (111), and (ii) the acrylic acid or the methacrylic acid in a ratio of 1:2 to 1:10, preferably in a ratio of 1:3 to 1:6, especially preferably in a ratio of 1:4 to 1:5.

In case where an organic solvent is used in the reaction, it is preferably to use an organic solvent that can dissolve both of (i) at least one of the imide alcohol represented by Formula (110) and the imide alcohol represented by Formula (111) which are a starting material, and (ii) imide(meth)acrylate represented by Formulae (16) and (18), which are a reaction product. Generally, a polar organic solvent is preferable. The polar organic solvent may be sulfolane, N,N'-dimethylacetamide, N,N-dimethylformamide, N-methyl-2- pyrrolidone, N,N'-dimethylpropyrene urine, and the like, for example. Above all, it is preferable to use sulfolane for better solubility and reactivity.

Moreover, it may be so arranged as to use an organic solvent having a boiling point in a range of 30° C. to 150° C., in combination with the polar organic solvent. Such organic solvent is preferable because it is easy to prepare an azeotropic mixture of such organic solvent and water. Such organic solvent may be benzene, toluene, xylene, ethylbenzene, hexane, cyclohexane, isopropylethers, diethylethers, methylethylketones, diethylketones, methylisobutylketones, carbon tetrachloride, trichloroethylene, and the like, for example.

It is so arranged that (i) imide alcohol represented by Formulae (110) and (111) reacts with (ii) acrylic acid or methacrylic acid at a temperature in a range of 50° C. to 200° C., preferably in a range of 100° C. to 180° C., and more preferably in a range of 120° C. to 150° C. Moreover, the reaction is performed in a duration in a range of 3 to 20 hours, preferably in a range of 4 to 10 hours, and more preferably in a range of 5 to 6 hours.

It is possible to accelerate the reaction of (i) the imide alcohol and (ii) the acrylic acid or the methacrylic acid by using a catalyst. The catalyst may be well known esterification catalysts such as: sulfuric acid; p-toluene sulfonic acid; benzenesulfonic acid; methane sulfonic acid; trifluoromethanesulfonic acid; zinc chloride; phosphoric acid; antimony oxide; ester titanate, methoxy phenol, and the like. An amount of the catalyst to be used is in a range of 0.01% to 30% by weight, preferably in a ragne of 0.02% to 20% by weight, more preferably in a ragne of 0.1% to 10% by weight, based on 100% by weight of imide alcohol.

After the reaction, a poor solvent with respect to the reaction products is added to a reaction solution. Precipitate thus produced is filtered off, washed, and dried thereby obtaining imide (meth)acrylate in a powder form. The imide (meth)acrylate is reactive creature. The poor solvent may be, for example, tetrahydrofuran, acetone, methanol, ethanol, isopropyl alcohol, butanol, and the like.

Moreover, the imide alcohol, which is the starting material, can be obtained by reacting a corresponding dicarboxylic anhydride or tetracarboxylic anhydride with a monoethanolamine in an organic solvent. Here, it is only required that a molar ratio between the dicarboxylic acid anhydride and the monoethanolamine be in a range of 1:1 to 1:5. It is preferable that the molar ratio between the dicarboxylic acid anhydride and the monoethanolamine is in a range of 1:1 to 1:2.5. It is more preferable that the molar ratio between the dicarboxylic acid anhydride and the monoethanolamine is in a range of 1:1 to 1:1.5. It is only required that a molar ratio between the tetracarboxylic anhydride and the monoethanolamine be in a ragne of 1:2 to 1:10. It is preferable that the molar ratio between the tetracarboxylic anhydride and the monoethanolamine is in a range of 1:2 to 1:5. It is more preferable that the molar ratio between the tetracarboxylic anhydride and the monoethanolamine is in a ragne of 1:2 to 1:3.

As the organic solvent for use in synthesizing the imide alcohol, preferable is a polar organic solvent that can dissolve both of (i) the dicarboxylic anhydride or tetracarboxylic anhydride, and (ii) the monoethanolamine. Specifically, the organic solvent may be, for example, sulfolane, N,N'-dimethylacetamide, N,N'-dimethylformamide, N-methyl-2-pyrrolidone, N,N'-dimethylpropylene urine, and the like. Above all, it is preferable to use sulfolane for better solubility and reactivity.

Moreover, it may be so arranged as to use an organic solvent having a boiling point in a range of 30° C. to 150° C. in combination with the polar organic solvent. It is easy to prepare an azeotropic mixture of such organic solvent and water. Such organic solvent may be, for example, benzene, toluene, xylene, ethylbenzene, hexane, cyclohexane, isopropylethers, diethylethers, methylethylketones, diethylketones, methylisobutylketones, carbon tetrachloride, trichloroethylene, and the like.

The reaction of (i) the dicarboxylic anhydride or tetracarboxylic anhydride with (ii) the monoethanolamine is carried out in a range of 50° C. to 200° C., preferably in a range of 100° C. to 180° C., more preferably in a range of 140° C. to 160° C. Moreover, the reaction is carried out in a duration in a range of 3 to 20 hours, preferably in a range of 4 to 10 hours, and more preferably in a range of 5 to 7 hours.

By using a catalyst, it is possible to accelerate the reaction of (i) the dicarboxylic anhydride or tetracarboxylic anhydride with the monoethanolamine. The catalyst may be well-known esterification catalysts such as sulfuric acid, p-toluenesulfonic acid, zinc chloride, phosphoric acid, antimony oxide, ester titanate, methoxyl phenol, and the like. An amount of the catalyst to be used is in a range of 0.01% to 30% by weight, preferably in a range of 0.05% to 20% by weight, more preferably in a ragne of 0.1% to 10% by weight, based on 100% by weight of the dicarboxylic anhydride or the tetracarboxylic anhydride.

The imide(meth)acrylate compound thus obtained may be used solely or in combination by using two or more of them.

Moreover, the present invention may be so arranged as to use a commercially available imide(meth)acrylate compound. Specifically, for example, the commercially available imide(meth)acrylate compound may be, but not limited to, allonix TO-1429 (product name: supplied by Toa gosei Co., Ltd).

<(2) Non-imide (meth)acrylic Compound>

The arrangement in which the (2) non-imide (meth) acrylic compound is used in the photosensitive resin composition and photosensitive film causes the resultant photosensitive resin composition and photosensitive film to be flowable in thermo-compression bonding and further to have a high resolution.

The (2) non-imide (meth)acrylic compound is not particularly limited provided that the (2) non-imide (meth) acrylic compound is a compound having at least one carbon-carbon double bond in its molecule. However, it is preferable that the (2) non-imide (meth)acrylic compound has two carbon-carbon double bonds in its molecule. In this case, it is possible to attain easier photo polymerization. Further, it is more preferable that the (2) non-imide (meth) acrylic compound is a compound having, in its molecule, at least one ring that is an aromatic ring or a hetero ring. This arrangement causes the photosensitive film to be flowable in thermo-compression bonding, and to have a high resolution.

Especially, by such arrangement that a compound is used whose molecule has a structure having 1 to 40 recurring units, preferably 6 to 40 recurring unit represented by —(CHR$^{48}$CH$_2$—O)— (where R$^{48}$ is hydrogen, a methyl group, or an ethyl group), the monomer before curing becomes more soluble in the alkali aqueous solution, which is the developer. Therefore, the resin that is not exposed to light becomes easier to be dissolved and removed with an alkaline aqueous solution, thereby attaining a good resolution in a shorter time.

Specifically, It is preferable that the compound is at least one of di(meth)acrylate compounds having two aromatic rings Group (112):

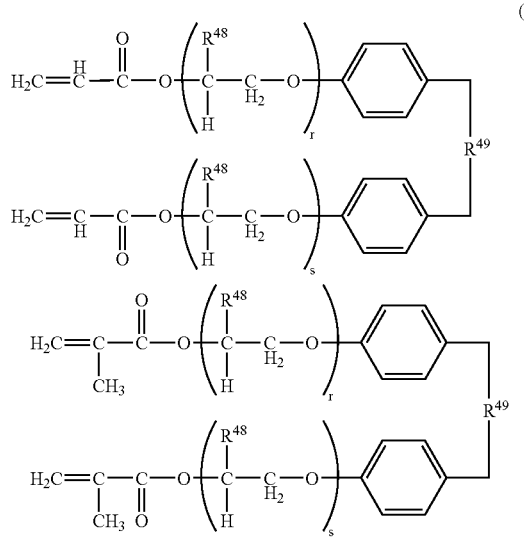

(112)

(where each $R^{48}$ is independently a hydrogen atom, a methyl group, or an ethyl group, each $R^{49}$ is independently a divalent organic group, and each of r and s is independently an integer of 2 to 20).

Note that, if r and s are 0 or 1 in Group (112), the composition will have poor solubility in the alkali aqueous solution, thus resulting in failure of attaining a good development property. Moreover, it is difficult to acquire a raw material for the composition in which r and s are 21 or more. Further, a photosensitive film produced from such composition in which r and s are 21 or more, tends to be hygroscopic, even though the photosensitive film thus produced has a good solubility in the alkali aqueous solution.

Specifically, for example, a (2) non-imide (meth)acrylic compound may be, but not limited to, bisphenol F EO modified (n=2 to 50) diacrylate, bisphenol A EO modified (n=2 to 50) diacrylate, bisphenol S EO modified (n=2 to 50) diacrylate, 1,6-hexandioldiacrylate, neopenthylglycoldiacrylate, ethyleneglycoldiacrylate, pentaerythritoldiacrylate, trimethylolpropanetriacrylate, pentaerithritoltriacrylate, dipentaerythritolhexaacrylatetetramethylolpropanetetraacrylate, tetraethyleneglycoldiacrylate, 1,6-hexandioldimethacrylate, neopenthylglycodimethacrylate, ethyleneglycoldimethacrylate, pentaerithritoldimethacrylate, trimethylolpropanetrimethacrylate pentaerithritoltrimethacrylate, dipentaerithritolhexamethacrylate, tetramethylolpropanetetramethacrylate, tetraethyleneglocoldimethacrylate, ethyleleglycoldimethacrylate, diethyleneglycoldimethacrylate, triethyleneglocoldimethacrylate, polyethyleneglocoldimethacrylate, 1,3-butyleneglycoldimethacrylate, 1,6-hexandioldimethacrylate, polypropyleneglocoldimethacrylate, 2-hydroxy-1,3-dimethachloxyethoxy)phenyl]propane, 2,2-bis [4-(methachloxyethoxy)phenyl]propane, 2,2-bis[4-(methachloxy•diethoxy)phenyl]propane, 2,2-bis[4-(methachloxy•polyethoxy)phenyl]propane, polyethyneglycoldiacrylate, tripropyleneglycoldiacrylate, polypropyleneglocoldiacrylate, 2,2-bis [4-(acryloxy•diethoxy) phenyl]propane, 2,2-bis[4-(acryloxy•polyethoxy)phenyl]propane, 2-hydroxy-1-acryloxy-3-methachloxypropane, trimethylolpropanetrimethacrylate, tetramethylolmethanetriacrylate, tetramethylolmethanetetraacrylate, polypropyleneglocoldimethacrylate, 1,4-butandioldimethacryalte, 3-methyl-1,5-pantandioldimethacrylate, 1,6-mexanedioldimethacrylate, 1,9-nanondiolmethacrylate, 2,4-diethyl-1,5-pentandioldimetharylate, 1,4-cyclohexanedimethanoldimethacrylate, dipropyleneglocodiacrylate, tricyclodecanedimethanoldiacrylate, 2,2-water-containing bis[4-(acryoxy polyethoxy) phenyl]propane, 2,2-bis [4-(acryloxy-polyproxy)phenyl] propane, 2,4-diethyl-1,5-pentandioldiacrylate, ethoxylated tochimethylolpropanetriacrylate,propoxylated tochimethylolpropanetriacrylate, isocyanulic triacrylate, isocyanulic diacrylate, isocyanulic tri(ethaneacrylate), pentasulitoltetraacrylate, ethoxylatedpentasulitoltetraacrylate, and propoxylated pentasulitoltetraacrylate, ditrimethylolpropanetetraacrylate, dipentaerithritolpolyacrylate, trially isocyanulate, glycidylmethacrylate, glycidylallylether, 1,3, 5-triacryloylhexahydro-s-triazine, 4,4'-isopropylidenediphenoldimethacrylate, 4,4'-idopropylidenediphenoldiacrylate, methoxydiethyleneglycolmethacrylate, methoxylpolyethyleneglycolmethacrylate, β-methachloiloxyethylhydrogenphthalate, β-methachloiloxyethylhydrogensucynate, 3-chloro-2-hydroxypropylmethacrylate, sutearylmethacrylate, phenoxyethylacrylate, phenoxydiethyleneglycolacrylate, phenoxypolyethyleneglocolacrylate, β-acryloyloxyethylhydroegensucynate, lauryl acrylate, triacryl 1,3,5-benzenecarboxylate, and the like. Moreover, those compounds may be used solely or in combination by using two or more of them.

Moreover, it may be so arranged that a (meth)acrylic compound other than the (meth)acrylic compounds listed above is added in combination with the (meth)acrylic compound listed above. The following (meth)acrylic compound other than the (meth)acrylic compounds listed above may be added in combination with the above (meth)acrylic compound: triallyl-1,3,5-benzenecarboxylate, triallylamine, triallylcitrate, triallylphosphate, allobarbitone, diallylamine, diallydimethylsilane, diallyldisulfide, diallylether, diallylcyanate, diallylisophthalate, diallylterephthalate, 1,3,-diaryloxy-propanol, diallylsufide, diallylmaleate, and the like. The compounds may be used solely or in combination by using two or more of them.

Further, the present invention may be arranged such that a commercially-available (2) non-imide(meth)acrylate compound is used. Specifically, the commercially-available (2) non-imide(meth)acrylate compound may be, for example, bisphenol A EO modified di(meth)acrylate such as allonix M210, M211B (both are product names, made by Toagosei Co., Ltd.), NK ester ABE-300, A-BPE-4, A-BPE-10, A-BPE-20, A-BPE-30, BPE-100, and BPE-200 (all are product names, made by Shin-Nakamura Chemical Co., Ltd.), and the like; bisphenol F PO modified (n=2 to 20) di(meth)acrylate such as allonix M-208 (product name, made by Toagosei Co., Ltd.) and the like; bisphenol A PO modified (n=2 to 20) di(meth)acrylate such as dinacole acrylate DA-250 (made by Nagase Kasei Corp.), biscoate #540 (product name, made by Osaka Organic Chemical Industry Ltd.) and the like; and phthalic PO modified diacrylate such as dinacolacrylate DA-721 (product name, Nagase Kasei Corp.); and the like.

Furthermore, the present invention may be so arranged as to contains an acylate such as (i) isocyanuric EO modified diacrylate such as allonix M-215 (product name, Toagosei Co., Ltd.), (ii) isocyanuric EO modified triacrylate such as allonix M-315 (product name, Toagosei Co., Ltd.), NK ester A-9300 (product name, Shin-Namkamura Chemical Co., Ltd. and the like, even though the acrylate does not have an aromatic ring. The compounds may be used solely or in combination by using two or more of them.

Moreover, for attaining an excellent flexibility in the photosensitive film of the present invention, it is more preferable to use a modified di(meth)acrylate such as bis phenol F EO modified diacrylate, bis phenol A EO modified diacrylate, bis phenol S EO modified diacrylate, bis phenol F EO modified dimethacrylate, bis phenol A EO modified dimethacrylate, and bis phenol S EO modified dimethacrylate. Those compound may be used solely or in combination by using two or more of them.

Especially, a compound in which 2 to 50 EO recurring units, which is to be modified, are contained in one molecule of the modified di(meth)acrylate, is preferable. A compound in which 4 to 40 EO recurring units are contained in one molecule of the modified di(meth)acrylate, is more preferable. The EO recurring units give better solubility in the alkali aqueous solution, thereby attaining a shorter development time. Note that, the heat resistance will become poor if the number of the EO recurring units exceeds 50. Thus, an arrangement in which the number of the EO recurring units exceeds 50 is not preferable.

In the photosensitive resin composition of the present invention, it is preferable that 1 part to 200 parts by weight of the modified di(meth)acrylate is added based on 100 parts by weight of the soluble polyimide. Further, it is more preferable that 3 parts to 150 parts by weight of the modified di(meth)acrylate is added based on 100 parts by weight of the soluble polyimide. If the amount of the modified di(meth)acrylate is above or below the range, there is a possibility that a targeted effect is not attained, or that the development property is adversely affected.

<Content (Amount in Composition)>

For both of the (1) (meth)acrylic compound and (2) (meth)acrylic compound, it is preferable that 1% to 200% by weight of the (meth)acrylic compound is added based on 100% by weight of the (A) soluble polyimide, whereas it is more preferable that 5% to 150% by weight of the (meth)acrylic compound is added based on the 100% by weight of the (A) soluble polyimide.

Especially, where a total amount of the (A) soluble polyimide and (B) (meth)acrylic compound is 100% by weight, it is preferable that (A) soluble polyimide is in a range of 30% to 70% by weight, and that, of the (B) (meth)acrylic compound, the imide(meth)acrylate compound is in a range of 5% to 60% by weight, the non-imide (meth)acrylic compound is in a range of 1% to 50% by weight.

Both in case where the range is based on the (A) soluble polyimide, and in case where the range is based on the total amount of the (A) soluble polyimide and the other component, an amount above or below the range, especially an amount below the lower limit, is not preferable because such amount tends to result in a high thermo-compression-bondable temperature and a low resolution. On the other hand, the amount above the upper limit results in stickiness of the photosensitive film in a B stage condition. Further, the amount above the upper limit tends to result in a fragility of a cured product. Thus, the amount above the upper limit is not preferable.

Moreover, as to the (B) (meth)acrylic compound, considering only the amount of the (1) imide (meth)acrylic compound to be added, the amount of the (1) imide (meth)acrylic compound is preferably in a range of 5% to 60% by weight, more preferably in a range of 5% to 40% by weight, further preferably in a range of 5 to 30% by weight, based on 100% by weight of the total amount of the (A) soluble polyimide and the (B) (meth)acrylic compound. An amount less than 5% by weight tends to cause the cured photosensitive film to have a low fire retarding property. Thus, the amount less than 5% is not preferable. On the other hand, an amount more than 60% by weight tends to cause the photosensitive film to have a significant stickiness and poor resolution. Thus, the amount more than 60% by weight is not preferable.

Similarly, considering only (2) non-imide (meth)acrylic compound, the amount is preferably in a range of 1% to 50% by weight, more preferably in a range of 1% to 40% by weight, and further preferably in a range of 5% to 10% by weight, based on 100% by weight of the total amount of the (A) soluble polyimide and (B) (meth)acrylic compound. An amount less than 1% by weight is not preferable because the amount less than 1% by weight tends to give a high thermo-compression-bondable temperature and a poor resolution. On the other hand, an amount more than 50% by weight results in stickiness of the film in the B stage condition stage to be sticky, and allows the resin to ooze out easily during thermo-compression bonding. Further, the amount more than 50% by weight tends to result in over fragility of the cured product. Thus, the amount more than 50% by weight is not preferable.

In the present invention, (B) (meth)acrylic compound content in the photosensitive resin composition or photosensitive film is not limited to the ranges mentioned above, because the preferable ranges depend on (i) which one of the (meth)acrylic compounds is used, (ii) which one of the other components is used, (iii) usage of the resultant photosensitive resin composition or photosensitive film, (iv) and the like factor. For example, it is possible to adjust the heat resistance and thermo-compression-bondable temperature (later described) of the photosensitive film by changing the content.

<(C) Photo Reaction Initiator>

Very preferable is an arrangement in which the photosensitive resin composition and photosensitive film of the present invention contains a (C) photo reaction initiator. Especially, it is preferable that the photosensitive resin composition and photosensitive film of the present invention contains, as the (C) photo reaction initiator, a compound that produces a radical by absorbing light whose wavelength is in a range of 400 nm to 450 nm.

A multi-purpose light-exposing device used is generally a mercury lamp, a metal halide lamp, or the like. Its light includes i ray (365 nm), h ray (405 nm), or g ray (436 nm). The polyimide containing an aromatic tetracarboxylic dianhydride and an aromatic diamine absorbs i ray by absorption caused by n conjugation. Therefore, it is very preferable for the present invention to be so arranged as to use a combination of the polyimide with a photo reaction initiator capable of efficiently producing a radical by the h ray and the g ray. Therefore, it is preferable to arrange the photosensitive resin composition and photosensitive film of the present invention such that the photosensitive resin composition and photosensitive film contain, in addition to the (A) soluble polyimide and (B) (meth)acrylic compound, a photo reaction initiator that produces a radical by absorbing a wavelength in a range of 400 nm to 450 nm.

As one example of a compound that functions as the photo reaction initiator and produces a radical by light of such a long length as long as the g ray and the i ray by light, acylphosphineoxide compounds may be given, which are represented by the following Formulae (113) and (114). Radicals produced from the acylphosphineoxide compounds react with a reactive group (vinyl, acroyl, methacroyl, allyl, and the like) having two bonds, thereby accelerating the cross-linking reaction.

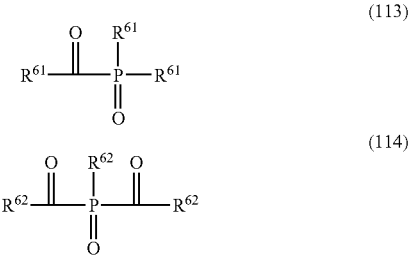

(where, in the formulae, each $R^{61}$ is independently $C_6H_5$—, $C_6H_4(CH_3)$—, $C_6H_2(CH_3)_2$—, $(CH_3)_3C$—, $C_6H_3\ C_{12}$—, and each $R^{62}$ is independently $C_6H_5$—, $CH_3O$-(methoxy group), $CH_3CH_2O$-(ethoxy group), $C_6H_4(CH_3)$—, and $C_6H_2(CH_3)_2$—).

Especially, the acylphosphineoxide represented by Formula (114) is preferred to the acylphosphineoxide represented by Formula (113), because the acylphosphineoxide represented by Formula (114) produces four radicals by a-cleavage whereas the acylphosphineoxide represented by Formula (113) produces two radicals. These compounds may be used solely or in combination by using two or more of them.

In order to cure the epoxy group attached to the side chain of the polyimide resin, the carbon-carbon double bond, and the carbon-carbon triple bond, the present invention may be so arranged as to use a photo reaction initiator of photo-cation-generating type, instead of the photo reaction initiator of radical-producing type. Specifically, for example, the photo reaction initiator of photo-cation-generating type may be diphenyliodinium compound salts such as diphenyliodinium salt of dimethoxyanthraquinonesulfonic acid; triphenylsulphonium salts; pyrylium salts, triphenylonium salts; diazonium salts; and the like. These compounds may be used solely or in combination by using two or more of them. Here, it is preferable to mix therein an aliphatic epoxy or a vinyl ether. The aliphatic epoxy and vinyl ether have a high cation curing property.

In order to cure the epoxy group attached to the side chain of the polyimide resin, the carbon-carbon double bond, and the carbon-carbon triple bond, the present invention may be so arranged as to use a photo base generating agent (a photo reaction initiator of photo base generating type) as the photo reaction initiator. Specifically, for example, the photo reaction initiator of photo base generating type may be urethane compounds that are obtained by reacting an isocyanate with a nitrobenzylalcohol or a dinitrobenzylalcohol; urethane compounds that are obtained by reacting an isocyanate with a nitro-1-phenylethylalcohol or a dinitro-1-phenylethylalcohol; urethane compounds that are obtained by reacting an isocyanate with dimethoxy-2-phenyl-2-propanol; and the like. Those compounds may be used solely or in combination by using two or more of them.

<Sensitizer (Pigment)>

In the present invention, it is preferable to use various peroxides in combination as the photo reaction initiator. Especially in order to attain a practically useful photosensitivity, it is specially preferable to use 3,3',4,4'-tetra(t-butylperoxycarbonyl)benzophenone with a sensitizer (pigment) of various types.

The sensitizer (pigment) for use in the present invention may be, but not limited to, Michler's Ketone, bis-4,4'-diethylaminobenzophenone, benzophenone, camphorquinone, benzyl, 4,4'-dimethylaminobenzil, 3,5-bis(diethylaminobenzilidene)-N-methyl-4-pyperidone, 3,5-bis(dimethylaminobenzilidene)-N-methyl-4-piperidone, 3,5-bis(diethylaminobenzilidene)-N-ethyl-4-piperidone, 3,3'-carbonylbis(7-diethylamino)coumarin, riboflavintetrabutylate, 2-methyl-1-[4-(methythio)phenyl]-2-morpholinopropane-1-one, 2,4-dimethylthioxanthone, 2,4-diethylthioxathaone, 2,4-diisopropylthioxanthone, 3,5-dimethylthioxanthone, 3,5-diisopropylthioxanthone, 1-phenyl-2-(ethoxycarbonyl)oxyiminopropan-1-one, benzoinether, benzoinisopropylether, benzanthrone, 5-nitroacenaphthene, 2-nitrofluorene, anthrone, 1,2-benzanthraquinone, 1-phenyl-5-mercapto-1H-tetrazol, thioxanthen-9-on, 10-thioxanthenone, 3-acetylindole, 2,6-di(p-dimethylaminobenzal)-4-carboxycyclohexanone, 2,6-di(p-dimethylaminobenzal)-4-hydroxycyclohexanone, 2,6-di(p-diethylaminobenzal)-4-carboxycyclohexanone, 2,6-di(p-diethylaminobenzal)-4-hydroxycyclohexanone, 4,6-dimethyl-7-ethylaminocoumarin, 7-diethylamino-4-methylcoumarin, 7-diethylamino-3-(1-methylbenzoimidazoril)coumarin, 3-(2-benzoimidazoril)-7-diethylaminocoumarin, 3-(2-benzothiazoril)-7-diethylaminocoumarin, 2-(p-dimethylaminostyryl)benzoxyazol, 2-(p-dimethylaminostyryl) quinoline, 4-(p-dimethylaminostyryl) quinoline, 2-(p-dimethylaminostyryl) benzothiazol, 2-(p-dimethylaminostyryl)-3,3-dimethyl-3H-indole, and the like. These compounds may be used solely or in combination by using two or more of them.

Of these compounds, especially preferable sensitizers are bis-4,4'-dialkylaminobenzophenone derivatives, such as bis-4,4'diethylaminobenzophenone and the like, and coumarine derivatives such as 3,3'-carbonylbis(7-diethylamino)coumarine and the like.

<Photo Polymerization Auxiliary Agent>

Moreover, in order to attain practically useful photosensitivity, the present invention may be arranged such that the photo reaction initiator is used in combination with a photo polymerization auxiliary agent. For example, the photo polymerization auxiliary agent may be, but not limited to, 4-diethylaminoethylbenzoate, 4-dimethylaminoethylbenzoate, 4-diethylaminobuPropyl benzoate, 4-dimethylaminopropylbenzoate, 4-dimethylaminoisoamilbenzoate, N-phenylglycine, N-methyl-N-phenylglycine, N-(4-cyanophenyl) glycine, 4-dimethylaminobenzonitril, ethyleneglycoldithioglycolate, ethyleneglycoldi(3-mercaptopropyonate), trimethyrolpropanethioglycolate, trimethyrolpropanetri(3-mercaptopropyorate), pentaerithritoltetrathioglycolate, pentaerithritoltetra(3-mercaptopropryonate), trimethyrolethanetrithioglycolate, trimethyrolpropanetrithioglycolate, trimethyrolethanetri(3-mercaptopropyonate), dipentaerithritolhexa(3-mercaptopropyonate), thioglycol acid, α-mercaptopropyonic acid, t-butylperoxybenzoate, t-butylperoxymethoxypenzoate, t-butylperoxynitrobenzoate, t-butylperoxyethylbenzoate, phenylisopropylperoxybenzoate, di-t-butyldiperoxyisophthalate, tri-t-butyltriperoxytrimeritate, tri-t-butyltriperoxytrimeritate, tetra-t-butyltetraperoxypyromeritate, 2,5-dimethyl-2,5-di(benzoilperoxy)hexane, 3,3',4,4'-tetra(t-butylperoxycarbonyl) penzophenone, 3,3',4,4'-tetra(t-amylperoxycarbonyl) benzophenone, 3,3',4,4'-tetra(t-hexylperoxycarbonyl) benzophenone, 2,6-di(p-azidobenzal)-4-hyroxycyclohexane, 2,6-di(p-azidobenzal)-4-carboxycyclohexanone, 2,6-di(p-azidobenzal)-4-methoxycyclohexanone, 2,6-di(p-azidobenzal)-4- hydroxymethylcyclohexanone, 3,5-di(p-azidobenzal)-1-methyl-4-piperidone, 3,5-di(p-azidobenzal)-4-piperidone, 3,5-di(p-azidobenzal)-N-acetyl-4-piperidone, 3,5-di(p-azidobenzal)-N-methoxylcarbony-4-piperidone, 2,6-di(p-azidobenzal)-4-hydroxycyclohexanone, 2,6-di(m-azidobenzal)-4-carboxycyclohexanone, 2,6-di(m-azidobenzal)-4-methoxycyclohexanone, 2,6-di(m-azidobenzal)-4-hydroxymethylcyclohexanone, 3,5-di(m-azidobenzal)-N-methyl-4-piperidone, 3,5-di(m-azidobenzal)-4-piperidone, 3,5-di(m-azidobenzal)-N-acetyl-4-pyperidone, 3,5-di(m-azidobenzal)-N-methoxycarbonyl-4-piperidone, 2,6-di(p-azidocinnamylidene)-4-hyrdoxycyclohexanone, 2,6-di(p-azidocinnamylidene)-4-carboxycyclohexanone, 2,6-di(p-azidocinnamylidene)-4-cyclohexanone, 3,5-di(p-azidocinnamylidene)-N-methyl-4-piperidone, 4,4'-diazidochalcone, 3,3'-diazidochalcone, 3,4'-azidochalcone, 4,3'-diazidochalcone, 1,3-diphenyl-1,2,3-propanetrione-2(o-acetyl)oxime, 1,3-diphenyl-1,2,3-propanetrione-2-(o-n-propylcarbonyl) oxime, 1,3-diphenyl-1,2,3-propanetrione-2-(o-methoxycarbonyl)oxime, 1,3-diphenyl-1,2,3-propanetrione-2-(o-ethoxycarbonyl)oxide, 1,3-diphenyl-1,2,3-propanetrione-2-(o-benzoil)oxime, 1,3-diphenyl-1,2,3-propanetrione-2-(o-phenyloxycarbonyl) oxime, 1,3-bis(p-methylphenyl)-1,2,3-propanetrione-2-(o-benzoil)oxime, 1,3-bis(p-methoxyphenyl)-1,2,3-propanetrione-2-(o-ethoxycarbonyl)oxime, 1-(p-methoxy phenyl)-3-(p-nitrophenyl)-1,2,3-propanetrione-2-(o-phenyl oxicarbonyl)oxide, and the like. Moreover, as another auxiliary agent, it may be so arranged that a trialkylamine is mixed in. The trialkylamine may be triethylamine, tributylamine, triethanolamine, and the like. These compounds may be used solely or in combination by using two or more of them.

As described above, the (C) photo reaction initiator of the present invention is so arranged as to be at least one of the compound of the radical-producing type, the compound of the photo cation producing type, and the compound of the photo base producing type. Furthermore, the present invention may be so arranged that the (C) photo reaction initiator is used in combination with the sensitizer (pigment) and/or the photo polymerization auxiliary agent. Therefore, in the present invention, the term "the (C) photo reaction initiator" denotes, in a broad sense, not only the photo reaction initiators in a narrow sense (the three types of photo reaction initiators (the radical-producing type, photo-cation-producing type, photo-base-producing type), but also the combination of the photo reaction initiator and a sensitizer (pigment and/or the photo polymerization auxiliary agent).

As a preferable example of the (C) photo reaction initiator of the present invention, the (C) photo reaction initiator may be an acylphosphineoxide compound, besides the combination use of 3,3',4,4'-tetra(t-butylperoxycarbonyl)benzophenone and the sensitizer.

<(C) Photo Reaction Initiator Content (An Amount of the (C) Photo Reaction Initiator in Composition)>

A total amount of the photo reaction initiator and the sensitizer and the like (that is the amount of the (C) photo reaction initiator in the broad sense in the composition) is preferably in a range of 0.001% to 15% by weight, more preferably in a range of 0.001% to 10% by weight, further preferably in a range of 0.01% to 10% by weight, and especially preferably in a range of 0.01% to 5% by weight, based on 100% by weight of a total weight of the (A) soluble polyimide, (B) (meth)acrylic compound, and (D) fire retardant. If the amount is out of the range of 0.001% to 15% by weight, there is a possibility that sensitizing effect is not obtained or the development property is adversely affected.

Moreover, considering the sensitizer alone, an amount of the sensitizer to be mixed in is preferably in a range of 0.1 part to 50 parts by weight, and further preferably in a range of 0.3 parts to 20 parts by weight, based on 100 parts by weight of the (A) soluble polyimide. If the amount of the sensitizer is out of the range, there is a possibility that sensitizing effect is not obtained or the development property is adversely affected.

Furthermore, considering the photo polymerization auxiliary agent alone, an amount of the photo polymerization auxiliary agent to be mixed in is preferably in a range of 0.1 part to 50 parts by weight, and further preferably in a range of 0.3 parts to 20 parts by weight, based on 100 parts by weight of soluble polyimide. If the amount of the photo polymerization auxiliary agent is out of the range, there is a possibility that a desired sensitizing effect is not obtained or the development property is adversely affected.

<(D) Fire Retardant>

It is preferable that the photosensitive resin composition and photosensitive film of the present invention contains (D) fire retardant.

The photosensitive resin composition, photosensitive film, and laminate of the present invention are suitable for use in electronic parts, as described above, even though usage of the photosensitive resin composition, photosensitive film, and laminate of the present invention is not limited to this. Here, there is fire retardant regulation for the electric/electronic parts. Specifically, for example, an FPC and a head part of the hard disc apparatus are exposed to a high temperature for a long time. Because of this, there is a possibility that the FPC and the head part of the hard disc apparatus causes inflammation. Therefore, a cover lay film and the like for use in those electric/electronic parts should have a high flame resistance. Thus, it is preferable that the photosensitive resin composition and photosensitive film become fire resistant after being cured.

The (D) fire retardant used in the present invention is not particularly limited. Preferably, the (D) fire retardant may be at least one of (i) a halogen compound having a halogen atom in its structure, (ii) a phosphorus compound having a phosphorus atom in its structure, and a siloxane compound having a siloxane structure in its structure. In the other words, it is preferable that the (D) fire retardant used in the present invention is a compound to which at least one kind of atom/or site is covalent-bonded, the at least one kind atom/or a site being selected from a group consisting of halogen, phosphorus, and siloxane bonding.

As to the halogen compound, for effectively attaining the flame resistance, the halogen content in the compound is preferably 15% or more by weight, more preferably 20% or more by weight, further preferably 30% or more by weight, especially preferably 40% or more by weight, and most preferably 50% or more. Particularly, a compound in which chlorine or bromine is contained is used in general.

As to the phosphorus compound, for effectively attaining the flame resistance, phosphorus content in the compound is preferably 5.0 or more by weight, and more preferably 7.0% or more by weight.

As to the siloxane compound, for effectively attaining the heat resistance and flame resistance, it is preferable that the siloxane compound is a organopolysiloxane compound (phenyl siloxane compound) having aromatic rings in a high ratio.

<Halogen Compound as the Fire Retardant>

In case where the halogen compound is used among the (D) fire retardants for use in the present invention, it is possible to preferably arrange such that the (D) fire retardant is a halogen-type (meth)acryl compound having at least one aromatic ring and at least one carbon-carbon double bond. Specifically, it is preferable that at least one of the compounds, which are selected from the halogen-type (meth) acrylic compound in Group (115), is contained:

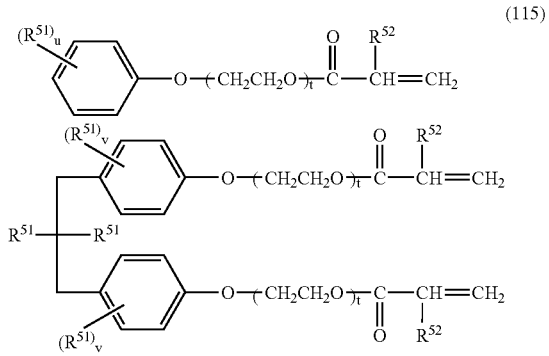

(where $R^{51}$ is a halogen atom, each $R^{52}$ is independently a hydrogen atom or a methyl group, t is an integer of from 0 to 10, u is an integer of from 1 to 5, and v is an integer of 1 to 4).

All of the halogen-type (meth)acrylic compounds has a reactive group for curing, and an advantage that they can give the heat resistance and the flame resistance at the same time.

The halogen contained in the halogen compound used in the present invention may be chlorine, bromine, or the like. For attaining the flame resistance, bromine is preferable. That is, it is preferable that the halogen compound used in the present invention is a bromine containing compound. Especially, the halogen-type (meth)acrylic compounds in Group (115) and the like that contain three or more bromines in its molecule are preferable. For attaining a better fire resistance, a higher bromine content is more preferable.

Specifically, examples of the bromine-containing (meth) acryl compound represented by Group (115) are bromide-based monomers, such as new frontier BR-30 (tribromophenylacrylate), BR-30M (tribromophenylmethacrylate, BR-31 (EO modified tribromophenylacrylate), BR-42M (EO modified tetrabromo bisphenol A dimethacrylate) (all are made by Dai-Ichi Kogyo Seiyaku Co., Ltd.) and the like; brominated aromatic triazines, such as pyroguard SR-245 (made by Dai-Ichi Kogyo Seiyaku Co., Ltd.) and the like; brominated aromatic polymers, such as pyroguard SR-250, SR-400A (made by Dai-Ichi Kogyo Seiyaku Co., Ltd.); brominated aromatic compounds such pyroguard SR-990A) as made by Dai-Ichi Kogyo Seiyaku Co., Ltd.) and the like; and the like. These compounds may be used solely or in combination by using two or more of them. Note that a halogen compound having no carbon-carbon double bond may be used similarly, because addition of such halogen compound can give the flame resistance.

Moreover, the halogen compound of the present invention may be a phosphorus compound having a halogen atom in its molecule. Specifically, examples of the halogen compound are halogen-containing ester phosphate and the like, such as CLP (tris(2-chloroethyl)phosphate), TMCPP (tris(chloroprophyl)phosphate), CRP (tris(dichloropropyl)phosphate), CR-900(tris(tribromoneobenzy)phosphate) (all are made by Daihachi Chemical Industry Co., Ltd.), and the like. These compounds may be used solely or in combination by using two or more of them.

Furthermore, in case where the halogen compound is used as the (D) fire retardant, addition of at least one of antimony trioxide and antimony pentoxide (hereinafter, referred to as antimony oxide collectively) produces an antimony halide because the antimony oxide draws out the halogen atom from the fire retardant around a temperature at which the resin starts to be thermolyzed. Thus, the addition of the antimony oxide improves the flame resistance synergistically.

The amount of the antimony oxide to add in is not particularly limited. However, it is preferable that the amount of the antimony oxide to be added is preferable in a range of 0.1% to 10% by weight based on 100% by weight of the total amount of the (A) soluble polyimide, (B) (meth)acrylic compound, (D) fire retardant. It is more preferable that the amount of the antimony oxide to be added is in a range of 1% to 6% by weight, based on 100% by weight of the total amount.

Here, it is especially preferable that the phosphorus compound and the siloxane compound are used as the (D) fire retardant of the present invention.

Recently, the flame resistance regulation for the electric/electronic parts requires not only the retardation and prevention of inflammation but also non-pollution-causing property, low toxicity, and safety, as the concern about the world-wide environmental problem and safety for human body is increased. Thus, the flame resistance regulation requires not only being difficult to be combusted, but also reduction in toxic gas generated by heat, and in smoke-generating substance.

In the insulating resin and the solder resist (typical example of which is the cover lay film) for printed wiring board), most the halogen compounds used as the fire retardant are bromine-type, conventionally. Widely used are brominated epoxy resin, a typical example of which is tetrabromo bis phenol A. However, the fire retardant including a halogen gives a bad effect on the environment. Thus, replacing the bromine-type fire retardant with non-halogen type fire retardant has been considered.

The non-halogen type fire retardant may be a nitrogen type compound, a phosphorus type compound, an inorganic type compound, or the like. In general, the nitrogen type compound affects the curing of the resin, whereas the phosphorus type resin causes lower moisture resistance and the like drawback. Therefore, there is conventionally a limit in selection of the flame resistant raw material to be used in the cover lay film that requires the electronic insulating property and resistance against hydrolysis.

Moreover, recently, use of the siloxane compound as the fire retardant has been studied. However, there is a large limit in type of the resin capable of showing flame resistance effect. Further, there is a very few type of siloxane compounds that show a large flame resistance effect by sole use thereof. Even a siloxane compound that relatively high flame resistance effect, needs to be added in a large amount in order to satisfy the strict flame resistance standard. As a result, the addition of the siloxane compound gives adverse effects on the properties of the photosensitive resin composition, while disadvantageously increasing the cost. Thus, the addition of the siloxane compound is not practical.

On the other hand, the phosphorus compound and the siloxane compound used in the present invention have excellent usefulness (for example, use of the phosphorus compound and the siloxane compound does not affect the properties of the photosensitive resin composition). Therefore, the use of the phosphorus compound and the siloxane compound further improves quality of the photosensitive resin composition and photosensitive film of the present invention.

<Phosphorus Compound as (D) Fire Retardant>

In case where the phosphorus compound is used among the (D) fire retardants for use in the present invention, a type of the compound is not particularly limited. Especially, the phosphorus compound may be (1) a compound selected from ester phosphate (including condensed ester phosphate), phosphorus ester, phosphine, and phosphineoxide, or (2) a compound whose 10%-weight-loss temperature is in range of 300° C. to 500° C., and which has both a phosphorus atom and a nitrogen atom in its molecule (phosphorus-nitrogen compound).

<Phosphorus Compound (1)>

Of the phosphorus compounds, especially, ester phosphate (including condensed ester phosphate), and phosphineoxide are preferably used, because ester phosphate and phosphineoxide are highly compatible with the soluble polyimide.

As to the ester phosphate, it is more desirable that the ester phosphate has at least one aromatic ring, because the ester phosphate having at least one aromatic ring can attain the fire retardation and has an excellent hydrolysis resistance. It is further preferable that the ester phosphate has two or more aromatic rings. Specifically, for example, it is preferable that the ester phosphate is a ester phosphate selected from the following Group (116):

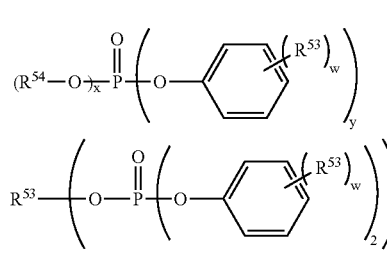
(116)

(where $R^{53}$ is a methyl group, $R^{54}$ is an alkyl group or a phenyl group, $R^{55}$ is a divalent organic group, w is an integer from 0 to 3, x and y are integers satisfying x+y=3). It is further preferable that the ester phosphate has two or more aromatic ring. Such ester phosphate compound is soluble in the alkali aqueous solution. Thus, when using the ester phosphate as a raw material of the photosensitive cover lay film, it is possible to perform the development with the alkali aqueous solution.

Specifically, examples of the phosphorus compound are: ester phosphates such as TPP (triphenylphosphate), TCP (tricresilphosphate), TXP (trixylenylphosphate), CDP (cresildiphenylphosphate), PX-110 (cresil 2,6-xylenylphosphate) (all are made by Daihachi Chemical Industry Co., Ltd.); non-halogen condensed ester phosphates such as CR-733 (resosinoldiphosphate), CR-741, CR-747, PX-200) (all are made by Daihachi Chemical Industry Co., Ltd.); phosphoric (meth)acrylates such as biscoat V3PA (made by Osaka Organic Chemical Industry Ltd.), MR-260 (made by Daihachi Chemical Industry Co., Ltd.) and the like; phosphorous ester such as phosphorous tri phenyl ester and the like. Those compounds may be used solely or in combination by using two or more of them.

In terms of the hydrolysis resistance, the phosphorous compound is easy to be hydrolyzed under a high-pressure and high-humid condition. The use of the condensed ester phosphate makes it possible to attain both the flame resistance and hydrolysis resistance. Moreover, the combinative use of the bromine compound and the phosphorous compound as the fire retardant makes it possible to realize the flame resistance of the cured photosensitive film with a little amount of fire retardant by the synergistic effect of the combinative use.

Note that well known compounds may be used as the others of the phosphorus compounds (1). Moreover, the phosphorus compounds (1) containing ester phosphate may be used solely or in combination by using two or more of them.

<Phosphorus Compound (2)>

The phosphorous compound (2) (phosphorus-nitrogen compound) is used preferably because, in combusting, the phosphorus atom has a dehydration effect and inert gas is produced from the nitrogen atom, thereby attaining flame resistance by synergistic effect. Note that the "10% weight loss temperature" is a temperature at which a weight of a sample is reduced by 10%, the weight being measured in air by using a differential scanning calorimeter (made by Seiko Corp./DTA 220) at rising temperature from 20° C. to 600° C. at a rate of 20° C./minute.

In the present invention, if the phosphorus compound (2) has a 10% mass loss temperature lower than 300° C., the phosphorus compound has an excessively low thermolysis temperature or vaporization temperature. Thus, the 10% mass loss temperature lower than 300° C. is not preferable. On the other hand, if the phosphorus compound (2) has a 10% mass loss temperature higher than 500° C., the phosphorus compound has an excessively high thermolysis temperature or vaporization temperature. The excessively high thermolysis temperature or vaporization temperature causes insufficient flame resistance effect. Thus, the phosphorus compound (2) has a 10% mass loss temperature higher than 500° C. is not preferable.

A compound selected from phosphazen compounds, phosphoric melamines, polyphosphoric melamines, ammonium phosphates, and ammonium polyphosphates, may be preferably used as the phosphorus compound (2). Those phosphorus compounds (2) may be used solely or in combination by using two or more of them.

By using the phosphorus compound (2), it is possible to attain, without using the halogen compound, the cured photosensitive film having the flame resistance and high soldering heat resistance. Moreover, it is possible to give thermo flowability to the photosensitive film in the B stage condition.

<Phosphazen Compound>

Among the phosphorus compounds (2), because of its heat resistance, hydrolysis resistance, flame resistance, and chemical resistance, the phosphazen may be preferably a cyclophosphazen compound represented by Formula (20):

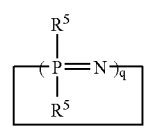
(20)

(where each $R^5$ is independently a hydrogen atom or a monovalent organic group having no halogen, and q is an integer from 3 to 30).

It is preferable that the organic group $R^5$ in Formula (20) is an organic group which forms a bonding with a phosphorus atom via —O—, —S—, —NH—, —NR— (R is a monovalent organic group). Specific examples of such organic groups are: vinylether groups, styrene ether groups, alcoxy groups, phenoxy groups, amino groups, allyl groups and the like. Of those groups, it is preferable that the organic group X is a phenoxy group.

Specifically, the compound may be diphenoxy phosphazen, phenoxyisopropoxy phosphazen, amide phosphazen, or the like. As commercially available products, SP-100, SPS-100, SPD-100, SPE-100, S-134 (which are all made by Otsuka Chemical Co., Ltd.), and the like may be used as this compound. These compounds may be used solely or in combination by using two or more of them.

Moreover, the phosphazen compound that can be used suitably in the present invention may be a phosphazen compound having, as $R^5$ in Formula (20), a substituent or substituents of one or more of types selected from vinyl group, allyl group, methallyl group, and 1-butenyl group. Preferably, the phosphazen compound that can be used suitably in the present invention may be a phosphazen compound having, as $R^5$ in Formula (20), an allyl group that is a reactive substituent. Moreover, it is possible to arrange such that a phosphazen copolymer of having, in Formula (20), a different polymerization degree n of the phosphazen compound.

Specific examples of the phosphazen compound having the reactive substituent are: bis(2-allylphenoxy)phosphazen, bis(2-methoxy-4-allylphenoxy)phosphazen, phenoxyallyl phosphazen, or the like. These compounds may be used solely or in combination by using two or more of them.

The use of the phosphazen compound as the phosphorus compound (2) gives the cured photosensitive film an excellent electric insulating property as well as the fire resistant property. Moreover, it is more preferable to use the phosphazen compound, because the use of a phosphoric melamine, a polyphosphoric melamine, ammonium phosphate, or ammonium polyphosphate cannot give an excellent electric insulating property, while they are excellent in giving the cured photosensitive film the fire resistant property.

<Phosphoric Melamine/Polyphosphoric Melamine>

Next, phosphoric melamines are compounds in which phosphoric acid is bound with melamine in various ratio. Also referred to as a phosphoric melamine is a compound in which phosphoric acid is bound with, not only melamine, but also a nitrogen-containing compound such as ammonia, amide, ethylenediamine, and the like, or metals such as aluminum, magnesium, calcium and the like, provided that majority of the parts is bound with melamine.

For example, the following compounds may be used as the phosphoric melamine in the present invention: product name: P-7202 (made by Sanwa Chemical Corp.), Fyrol MP (Registered Trademark; made by Akzo Novel K.K.), anitblaze NH (Registered Trademark; made by Albright & Wilson Corp.), melapur MP (Registered Trademark; made by N. V. DSM.), and the like. These compounds may be used solely or in combination by using two or more of them.

Further, the polyphosphoric melamines are compounds in which polyphosphoric acid (dehydrated condensation product of a polymer of phosphoric acid that is a trimer or a greater polymer) is bound with melamine in various ratios. It is possible to use the polyphosphoric melamines with no particular limitation in their condensation degrees of polyphosphoric acid, and primary molecular structures such as whether a ring or a chain. Also referred to as a polyphosphoric melamine is a compound in which not all of unit structures of phosphoric acid are bound with melamine, and some of melamine molecules are substituted with a nitrogen-containing compound such as an ammonia, an amide, an ethylenediamine, or the like, or a metal such as aluminum, magnesium, calcium or the like, provided that majority of the parts is bound with melamine.

For example, the following compounds may be used as the polyphosphoric melamine in the present invention: product name: MPP-A (made by Sanwa Chemical Corp.), PMP-100 (Made by Nissan Chemical Industries Ltd.), melapur 200 (Registered Trademark; made by N. V. DSM.), and the like. These compounds may be used solely or in combination by using two or more of them.

<Ammonium Phosphate/Ammonium Polyphosphate>

The ammonium phosphates are compounds in which phosphoric acid is bound with ammonia. Moreover, ammonium polyphosphates are compounds in which polyphosphoric acid is bound with ammonia in various ratios. Again it is possible to use the ammonium polyphosphates with no particular limitation in their condensation degrees of polyphosphoric acid, and primary molecular structures such as whether a ring or a chain.

Also referred to as an ammonium polyphosphate is a compound in which not all of unit structures of phosphoric acid are bound with ammonia, and some of ammonia molecules are substituted with a nitrogen-containing compound such as a melamine, an amide, an ethylenediamine, or the like, or a metal such as aluminum, magnesium, calcium or the like, provided that majority of the parts is bound with ammonia.

For example, the following compounds may be used as the ammonium polyphosphate in the present invention: product name: sumisafe P (Registered Trademark, made by Sumitomo Chemical Co., Ltd.), sumisafe PM (Registered Trademark, made by Sumitomo Chemical Co., Ltd.), teraju C60 (Registered Trademark, made by Chisso Corp.), FCP-700 (made by Suzuhira Chemical Co., Ltd.), taien S (made by Taihei Chemicals Ltd.), nonenen PR-62 (made by Marubishi Yuka Industry Corp.), exolit AP422 (Registered Trademark, made by Clariant Ltd.), exolit AP462 (Registered Trademark, made by Clariant Ltd.), phos-chek P30 (Registered Trademark, made by Solutia Inc.), and the like. These compounds may be used solely or in combination by using two or more of them.

Ammonium polyphosphate improves heat resistance when used in combination with a triazine-based condensated nitrogen-containing compound. Thus, the use of ammonium polyphosphate gives better hydrolysis resistance when applied by using a special surface-coating method.

<Siloxane Compound as (D) Fire Retardant>

In case where the siloxane compound among the fire retardants usable in the present invention is employed, it is preferable that the siloxane compound is an organopoly siloxane compound having an aromatic ring (phenyl group) in a high ratio, that is, a phenyl siloxane compound.

With respect to all organic substituents, the phenyl siloxane compound contains an aromatic group by 10% or more, preferably 20% or more, and preferably 25% or more. The higher the aromatic group content, the greater the flame resistance effect. Thus, a higher aromatic group content is desirable.

The use of an oraganopoly siloxane compound having a low aromatic group content tends to cause deterioration in dispersibility and miscibility of the (D) fire retardant with respect to (A) soluble polyimide and (B) (meth)acrylic compound. In this case, film-like formation of the photosensitive resin composition tends to result in a low transparent film due to phase separation of plural components having different refraction indexes is caused, or non-transparent film.

Moreover, in case where an organopoly siloxane compound having a low aromatic group content is used, it is difficult to attain a sufficient fire resistant effect without adding a larger amount of the organopoly siloxane compound. However, the addition of the larger amount of the organopoly siloxane compound tends to result in a significant deterioration of various properties (for example, mechanical strength) of the cured photosensitive film.

<Specific Example of Siloxane Compound>

The phenyl siloxane compound, which is a kind of silicone resin, has a structure formed by polymerization of at least one of the following M unit (one-functional-group-containing siloxane unit), D unit (two-functional-group-containing siloxane unit), T unit (three-functional-group-containing siloxane unit), and Q unit (four-functional-group-containing siloxane unit):

M Unit:

(M UNIT)

(where $R^6$ is an organic group),

D Unit:

(D Unit)

(where $R^6$ is an organic group),

T Unit:

(T Unit)

(where $R^6$ is an organic group),

Q Unit:

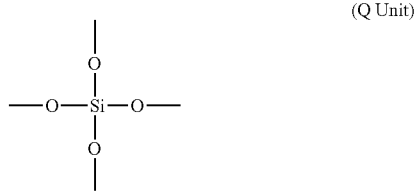

(Q Unit)

There is no particular limitation in the siloxane compound usable as the fire retardant in the present invention. Especially, it is preferable to use, as the fire retardant, at least one of (1) a siloxane compound having at least one of the T unit and Q unit, and (2) a siloxane compound having the D unit.

Note that in each unit the organic group $R^6$ is not particularly limited, and may be identical with or different from each other. Specifically, $R^6$ may be alkyl groups such as methyl group, ethyl group, propyl group, butyl group, pentyl group, hexyl group, heptyl group, octyl group, and the like; cycloalkyl groups such as cyclohexyl group and the like; alkenyl groups such as vinyl group, (meth)acryl group, allyl group, and the like; aryl groups such as phenol group, styIyl group, phenyl group, tolyl group, biphenyl group, naphthyl group, and the like; alkoxy groups, polyether groups, epoxy groups, hydroxyl group, carboxyl group, amino group, and monovalent organic groups prepared by substituting, with a halogen atom, cyano group, or the like, part or all of hydrogen atoms bound with a carbon atom(s) of those groups; and the like. The siloxane compound of the present invention may contain only one of those organic group or may contain two or more of those organic groups.

<Siloxane Compound (1)>

In case of the siloxane compound (1), the siloxane (1), which has a branched structure, can give a good flame resistance. Especially, it is preferable that the siloxane compound (1) has the T unit.

As to the siloxane compound (1), it is preferable that the siloxane (1) contains the T and Q units (branch unit) by 20 mol % or higher based on a total amount of a siloxane unit. An amount of the T and Q units less than 20 mol % causes the siloxane compound to have a low heat resistance, thereby deteriorating the effect of the flame resistance. Moreover, the amount of the T and Q units less than 20 mol % causes the siloxane compound to have an excessively low viscosity. In case of the production of siloxane compound, a silicone compound flows out on a surface of the photosensitive film.

Further, the siloxane compound (1) contains the branch unit preferably in a ratio of 30 mol % or more and 95 mol % or less with respect to the total amount of the siloxane unit. If the ratio is 30 mol % or more, further improved heat resistance of (B) component: silicone compound is attained, and thus a cover lay film containing this has a largely improved flame resistance. However, if the ratio exceeds 95 Mol %, a silicone main chain has a low degree of freedom. There is a possibility that such a low degree of freedom in the silicone main chain makes it difficult to cause condensation of the aromatic group in combustion, thereby making it difficult to attain a remarkable flame resistance. As described above, it is preferable that 20 mol % or more of the organic groups contained in the siloxane compound (1) is the aromatic group. If the ratio of the aromatic group contained in the siloxane compound (1) is below the range, there is a possibility that an aromatic group-aromatic group condensation becomes difficult to take place in combustion, thereby causing a low flame resistance effect.

A lowest limit of the ratio of the aromatic group in the organic groups contained is 20 mol %, preferably 40 mol % or higher, and more preferably 60 mol % or higher. On the other hand, a highest limit of the ratio is 95 mol % or lower, and preferably 90 mol % or lower. A most preferable range of the ratio of the aromatic group in the organic groups contained is 60 mol % or higher and 85 mol % or lower.

Especially, it is preferable that a structural unit in which $R^6$ in the T unit is the aromatic group, shares 20 mol % or more, based on 100 mol % of the T unit. It is preferable that $R^6$ in the T unit is a phenyl group.

As long as the ratio is within the range of from 40 mol % to 85 mol %, it is possible to attain more efficient condensation of the aromatic group in combustion and a good miscibility of the siloxane compound (1) with respect to the (A) soluble polyimide. The good miscibility of the siloxane compound (1) improves the dispersibility. Thus, as long as the ratio is within the range of from 40 mol % to 85 mol %, it is possible to attain a very good flame resistant effect. However, if the ratio exceeds 95 mol %, there is a possibility that aromatic group-aromatic group steric hindrance would result in difficulty in the condensation of them, thereby making it difficult to attain a remarkable flame resistance. The aromatic group contained in the siloxane compound (1) may be a phenyl group, a biphenyl group, naphthalene, or their derivatives. In consideration of safety of the siloxane compound, the phenyl group is especially preferable.

Moreover, of the groups that are contained in the siloxane and are attached to the main chain or the side chain branched therefrom, the methyl group is preferable apart from the aromatic group. Further, a terminal group is a functional group of at least one kind selected from the group consisting of methyl group, phenyl group, hydroxyl group, alcoxy group, vinyl group, and (meth)acryl group. In the arrangement in which the terminal group has those functional groups, photosensitive resin composition unlikely occurs in mixing the (A) soluble polyimide, and the siloxane compound. Thus, it is possible to attain even dispersion. Therefore, it is possible to realize, after curing, further better flame resistance and heat resistance without deteriorating the outer appearance of the photosensitive film.

Especially, it is more preferable that the terminal group of the siloxane compound (1) is a functional group of at least one kind selected from the group consisting of vinyl group and (meth)acryl group. That is, it is preferable that the terminal group of the siloxane compound having the branched structure is at least one of vinyl group and (meth)acryl group. By arranging such that the siloxane compound, which is the (D) fire retardant, is a compound whose terminal group is a compound having a reactive carbon-carbon unsaturated bond, it is possible to cause, during photo curing and thermal curing, copolymerization of the siloxane compound with the (B) (meth)acrylic compound used in the present invention. Therefore, it is possible to attain better flame resistance and heat resistance of the photosensitive film after curing, and to prevent the siloxane compound from being dissolved out of the exposed film during the development treatment. In case of a photosensitive film in which a siloxane compound whose terminal group is a compound having no reactive carbon-carbon unsaturated bond, there is a possibility that the siloxane compound is dissolved into the developer during the development treatment, thereby causing the cured film to have a low flame resistance.

Moreover, there is no particular limitation in the average molecular weight (weight average molecular weight) of the siloxane compound. However, it is preferable that the siloxane compound has an average molecular weight not less than 400 but not more than 50,000. If the siloxane compound has an average molecular weight more than 50,000, the siloxane compound has excessively high viscosity, thus becomes a poor miscibility with the (A) soluble polyimide and the (B) (meth)acrylic compound. This leads to uneven dispersion of the siloxane compound. Thus, in this case, a low flame resistance and/or a low film-like forming property tend to occur. On the other hand, if the siloxane compound has an average molecular weight less than 400, it becomes difficult to obtain the siloxane compound, and further, there is a possibility that the siloxane compound has such a low viscosity that causes the siloxane compound to ooze out from the film. Further, a large amount of the siloxane compound is necessary to attain the flame resistance effect.

The siloxane compound (1) may be a commercially available product, but may be prepared in accordance with a generally used producing method. Specifically, dissolved into an organic solvent is triorganomonochlorosilane, diorgnaodichlorosilane, monoorganochlorosilane, tetrachlorosilane, or a partially hydrolyzed condensation product thereof in an amount that is in accordance with a molecular weight of the siloxane compound and a ratio of M unit, D unit, T unit, and Q unit that constitute the siloxane compound. Then, triorganomonochlorosilane, diorgnaodichlorosilane, monoorganochlorosilane, tetrachlorosilane, or a partially hydrolyzed condensation product thereof is reacted with an addition of water, thereby completing condensation polymerization. After that, the solvent and the like are separated by distillation or the like. In this way, the siloxane compound (1) is synthesized. By changing the amount of the raw material, it is possible to produce a siloxane having an arbitrary molecular weight and an arbitrary ratio of the units.

For example, by condensing, with an equilibrating catalyst and/or a condensing catalyst, the condensation product prepared by hydrolyzing only an triorganomonochlorosilane and diorganodichlorosilane, it is possible to obtain a siloxane compound having a straight-chain structure having no branch as indicated by the following formula (117):

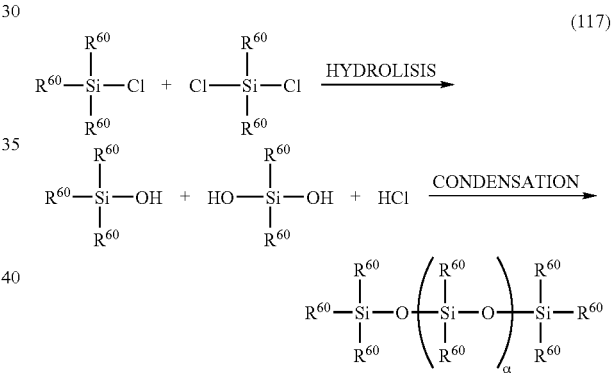

(where $R^{60}$ is an organic group and a is an arbitrary integer).

Moreover, by arranging such that part of the raw materials are (i) the condensation product prepared by hydrolyzing at least one of monoorganotrichlorosilane and tetrachlorosilane, (ii) a hydrolysis product of diorganodichlorosilane, and (iii) the equilibrating catalyst and/or the condensation catalyst, it is possible to obtain, via the condensation reaction, a siloxane compound having a three dimensional structure (network structure) having a branch as indicated by the following formula (118):

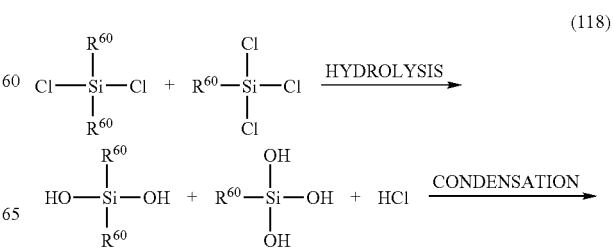

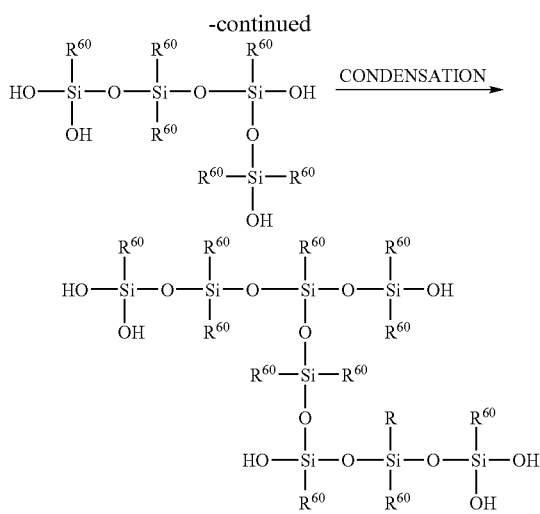

(where $R^{60}$ is an organic group).

Furthermore, the siloxane compound whose terminal group the functional group of at least one kind selected from the group consisting of vinyl group and (meth)acryl group is produced by an arrangement in which part of the raw material is triorganomonochlorosilane, diorgnaodichlorosilane, monoorganotrichlorosilane, or a partially hydrolyzed condensation product thereof which has a functional group of at least one kind selected from the group consisting of vinyl group and (meth)acryl group.

The equilibrating catalyst and the condensation catalyst for use in the production of the silicone compound may be an acidic catalyst of at least one kind selected from inorganic acids such as sulfuric acid, hydrochloric acid, and the like, and organic acids such as organic sulfonic acid, carboxylic acid. It is preferable that the equilibrating catalyst and the condensation catalyst are sulfuric acid, hydrochloric acid, and organic sulfonic acid. It is more preferable that the equilibrating catalyst and the condensation catalyst are sulfuric acid. Based on a total amount of the raw-material organosilanes, an amount of the acidic catalyst to be added is in a range of from 0.5% by weight to 10% by weight, preferably in a range of from 1% by weight to 7% by weight.

The addition of the catalysts is carried out preferably in two or more stages, in order to avoid a production of a minute gel-like material as a by-product. Specifically, the acidic catalyst of a small amount is added in the siloxane first. Then, the condensation is mainly performed with 1 to 5-hour stirring at a room temperature. A rest of the acidic catalyst is added therein, followed by 1 to 10-hour stirring at a room temperature. In this case, the amount of the acidic catalyst to be added first is generally in a range of 0.02% to 2% by weight, and preferably in a range of 0.05% to 1% by weight, based on the total amount of the raw-material organosilanes.

After the 1 to 10-hour stirring after the all of the acidic catalyst is added, water is added therein. The addition of water is to convert, into hydroxyl group, the sulfonic group bound with the terminal group of the siloxane. The conversion of the sulfonic group into the hydroxyl group results in further condensation.

An amount of water to be added is in a range of from 20 parts by weight to 60 parts by weight, and preferably in a range of from 30 parts by weight to 50 parts by weight, based on 100 parts by weight of the acidic catalyst. The reaction is hindered if the amount of the water is too small or too large with respect to the acidic catalyst. Thus, it is desirable that the amount of the water is within the range.

The condensation reaction is terminated by 0.5 to 3-hour stirring at a room temperature after the addition of water. After a waste acid is removed, neutralizing dehydration of the acid catalyst remained. Any neutralizer may be used, provided that the neutralizer is suitable for this purpose. The neutralizer may be preferably sodium carbonate, sodium hydroxide, sodium hydrogen carbonate, potassium carbonate, potassium hydroxide and the like. Further, for better filtration and purification following this step, a dehydrating agent such as sodium sulfate or the like may be added together with the neutralizer.

<Siloxane Compound (2)>

T/D type, T/D/Q type, D/Q type of combinations are examples of combinations including D unit for constituting the siloxane compound (2). In any of those combinations, it is necessary that D unit be contained in a range of 10 mol % to 95 mol %. It is preferable that D unit is contained in a range of 20 mol % to 90 mol %. If D unit is contained less than 10 mol %, the silicone resin has a poor flexibility, thereby failing to attain a sufficient flame resistance. Moreover, if the D unit is contained more than 95 mol %, the siloxane compound (2) has low dispersibility and solubility with respect to the soluble polyimide, whereby the photosensitive resin composition becomes poor in outer appearance, optical transmittance, and strength.

Therefore, in accordance with the good range of D unit content, T unit content is in a range of 5 mol % to 90 mol %, in case of the T/D type.

Moreover, in case of T/D/Q type or D/Q type, the T unit content is in a ragne of 0 to 89.99 mol %, preferably, 10 mol % to 79.99 mol %. Here, Q unit content is in a range of 0.01 mol % to 50 mol %. As long as a degree of freedom for space is secured, it is more advantageous to contain more Q unit for reproducing the flame resistance, because Q unit has a high oxidation degree. However, if the siloxane compound (2) contains Q unit in more than 60 mol %, inorganic particle-like property of the siloxane compound (2) becomes too strong, whereby the siloxane compound (2) has a poor dispersibility in the soluble polyimide. Therefore, it is necessary that the Q unit content be less than this.

Further, in consideration of a balance among the flame resistance, processability, and properties of products made therefrom, and from the D unit content and Q unit content, it is preferable that T unit is contained in a range of from 10% by weight to 80% by weight, based on the total amount of the siloxane compound (2).

Examples of siloxane units preferably used as the siloxane compound (2) are as follows: T unit may be preferably $C_6H_5$—$Si_{3/2}$, $CH_3$—$SiO_{3/2}$; D unit may be preferably $(C_6H_5)_2$—$SiO_{2/2}$, $CH_3$—$C_6H_5$—$SiO_{2/2}$, and $(CH_3)_2$—$SiO_{2/2}$.

Of those preferably siloxane units, $(CH_3)_2$—$SiO_{2/2}$ (dimethyl siloxane unit) is an example of D unit for giving the flexibility. The dimethyl siloxane unit is most effective in giving the flexibility, whereas excessively large amount of the dimethyl siloxane unit gives low flame resistance and makes it difficult to attain improvement in flame resistance. Therefore, it is not desirable that a large amount of the dimethyl siloxane unit is contained in the siloxane compound (2). Therefore, it is preferable that the dimethyl siloxane unit content in the siloxane compound (2) is not more than 90 mol % based on a total amount of D unit.

Moreover, of the preferable siloxane units, $CH_3$—$C_6H_5$—$SiO_{2/2}$ (methyl siloxane unit) is most preferable, because the methyl siloxane unit can give high phenyl group content as well as the flexibility.

Further, of the preferable siloxane units, $(C_6H_5)_2$—$SiO_{2/2}$ (diphenyl siloxane unit) is excellent in maintaining the high phenyl group content. However, the diphenyl siloxane unit has such a structure that bulky phenyl groups are present in high density over Si. Therefore, a high the diphenyl siloxane unit content causes the siloxane compound to have a molecular structure having a large steric hindrance, whereby a siloxane structure has a low degree of special freedom and the aromatic rings cannot overlap each other. The overlapping of the aromatic rings is necessary for a flame resistance system to operate by coupling of the aromatic rings with each other. Thus, the arrangement in which a large amount of the diphenyl siloxane unit is contained reduces the flame resistance.

Therefore, the siloxane compound (2) is so prepared that a raw material containing these three units as D unit is added within the range. It is preferable that the raw material mainly containing the methyl phenyl siloxane unit is used.

Note that a weight average molecular amount of the siloxane compound (2) is not particularly limited. However, it is preferable that the weight average molecular amount of the siloxane compound (2) is in a range of from 300 to 50,000. It is more preferable that the weight average molecular amount of the siloxane compound (2) is in a range of from 400 to 30,000. If the weight average molecular amount of the siloxane compound (2) is less than 300, there is a possibility that the siloxane compound (2) oozes out in the B stage condition of the photosensitive resin composition. Thus, the weight average molecular amount of the siloxane compound (2) less than 300 is not preferable. On the other hand, if the weight average molecular amount of the siloxane compound (2) is more than 50,000, the siloxane compound (2) has a poor solubility with respect to the developer, thereby resulting in a long developing time and poor processability.

Examples of commercially available siloxane compounds that can be used in the present invention, and that have a high aromatic ring content are listed below.

For example: products of Shin-Etsu Silicones: KF50-100S, KF54, KF56, HIVAC F4, HIVAC F5, X-22-1824B, X-40-2134, X-40-2135, KR211, KR215, KR311, KR2621-1; products of GE Toshiba Silicones: XC99-B5664, and TSL9706; products of Toray Dow Corning Silicones Co., Ltd.: torefil E-601; and the like. But, the present invention is not particularly limited to those. Of those, branched compounds are products of Shin-Etsu Silicones: KF56, KR211, KR215, KR311, KR2621-1, X-40-2134, X-40-2135; and the like. Those commercially available siloxane compounds may be used solely or in combination by mixing two or more of them together.

Note that, in case a siloxane compounds listed above is used as the (D) fire retardant, it is well known that use of an inorganic hydroxide in combination with the siloxane compound listed above improves the flame resistance and self flame extinction property. In the present invention, therefore, the photosensitive resin composition or photosensitive film may be so arranged that the siloxane compound is added in combination with an inorganic hydroxide in case where the siloxane compound is used as the (D) fire retardant.

However, the addition of the inorganic hydroxide gives adverse effects on light transparency, surface smoothness, and electric insulating property of the film. Therefore, it is preferable that an amount of the inorganic hydroxide to added in is not more than 10% by weight. Specific examples of inorganic hydroxide to be used are not particularly limited. Thus, a well-known inorganic hydroxide may be used.

<(D) Fire Retardant Content (Amount of (D) Fire Retardant in Composition)>

Where the (D) fire retardant is not limited to a halogen compound, a phosphorous compound, and a siloxane compound, it is preferable in general that the (D) fire retardant is used in a range of from 10 parts by weight to 300 parts by weight, based on 100 parts by weight of the (A) soluble imide. If the amount of the (D) fire retardant is less than 10 parts by weight, the cured photosensitive film tends to have a difficulty in having the flame resistance. If the amount of the fire retardant is more than 300 parts by weight, the cured photosensitive film tends to have a poor mechanical property.

Moreover, where a total amount of the (A) soluble polyimide, (B) (meth)acrylic compound, and (D) fire retardant is based on, it is preferable that the amount of the (D) fire retardant is used in a range of from 5% by weight to 50% by weight. If the amount of the (D) fire retardant is less than 5% by weight, the cured photosensitive film tends to have a difficulty in having the flame resistance. If the amount of the (D) fire retardant is more than 50% by weight, the cured photosensitive film tends to have a poor mechanical property.

Especially, where the total amount of the (A) soluble polyimide, (B) (meth)acrylic compound, and (D) fire retardant is put as 100 parts by weight, it is preferable in general that, regardless of the type of the (D) fire retardant, the (A) soluble polyimide is in a range of 30% by weight to 70% by weight, the (B) (meth)acrylic compound is in a range of 5% by weight to 50% by weight, and the (D) fire retardant is in a range of 1% by weight to 50% by weight. Of course, some types of the (D) fire retardant may have different preferable contents.

<Phosphorous Compound Content (Amount of Phosphorous Compound in Composition)>

Where the phosphorous compound is used as the (D) fire retardant, each type of the phosphorous compound has its own preferable content (amount to add in). Thus, the phosphorous compound is added in the preferable amount as appropriate.

Firstly, in case where a phosphoric ester is used as a phosphorous compound (1), it is preferable that the phosphoric ester is in a range of from 3% by weight to 50% by weight based on the total amount by weight. If the phosphoric ester is less than 3% by weight, the cured photosensitive film tends to have a difficulty in having the flame resistance. If the phosphoric ester is more than 50% by weight, the cured photosensitive film tends to have a mechanical property.

In case where a phosphorous compound (2) is used, it is preferable that the phosphorous compound (2) is in a range of 5% by weight to 50% by weight. If the phosphorous compound (2) is less than 5% by weight, the cured photosensitive film tends to have a difficulty in having the flame resistance. If the phosphorous compound (2) is more than 50% by weight, the cured photosensitive film tends to have a poor mechanical property.

Moreover, improvement in the flame resistance and the like improvement can be attained by arranging such that an inorganic filling material, such as silica, talc, silicone, and the like is added in combination of the phosphorous compound (2). For these inorganic filling materials, it is preferable that an amount of 0% by weight to 50% by weight is added based on the amount of the phosphorous compound (2). Further, for these inorganic filling materials, it is preferable that an amount of 0% by weight to 30% by weight is added with respect to the phosphorous compound (2). If the amount of the inorganic filling material is too large, the photosensitive cover lay film thus produced has a poor light transparency and a poor shock resistance.

In case where a phosphazen compound among the phosphorous compounds (2) is used in combination with the siloxane compound (1), it is preferable that an amount of the phosphazen compound to add in is in a ragne of 0% by weight to 200% by weight with respect to the siloxane compound (1). Further, it is preferable that the amount of the phosphazen compound to add in is in a ragne of 0% by weight to 150% by weight with respect to the siloxane compound (1). If the amount of the phosphazen compound is too large, it becomes difficult to attain even dispersion of the phosphazen compound with the (A) soluble polyimide. Uneven dispersion of the phosphazen compound results in poor light transparency of the photosensitive film thus produced, and in poor mechanical property and shock resistance of the cured photosensitive film.

Especially, where the phosphorous compound (2) (phosphorous-nitrogen compound) is contained as the (D) fire retardant, it is preferable that the (A) soluble polyimide is in a range of from 30% by weight to 70% by weight, the (B) (meth)acrylic compound is in a range of from 1% by weight to 50% by weight, and the phosphorous-nitrogen compound is in a range of from 10% by weight to 50% by weight, based on 100% by weight of a total amount of the (A) soluble polyimide, (B) (meth)acrylic compound, and the phosphorous compound (2).

<Siloxane Compound Content>

Regardless of whether the siloxane compound (1) or the siloxane compound (2) is used, siloxane compound content in the resin composition in the present invention is specified as below, when the siloxane compound is used as the (D) fire retardant. Note that the siloxane compounds (1) and (2) may be used in combination.

To begin with, it is preferable that the siloxane compound is contained in a range of from 1% by weight to 50% by weight, based on 100% by weight of the total amount of the (A) soluble polyimide, (B) (meth)acrylic compound, and (D) fire retardant. It is more preferable that the siloxane compound is contained in a range of from 5% by weight to 40% by weight, based on 100% by weight of the total amount. If the amount of the siloxane compound is less than 1% by weight, there is a possibility that the cured photosensitive cover lay film has an insufficient flame hesitance effect. On the other hand, if the amount of the siloxane compound is more than 50% by weight, the following problems would occur: the photosensitive resin composition is separated off; film-like formation property is deteriorated; and the film has an inferior outer appearance.

Moreover, in case where an imide(meth)acrylate compound is contained as the (B) (meth)acrylic compound, the siloxane-based fire retardant is contained preferably in a range of 5% by weight to 50% by weight, more preferably in a range of 5% by weight to 40% by weight, and further preferably in a range of 10% by weight to 40% by weight, based on a total amount of the (A) soluble polyimide and (B) (meth)acrylic compound. If the amount of the (D) fire retardant is less than 5% by weight, a cured cover lay film tends to have a difficulty in having the flame resistance. On the other hand, if the amount of the (D) fire retardant is more than 50% by weight, the cured cover lay film tends to have a poor mechanical property.

Especially, in case where the siloxane compound having the branched structure is contained as the (D) fire retardant, it is preferable that the (A) soluble polyimide is contained in a range of from 30% by weight to 70% by weight, the (B) (meth)acrylic compound is contained in a range of from 1% by weight to 50% by weight, and the siloxane having the branched structure is contained in a range of from 10% by weight to 50% by weight, based on the 100% by weight of the (A) soluble polyimide, (B) (meth)acrylic compound, and the siloxane having the branched structure.

<Other Component>

The photosensitive resin composition and the photosensitive film of the present invention may contains a component other than the components (A) to (D). The other components is not particularly limited in terms of type. For example, according to usage, various organic additives, inorganic fillers, or various reinforcing agents may be added therein.

Especially, the photosensitive resin composition used in the present invention is preferably in a solution-form containing an appropriate organic solvent. If the photosensitive resin composition is dissolved in the appropriate organic solvent, the photosensitive resin composition can be used in the solution (varnish) state, and used easily during production of the later-described photosensitive film, especially in applying and then drying.

The organic solvent for dissolving the photosensitive resin composition in the present invention is not particularly limited, provided that each of the compositions (A) to (D) can be well dissolved or dispersed in the organic solvent. However, an aprotic polar solvent is preferable in consideration of solubility.

Specifically, the organic solvent may be, for example, N-methyl-2-pyrrolidone, N-acetyl-2-pyrrolidone, N-benzyl-2-pyrrolidone, N,N-dimethylformamide, N,N-dimethylacetamide, dimethyl sulfoxide, hexamethylphosphorictriamide, N-acetyl-ε-caprolactam, dimethylimidazolidinone, diethyleneglycoledimethylether, triethyleneglycoledimethylether, γ-butyrolactone, dioxsane, dioxolane, tetrahydrofuran, chloroform, methylene chloride, or the like. Those organic solvent may be used solely, or in combination so as to be used as a mixture.

The organic solvent may be a solvent remained after used in the synthetic reaction of the (A) soluble polyimide, or a solvent added to the (A) soluble polyimide isolated. Moreover, in order to improve in a property for being able to be applied readily, an organic solvent such as toluene, xylene, diethylketone, methoxybenzene, cyclopentanon, and the like may be added in an amount in such a range that does not adversely affect the solubility of the polymer.

Moreover, by arranging such that 2,2'-hexafluoropropylidenediphthalic dianhydride, 2,3,3',4'-biphenyltetracarboxylic dianhydride, or an ester acid anhydride mentioned above is used as a main component as the acid dianhydride, and an aromatic diamine having an amino group in m-position, a diamine having a sulfonic group, or a siloxanediamine is used as part of the diamine, a resultant (A) soluble polyimide has a dramatically better solubility. Therefore, it is possible to dissolve the resultant (A) soluble polyimide in a low-boiling point solvent having a boiling point of 120° C. or less. The low-boiling point solvent may be: an ether-based solvent such as dioxsane, dioxolane, tetrahydrofuran, and the like; a halogen-based solvent such as chloroform, methylene chloride, and the like; and the like. Especially, for applying the photosensitive resin composition on the supporter and drying the photosensitive resin composition thereon, the use of the low-boiling point solvent having the boiling point of 120° C. or less prevents thermal polymerization of the (B) (meth)acrylic compound to be mixed in. Thus, the use of the low-boiling point solvent having the boiling point of 120° C. is preferable.

<Photosensitive Film>

The thus obtained solution of photosensitive resin composition is dried to a film-like form, thereby obtaining a photosensitive film of the present invention. Here, the solution may be applied on a supporter made of a metal, a PET, or the like, and then dried and peeled off from the supporter, so as to be a single film. Alternatively, as described later, the photosensitive resin composition may be used as a laminate in which the film of the photosensitive resin composition is positioned on a supporting film (base film).

In other words, the photosensitive resin composition of the present invention may be in a solution (varnish) state, or may be processed into the photosensitive film. Moreover, as described later, the photosensitive film of the present invention may be a photosensitive layer included in the laminate.

The usages of the photosensitive film are, for example: (1) as a resist film that acts as an etching resist for forming a copper circuit on a printed wiring board such as an FPC or the like, and is finally peeled off after used as the etching resist; (2) as a photosensitive film that is formed on a circuit of a printed wiring board and holed in a predetermined position by, with a photo mask placed thereon, exposing to light and development the photosensitive film; (3) a protective film for insulating the circuit electrically; and the like usages.

Especially, the photosensitive film of the present invention can be used not only for the usage (1), but also as the insulating protective film of the usage (3) by being thermally cured after used as the photosensitive film of the usage (2). Note that the photosensitive film for the usage (1) is referred to as a photosensitive dry film resist, and the photosensitive film for the usages (2) and (3) are referred to as the photosensitive cover lay film. That is, the photosensitive resin composition and the photosensitive film of the present invention may be used as the photosensitive cover lay film and the photosensitive dry film resist.

<Production of Photosensitive Film>

Next, how to produce the photosensitive film is explained. For producing the photosensitive film of the present invention, firstly the (A) soluble polyimide, (B) (meth)acrylic compound, (C) photo reaction initiator, and/or (D) fire retardant, and if necessary, the other additives, are dissolved evenly in an organic solvent.

The organic solvent used here may be any solvent that can dissolve photosensitive resin composition therein. For Example, the organic solvent may be: ether-based solvent such as dioxolane, dioxsane, tetrahydrofuran, and the like; ketone-based solvent such as acetone, methylethyleketone, and the like; alcohol-based solvent such as methylalcohol, ethylealcohol, and the like; ad the like solvent. In case where the photosensitive resin composition is obtained in the solution (varnish) state, the solvent may not be added especially (see <Other Component>).

Those solvent may be used solely or a combination of two or more of the solvents may be used. Because the solvent is removed in a later stage, preferable is a solvent that can dissolve the (A) soluble polyimide, (B) (meth)acrylic compound, (C) photo reaction initiator, and (D) fire retardant, and, if possible, that has a lower boiling point. The use of such solvent is advantageous for facilitating the process.

Next, the photosensitive resin composition in the solution form is applied onto the supporting film evenly, and then dried by removing the solvent off by using at least one of heating and blowing hot air thereon. Thereby the photosensitive film is obtained. In general, the photosensitive film is so designed as a film in which the photosensitive composition is kept in a partially-cured state (B stage condition). Thus, in performing a thermopressing or thermo compression process, the photosensitive film, which still a fluidity, is applied on the circuit of FPC so that the photosensitive film follows a rise-and-recess shape of the circuit thereby making no gap between the photosensitive film and the circuit. Curing of the photosensitive film is completed by (a) photo-cross linking reaction during exposure to the light, and (b) thermal curing due to heat applied in the pressing process and thermal curing step performed after the pressing process.

<Drying Temperature>

A drying temperature in the removing the organic solvent and drying for the production of the photosensitive film is preferably such a temperature that does not cause, in (B) (meth)acrylic compound and the like, reactions of acrylic group, epoxy group, and the other curing groups such as double bonds and triple bonds. In general, the drying temperature is 180° C. or lower, preferably 150° C. or lower, more preferably 120° C. or lower, and further preferably 100° C. or lower.

A drying time should be long enough to remove the organic solvent off. However, a shorter drying time is more advantageous for facilitating the process. The drying time for drying the photosensitive film is not particularly limited. Specifically, for example, the drying may be carried out by (1) a method for drying the photosensitive film in a short time (about 2 to 3 minutes) at a temperature in a range of 80° C. to 120° C. or at 130° C.; (2) a method in which the drying is carried out at a temperature gradually elevated from a low temperature, for example, at a temperature programmed at 45° C. for 5 minutes, 65° C. for the following 5 minutes, and then, 85° C. for the next 5 minutes.

Methods like the method (1), for drying the photosensitive film in a short time at a relatively high temperature are suitable for a case where the photosensitive film has a thin thickness. The methods like the method (1) has such advantages that a photosensitive film having a long length can be produced with high productivity because the photosensitive film can be dried in such a short time.

However, in case where the photosensitive film has a thickness of 50 μm or more, it takes a long time to evaporate off the solvent in which the photosensitive resin composition is dissolved. Thus, there is a possibility that the solvent remains in an inside of the film even after a surface of the film is dried by the high temperature. If the photosensitive film that has been incompletely dried is used on the FPC, the photosensitive film causes such problems that the resin oozes out when the photosensitive film is formed on the FPC or the like, and that bubbles are produced in the photosensitive film during thermal curing after the photosensitive film is formed, subjected to pattern light exposure, and developed. Therefore, if the thickness of the photosensitive film is relatively thick, methods, like the method (2), for drying the photosensitive film at a gradually elevated temperature is preferable, even though a longer drying time is necessary.

Moreover, if the photosensitive film is not sufficiently dried, the photosensitive film in the B stage condition becomes tacky (sticky). Further, in this case, there is a possibility that peeling of the protective film layered on the photosensitive film causes a part of the photosensitive film to be stuck and thus transferred on a surface of the protective film. Furthermore, in this case, there is a possibility that peeling of the supporting film causes a part of the photosensitive film to be stuck and thus transferred on a surface of the supporting film.

<Thickness of Photosensitive Film>

Moreover, there is no particular limitation in the thickness of the photosensitive film. For example, to be used as the cover lay film, a preferable thickness of the photosensitive film is in a range of 5 µm to 75 µm, a more preferable thickness is in a range of 10 µm to 60 µm, and a further preferable thickness is in a range of 10 µm to 40 µm. On the other hand, to be used as the dry film resist, a preferable thickness of the photosensitive film is in a range of 10 µm to 50 µm, and a more preferable thickness is in a range of 20 µm to 40 µm.

Regardless of whether the photosensitive film is used as the cover lay film or as the dry film resist, a photosensitive film having a too thin thickness cannot fill the rise and recess shape formed by the copper circuit and the base film of the FPC or the like. Moreover, the photosensitive film having a too thin thickness cannot has a flat top surface after being layered on the FPC, thereby resulting in a poor flexibility. Moreover, a photosensitive film having a too thick thickness tends to cause a difficulty in development a fine pattern, thereby resulting in low resolution and high possibility for curbing of a cured sample.

<Laminate>

As described above, the photosensitive film of the present invention may be the photosensitive layer included in the laminate. Specifically, examples of the laminate of the present invention are: (1) an arrangement of a two-layer sheet in which the photosensitive layer is positioned on the supporting film; (2) an arrangement of a three-layer sheet in which a protective film is positioned on a photosensitive layer formed on the supporting film; and the like arrangement. Further, as described later, the photosensitive layer is formed by, for example, drying a resin composition solution applied on the supporting film, the resin composition solution being prepared by dissolving the photosensitive resin composition of the present invention in an organic solvent.

<Supporting Film>

Materials of the supporting film may be, but not limited to, various generally commercially available films such as a polyethyleneterephthalate (PET) film, a polyphenylenesulfide (PPS) film, a polyimide film, and the like. Of those films, the PET film is most popular as the supporting film, because of it's relatively low price and certain degree of heat resistance.

As to a contacting surface of the supporting film (a surface on which the photosensitive film is positioned, that is, on which the photosensitive resin composition is applied), the contacting surface may have been subjected to a surface treatment in order to allow the photosensitive film to more firmly stick to the supporting film with no gap, and to be more easily peeled off from the supporting film.

Moreover, a thickness of the supporting film is preferably not less than 5 µm but not more than 50 µm, and more preferably not less than 10 µm but not more than 30 µm. A supporting film having a too thin thickness tends to be easily wrinkled and poor in handling property. Moreover, in case of a supporting film having thick thickness, a photosensitive dry film resist having a large length have an excessively heavy weight as a whole.

Furthermore, it is preferable to have the protective film on the photosensitive cover lay film prepared by drying the photosensitive resin composition applied on the supporting film. The protective film protects the photosensitive cover lay film from being attached with a foreign material in the air, and prevents quality deterioration of the photosensitive cover lay film due to drying.

<Protective Film>

The present invention may be arranged as the three-layer sheet (laminate) in which the protective film is positioned on the photosensitive film of the laminate (two-layer arrangement) of "supporting film/photosensitive film". The protective film protects the photosensitive cover lay film from being attached with a foreign material in the air, and prevents quality deterioration of the photosensitive cover lay film due to drying. It is preferable that the protective film is laminated on a photosensitive film surface at a temperature in a range of 10° C. to 50° C., or a room temperature. In this way, the protective film is adhered on the photosensitive film with no gap therebetween. Thus, it is possible to protect the surface of the photosensitive film. Note that an unnecessary high temperature applied during the formation of the protective film causes thermal expansion of the protective film thus produced. Such thermal expansion causes the protective film to be wrinkled or curled after the formation.

Because the protective film is peeled off in using the laminate, it is preferable that the contact surface between the protective film and the photosensitive film (the surface that is adhered on the photosensitive film) has both (a) an appropriate firm stickiness during storage, and (b) a property for easy peeling-off.

Materials of the protective films may be, but not limited to: a polyethyleneterephthalate (PET) film, a polyphenylenesufide (PPS) film, a polyethylene film (PE film), a polyethylenevinylalcohol film (EVA film), "a copolymer film of polyethylene and ethyleviniylalcohol (hereinafter referred to as a (PE+PVA) copolymer film)", "a laminate of a PE film and (PE+EVA) copolymer film (hereinafter, PE-PE+EVA) laminate film)", or "a film prepared by coextrusion of (PE+EVA) polymer and polyethylene (that is, a film having a PE film surface on one side, and a (PE+EVA) copolymer film on the other side (hereinafter, a PE+PE+EVA coextrusion film))". The PE film is advantageous in its low cost and excellent surface smoothness. Moreover, the (PE+EVA) copolymer film has both (a) an appropriate firm stickiness during storage, and (b) a property for easy peeling-off.

In case the PE-PE+EVA laminate film or the PE-PE+EVA coextrusion film is used as the protective film, an arrangement is preferable that a (PE+EVA) copolymer film surface is the contact surface to be in contact with the photosensitive film, and a PE film surface is in contact with the supporting film.

The use of the protective film gives such an advantage that a top surface of the three-layer sheet (laminate) including the protective film, the photosensitive film, and the supporting film, has a good surface smoothness when the three-layer sheet is rolled up.

Moreover, the protective film may have a light shielding property. To give the light shielding property, the PE film is colored in a color that shuts off light in a wavelength range that a light initiation reacting agent and a sensitizer coloring agent contained in the photosensitive film absorb. The use of the colored protective film makes it easier to distinguish the supporting film and the protective film in the photosensitive cover lay film thus three-layered. Thus, it becomes easier to peel off the protective film.

<Storage>

In case of storing the two-layer sheet that has not be provided with the protective film thereon, the photosensitive film of the present invention may be stored in a rolled-up form so that a surface of the photosensitive film will not be dried or be in contact with oxygen. Moreover, in case of storing the three-layer sheet that is provided with the protective film, the photosensitive film of the present invention may be stored in a rolled-up form or as a pile of sheets that is cut in an appropriate size and piled up.

For the photosensitive film, to store as the three-layer sheet by providing the protective film is more preferable than to store as the two-layer sheet, because a long-time contact of the photosensitive film with the air allows a foreign material to adhere on the photosensitive film more easily, and causes a dramatic reduction in storage stability of the photosensitive film by oxygen and moisture in the air.

<Production of FPC>

The following explains an example of the usage of the photosensitive dry film resist thus obtained.

Usually, the production of the FPC is so productive because a film having a long length is processed continuously by applying an adhesive, drying, and applying a copper foil. However, it is almost-manual process to (i) open a hole or window in that area of the photosensitive cover lay film which is to be positioned above a terminal section of the circuit or a jointing section of the circuit (a jointing section to be used to join with parts), and (ii) to position the hole or the like of the cover lay film to the terminal section of the circuit or the jointing section of the circuit. Further, the opening of the hole or the like, and the positioning are carried out with a small work size, and the cover lay film is bonded with the circuit batchwize. Therefore, the opening of the hole or the like and the positioning is poor in workability, positional accuracy, and cost.

To the contrary, the photosensitive film or the laminate of the present invention can be placed on the printed substrate directly without using an adhesive agent. Further, the hole for allowing the jointing with an FPC terminal section can be opened by light exposure and development after the photosensitive film is bonded with the FPC. As a result, it is possible to solve the problem in the positional accuracy and workability during the FPC production.

Specifically, for example, in case where the FPC is produced by using the photosensitive film made of the three-layer sheet as the laminate of the present invention, the photosensitive film is bonded with a copper-clad laminate (copper-clad laminate attached with a circuit, a circuit-attached CCL) by thermo compression (for example, heat laminating, pressing).

<Bonding of Film and FPC>

A compression-bondable temperature refers to a lowest temperature that enables thermo compression. Thermo compression possible temperature is a temperature necessary for compression bonding of the photosensitive film of the present invention and a target object onto which the photosensitive film is to be bonded. The temperature range differs depending on from which type of raw materials the film is made. The compression-bondable temperature is measured by measuring a lowest temperature that allows the photosensitive cover lay film to be compression-bonded on a polyimide film and a glossy surface of a copper foil by thermal lamination of the photosensitive film in the B stage condition. The polyimide film used here is an NPI film made by Kaneka Corp. and has a thickness of 25 μm. The copper foil is an electrolytic copper foil made by Mitsui Mining & Smelting Co., Ltd. and has a thickness of 38 μm.

Whether the compression bonding is successful or not is checked by trying to peel off the photosensitive cover lay film from the polyimide film and the glossy surface of the copper foil after thermal lamination. If the photosensitive cover lay film cannot be peeled off, the compression bonding is judged as successful. The compression-bondable temperature is a temperature not more than 150° C., preferably in a range of from 20° C. to 150° C., and more preferably in a range of from 50° C. to 150° C. A lower compression-bondable temperature is preferable. It is preferable that the compression-bondable temperature is not more than 130° C. It is further preferable that the compression-bondable temperature is not more than 110° C.

A photosensitive film having a compression-bondable temperature out of the range likely have a problem when used. Specifically, for a photosensitive film that cannot be compression-bonded without a higher temperature than this range, there is a possibility that warping or curling occurs in the photosensitive film after cooling due to a thermal expansion coefficient difference between the photosensitive dry film and a member to which the photosensitive dry film is adhered, because, for example, heat initiates the reaction that supposes to be caused by light irradiation, and a difference between a compression temperature and a normal temperature is too large. Moreover, for a photosensitive film that cannot be compression-bonded without a lower temperature than this range, it is necessary to cool down the photosensitive film. There is a possibility that the cooling result in dew condensation on a surface due to temperature differences in the steps, thereby deteriorating the photosensitive dry film in property due to water produced from the dew condensation.

Here, the copper foil has the surface (glossy surface) that is glossy, and a surface (rough surface) that is not glossy. Thermo compression to the rough surface is easier than thermo compression to the glossy surface, because the rough surface has a larger surface area. Thus, it is possible to perform thermo compression of the photosensitive cover lay film to the rough surface of the copper foil at a temperature at which the photosensitive cover lay film can be thermo-compressed onto the glossy surface of the copper foil.

If a temperature in the layering is excessively high, a photosensitive reactive parts are cross-linked thereby causing the film to cure. This causes the film to lose its function as the photosensitive cover lay film. Thus, it is preferable to carry out the layering at a low temperature. Specifically, the temperature is in a range of from 20° C. to 150° C., in a range of from 60° C. to 150° C., further preferably in a range of from 60° C. to 120° C., more preferably in a range of from 80° C. to 120° C. If the temperature is too low, the photosensitive film has a poor fluidity. The poor fluidity makes it difficult to cover a fine circuit on a flexible printed wiring board, and tends to result in poor firm stickiness.

In this way, the laminate layered as "a circuit-attached CCL/photosensitive film/supporting film" in this order is prepared. The supporting film may be peeled off after completion of the lamination, or may be peeled off after completion of the exposure. For a sake of protection of the photosensitive cover lay film, to peel off the supporting film after the exposure with the photomask applied thereon is preferred.

Moreover, after adhered on the circuit on the flexible printed wiring board, light (such as ultraviolet light) is irradiated thereon. Then, the photosensitive film is thermally cured to a cover lay for protecting and insulating the circuit.

<Light-Exposure/Development>

Here explains how the light-exposure/development are performed. A photomask is applied on the supporting film of the laminate layered as "a circuit-attached CCL/photosensitive film/supporting film". Then, the laminate exposed to the light. After that, the supporting film is peeled off. Then, the laminate is developed. By doing this, unexposed part is dissolved and removed, thereby forming a hole or the like in a desired position, and fabricating the film into a desired shape. The development may be performed with a generally-used positive type photo resist developing apparatus.

Because the photo reaction initiator contained in the photosensitive cover lay film generally absorbs light of wavelengths of 450 nm or lower, a light source used for the exposure need effectively emit light of wavelength in a range of from 300 nm to 430 nm.

<Developer>

Moreover, the developer may be a basic aqueous solution or an organic solvent. As a solvent to dissolve a basic compound, water or an organic solvent may be used. For better solubility of the polyimide, a water-soluble organic solvent may be further added, such as methanol, ethanol, propanol, isopropylalcohol, isobutanol, N-methyl-2-pyrrolidone, N,N-dimethylformamide, N,N-dimethylacetamide, or the like. A combination of those water-soluble organic solvents may be used. Considering environmental influence, it is preferable not to use the organic solvent, and it is most preferable to use an alkali aqueous solution as the developer.

Examples of the basic compound are alkali metals, alkali earth metals, hydroxides of ammonium ion, carbonates of ammonium ion, and amine compounds.

Specifically, examples of the basic compound are: amine compounds such as 2-dimethylaminoethanol, 3-dimethylamino-1-propanol, 4-dimethylamino-1-butanol, 5-dimethylamino-1-pentanol, 6-dimethylamino-1-hexanol, 2-dimethylamino-2-methyl-1-propanol, 3-dimethylamino-2,2-dimethyl-1-propanol, 2-diethylaminoethanol, 3-diethylamino-1-propanol, 2-diisopropylaminoethanol, 2-di-n-butylaminoethanol, N,N-dibenzyl-2-aminoethanol, 2-(2-dimethylaminoethoxy) ethanol, 2-(2-diethylaminoethoxyl) ethanol, 1-dimethylamino-2-propanol, 1-diethylamino-2-propanol, N-methyldiethanolamine, N-ethyldiethanolamine, N-n-butyldiethanolamine, N-t-butyldiethanolamine, N-lauryldiethanolamine, 3-diethylamino-1,2-propandiol, triethanolamine, triisopropanolamine, N-methylethanolamine, N-ethylethanolamine, N-n-butylethanolamine, N-t-butylethanolamine, diethanolamine, diisopropanolamine, 2-aminoethanol, 3-amino-1-propanol, 4-amino-1-butanol, 6-amino-1-hexanol, 1-amino-2-propanol, 2-amino-2,2-dimethyl-1-propanol, 1-aminobutanol, 2-amino-1-butanol, N-(2-aminoethyl)ethanolamine, 2-amino-2-methyl,1,3-propandiol, 2-amino-2-ethyl-1,3-propandiol, 3-amino-1,2-propandiol, 2-amino-2-hydroxymethyl-1,3-propandiol, tetramethylammoniumhydroxide, tetraethylammoniumhydroxide, tetrapropylammoniumhydroxide, tetraisopropylammoniumhydroxide, aminomethanol, 2-aminoethanol, 3-aminopropanol, 2-aminopropanol, methylamine, ethylamine, propylamine, isopropylamine, dimethylamine, diethylamine, dipropylamine, diisopropylamine, trimethylamine, triethylamine, tripropylamine, triisopropylamine, and the like; sodium hydroxide, potassium hydroxide, ammonium hydroxide, sodium carbonate, potassium carbonate, ammonium carbonate, sodium hydrogen carbonate, potassium hydrogen carbonate, ammonium hydrogen carbonate; hydroxides or carbonate of alkali metals, alkali earth metals or ammonium ion; and the like. Those compounds may be used solely or as a combination of two or more of them. Further, compounds other than those compounds may be used, provided that the compounds is soluble in water or alcohol, and a solution thereof is alkali.

Concentration of the basic compound is in a range of from 0.1% to 50% by weight. In consideration of effects on the supporting substrates and the like, the concentration of the basic compound is preferably in a range of 0.1% to 30% by weight, more preferably in a range of 0.1% to 10% by weight. In consideration of effects on the film, it is further preferable that the concentration is in a range of 0.1% to 5% by weight.

The pattern thus formed by the development is then washed with a rinsing liquid so as to remove a developing solvent. Preferable examples of the rinsing liquid are methanol, ethanol, isopropylalcohol, water and the like, which have a good miscibility with the developer.

That is, it is necessary for the photosensitive film of the present invention to be developable with the alkali aqueous solution after being exposed to light. Moreover, it is preferable that the alkali aqueous solution used as the developer contains at least one of a carbonate of an alkali metal, a hydroxide of an alkali metal, and a tetraammonium hydroxide.

The photosensitive cover lay film thus developed becomes an insulating protective film for a circuit after being cured by thermal curing. Thereby, a flexible printed wiring board is prepared.

<Properties of Photosensitive Film>

The photosensitive film of the present invention (the photosensitive resin composition formed in a film-like form), which are used as such, is of high quality by satisfying at least one of those properties (1) to (5):

(1) having a curing temperature of 200° C. or less;

(2) having a post-curing thermolysis starting temperature of 300° C. or more;

(3) having a line-to-line insulating resistance of $10^{13}\Omega$ or more after 24-hour moisture conditioning at 20° C. and 65% RH;

(4) being capable of sustaining a resistance of $10^{10}\Omega$ or more for a period of 500 hours or longer at application of a direct current of 100V at 85° C. at 85% RH, in case where the photosensitive film is applied on a cupper-clad board on which a comb-shaped pattern having line/space=100 μm/100 μm is formed; and (5) having a soldering heat resistance of 300° C. or more after 48-hour humidity control at 35° C. at 85% RH.

By satisfying the properties (1) to (5), the photosensitive film of the present invention become suitable for use in the FPCs, heads of hard disc apparatuses, and various electronic parts.

Especially, the soldering heat resistance of (5) will be described here. For example, in the FPCs, soldering is carried out by exposing the photosensitive film to a high temperature of 200° C. or more for a few seconds. Thus, the photosensitive film having a higher soldering heat resistance after curing is preferable. When measured solely after curing, the photosensitive film of the present invention has, a thermolysis temperature of 300° C. or more, more preferably 320° C. or more, and further preferably 340° C. or more.

Note that a conductive layer of the FPCs is made of copper in many cases. By exposing copper to a temperature above 200° C., a crystalline structure of copper is changed, thereby resulting in a low strength of a circuit made of copper. Therefore, it is very preferable that the curing temperature is 200° C. or less.

Moreover, it is preferable that the photosensitive film of the present invention is capable of being compression-bonded at 150° C. or less to a target object to which the photosensitive film is to be laminated. Further, in case where the target object to which the photosensitive film is to be laminated is a polyimide film or a copper foil having a glossy surface, it is preferable that a compression-bondable temperature in the B stage condition is in a rage of 20° C. to 150° C.

Moreover, in the photosensitive film of the present invention, a desired pattern is formed by the exposure and development, as described above. Here, the development process is performed by showering the developer so as to dissolve unexposed part. Thus, if the photosensitive film has a low adhesiveness, there is a possibility that the photosensitive film falls off during the development process. Therefore, it is preferable that the photosensitive film (photosensitive resin composition) of the present invention has an adhesion strength of 5 Pa·m or more. It is more preferable that the photosensitive film (photosensitive resin composition) of the present invention has an adhesion strength of 10 Pa·m or more.

EXAMPLES

In the following, the present invention is described specifically, with reference to examples and comparative examples to which the present invention is not limited. Note that, unless otherwise specified, names of products following names of manufacturer are product names or product number in the examples and comparative examples.

[Evaluation of Properties]

Properties of the photosensitive film and laminate were evaluated in the following manner in examples 1 to 4 and comparative example 1.

Thermolysis starting temperature was determined by measuring a temperature range from a room temperature to 500° C. at a programming rate of 10° C./min in air by using TG/DTA220 made by Seiko Corporation. A temperature at which weight was reduced by 5% was determined as thermolysis starting temperature.

Degree of elasticity was measured following JIS C 2318.

Peel adhesion strength was measured following JIS C 6481: Peel-back strength (90°). Note that the measurement of the peel adhesive strength was carried out with a width of 3 mm, and measurement results were converted to be based on a width of 1 cm.

The weight average molecular weight was measured under the following conditions by using GPC of Waters Corp.: Column: two columns (KD-806M made by Shodex Corp.); Temperature 60° C.; Detector: $R_I$; Flow Rate: 1 ml/min; Carrier Liquid: DMF (lithium bromide 0.03M, phosphoric acid 0.03M); Sample Concentration: 0.2% by weight; Injection Amount: 20 µl; Reference substance: polyethyleneoxide.

Example 1

Into a separable flask of 2,000 ml provided with a stirring apparatus, 4.30 g (0.01 mol) of bis[4-(3-aminophenoxy) phenyl]sulfone (BAPS-M), 24.9 g (0.03 mol) of KF-8010 ($R^{22}$=—$CH_2CH_2CH_2$—, a=10, $R^{23}$=$CH_3$ in Formula (108)) available from Shin-Eetsu chemical Co., Ltd. as siloxanediamine (siliconediamine), and 200 g of N,N-dimethylformamide (DMF) were poured. Then, 29.4 g (0.10 mol) of 2,3,3',4'-biphenyltetracarboxylic dianhydride (a-BPDA) was quickly added therein with severe stirring. The stirring was continued for another 30 minutes thereafter. Thereby, a solution was prepared.

Next, a solution of 17.2 g (0.06 mol) of bis(4-amino-3-carboxy-phenyl)methane in 75 g of DMF was added in the solution thus prepared, followed by 4-hour stirring. Thereby a polyamic acid solution was obtained. The polyamic acid solution had a weight average molecular weight (Mw) of 60,000.

The polyamic acid solution was transferred into a vat coated with a fluorine-based resin. The polyamic acid in the vat was heated in a vacuum oven under a reduced pressure of 5 mmHg at a temperate programmed as follows: 150° C. for 10 minutes, 160° C. for 10 minutes, 170° C. for 10 minutes, 180° C. for 10 minutes, 190° C. for 10 minutes, and then 210° C. for 30 minutes.

Then, the vat was taken out of the vacuum oven, thereby obtaining a silicone polyimide as (A) soluble polyimide containing carboxylic acid of 71.5 g. The silicone polyimide had an Mw of 62,000 (COOH equivalent: 602).

A solution was prepared by adding, into 25 g of the silicone polyimide and 150 g of dioxolane, (a) photo reaction initiators (0.5 g (1.2 mmol) of bis(2,4,6-trimethylbenzoil)-phenylphosphineoxide, 25 g of ABE-30 (bisphenol A EO modified (n≈30) diacrylate; made by Shin-Nakamura Chemical Co., Ltd.), and 1.5 g of epoxy 828 (made by Yuka Shell Corp.)), and (b) a polymerization inhibitor (10 mg of methoxy phenol). The solution was applied on a PET film having a thickness of 25 µm. Then, the solution applied on the PET film was dried at 45° C. for 5 minutes and then at 65° C. for 5 minutes.

In this way, a two-layer sheet (laminate) was obtained, which was structured as photosensitive film (38 µm in thickness)/PET (25 µm in thickness).

Laminating process was carried out by applying a temperature of 100° C. and a force of 100N/cm on the two-layer sheet placed on a copper foil (made by Mitsui Mining & Smelting Co., Ltd., 3EC-VLP 1 ounce) so that the photosensitive film and the PET film were laminated in this order. The laminating process was following by light exposure performed by a light-exposing machine (available from Nippon Uthograph Inc.; Table-top printer 26-1KS) (Light Exposure Condition: light of 400 nm was applied by 300 mJ/cm²).

Then, a flexible copper-clad laminate was obtained by, after the light exposure, peeling off the PET film and then curing at 180° C. for 2 hours. Note that the flexible copper-clad laminate had a two-layer structure of copper film/photosensitive film, and had not provided with a copper circuit thereon.

A peel adhesion strength of the flexible copper-clad laminate was measured following JIS C 6481 (peel-back strength (180°). It was found that the peel adhesion strength of the flexible copper-clad laminate was 11.8N/cm (1.2 kg weight/cm). Moreover, it was observed that 1-minute immersion of the flexible copper-clad laminate in a solder bath at 260° C. gave no defect such as swelling and the like to the flexible copper-clad laminate.

Moreover, the copper foil was removed from the flexible copper-clad laminate by etching, thereby obtaining a cured photosensitive film (cover lay film). It was found that the cover lay film had a degree of elasticity of 1,000N/mm², extension of 25%, and a thormolysis starting temperature of 370° C.

A lamination was prepared by laminating a photosensitive film (sunfort made by Asahi Kasei Corp.) on the copper foil of the flexible copper-clad laminate. The lamination was exposed to light via a photomask of a pattern (comb-shaped pattern) in which ten lines of line/space=100/100 µm as shown in FIG. 1 were arranged in a comb-shape, and then developed, thereby etching the copper foil. After that, the photosensitive film (sunfort mentioned above) was peeled off. In this way, a comb-shape-patterned circuit made from the copper foil was prepared as shown in FIG. 1 (see FIG. 1 for sizes).

Further, the two-layer sheet was placed on the patterned circuit so as to cover the patterned circuit so that the photosensitive film and the PET film were laminated in this order. Then, laminating process of the two-layer sheet on the patterned circuit was carried out by applying a temperature of 100° C. and a force of 100N/cm. The laminating process was followed by light exposure performed by a light-exposing machine (available from Nippon Uthograph Inc.; Table-top printer 26-1KS) (Light Exposure Condition: light of 400 nm was applied by 300 mJ/cm$^2$). Then, an FPC having a lamination structure of photosensitive film/copper foil/photosensitive film was obtained after peeling off the PET film and then curing at 180° C. for 2 hours after the light exposure.

A resistance (insulating resistance) of the FPC was measured after 1-minute application of a DC of 500V on the FPC, which had been subjected to moisture conditioning carried out under the following conditions:

(1) Normal Condition: after moistening at 20° C. in 65% RH for 24 hrs:=9×10$^{15}$Ω.

(2) Moisture Condition: after moistening at 35° C. in 85% RH for 24 hrs: =3×10$^{15}$Ω.

Moreover, the two-layer sheet was placed on a copper foil so that the photosensitive film and the PET film were laminated in this order. Then, laminating process of the two-layer sheet placed on the copper foil was carried out by applying a temperature of 100° C. and a force of 100N/cm. After the laminating process, a photo mask having a pattern of line/space=100/100 µm was placed thereon. The two-layer sheet placed on the copper foil was exposed to light with the photo mask placed thereon (Light Exposure Condition: light of 400 nm was applied by 300 mJ/cm$^2$). After that, the PET film was peeled off therefrom. Then, the photosensitive film on the copper foil was developed with 1% KOH aqueous solution (at a liquid temperature of 40° C.). The photosensitive film on the copper foil was then cured at 180° C. for 2 hours. The pattern formed on the photosensitive film thus prepared was observed under a microscope. The microscopic observation showed that the pattern of line/space=100/100 µm was formed thereon.

Example 2

Into a separable flask of 2,000 ml provided with a stirring apparatus, 5.84 g (0.02 mol) of 1,3-bis[3-aminophenoxy]benzene (APB) (made by Mitsui Chemicals Corp.) as an aromatic diamine, 16.6 g (0.02 mol) of KF-8010 available from Shin-Etsu Chemical Co., Ltd. as siloxanediamine, and 200 g of DMF were poured. Then, 15.5 g (0.05 mol) of 3,3',4,4'-biphenylethertetracarboxylic dianhydride (ODPA) was quickly added therein with severe stirring. The stirring was continued for another 30 minutes thereafter.

Next, 8.4 g (0.05 mol) of 4,6-diaminoresorcinol was added into a solution thus prepared. Then, the solution was stirred for 30 minutes. After the stirring, 2,2-bis(4-hydroxyphenyl) propanedibenzoate-3,3',4,4'-tetra carboxylic dianhydride (ESDA) of 28.8 g (0.05 mol) was added to the solution. Then, the solution was stirred for 2 hours. Thereby, a polyamic acid solution was obtained, which had an Mw of 70,000.

The polyamic acid solution was transferred into a vat coated with a fluorine-based resin. The polyamic acid in the vat was heated in a vacuum oven under a reduced pressure of 5 mmHg at a temperate programmed as follows: 150° C. for 10 minutes, 160° C. for 10 minutes, 170° C. for 10 minutes, 180° C. for 10 minutes, 190° C. for 10 minutes, and then 210° C. for 30 minutes.

Then, the vat was taken out of the vacuum oven, thereby obtaining a soluble polyimide containing water-product group of 70.0 g. The silicone polyimide had an Mw of 69,000 (OH equivalent: 665).

A solution was prepared by mixing 25 g of silicone polyimide, 0.5 g (1.2 mmol) of bis(2,4,6-trimethylbenzoil)-phenylphosphineoxide, 5 g of allonix M-208 (bisphenol F EO modified (n=2) diacrylate (available from Toagosei Co., Ltd.), 20 g of ABE-30 (made by Shin-Nakamura Chemical Co., Ltd.) (bisphenol A EO modified (n≈30) diacrylate), 1.5 g of epoxy 828 (made by Yuka Shell Corp.), and an polymerization inhibitor (10 mg of methoxyphenol). The solution was applied on a PET film having a thickness of 25 µm. Then, the solution applied on the PET film was dried at 45° C. for 5 minutes. After that, the PET film was peeled off therefrom, thereby leaving a film. The film was pinned on a pin frame and then dried at 65° C. for 5 minutes.

In this way, a two-layer sheet (laminate) was obtained, which was structured as photosensitive film (38 µm in thickness)/PET (25 µm in thickness).

Then, a flexible copper-clad laminate was obtained by peeling off the PET film and then curing at 180° C. for 2 hours. Note that the flexible copper-clad laminate had a two-layer structure of copper film/photosensitive film, and had not provided with a copper circuit thereon.

It was found that a adhesion strength of the flexible copper-clad laminate was 10.8 N/cm (1.1 kg weight/cm). Moreover, it was observed that 1-minute immersion of the flexible copper-clad laminate in a solder bath at 260° C. gave no defect such as swelling and the like to the flexible copper-clad laminate.

Moreover, the copper foil was removed from the flexible copper-clad laminate by etching, thereby obtaining a cured photosensitive film (cover lay film). It was found that the cover lay film had a degree of elasticity of 1,500N/mm$^2$, extension of 15%, and a thormolysis starting temperature of 375° C.

Furthermore, an FPC was prepared as in Example 1. Then, an insulating resistance of the FPC was measured, the FPC having been subjected to 24-hour moisture conditioning carried out under the following conditions:

(1) Normal Condition: after moistening at 20° C. in 65% RH for 24 hrs:=8×10$^{15}$Ω.

(2) Moisture Condition: after moistening at 35° C. in 85% RH for 24 hrs:=3×10$^{15}$Ω.

Moreover, the two-layer sheet was placed on a copper foil so that the photosensitive film and the PET film were laminated in this order. Then, laminating process of the two-layer sheet placed on the copper foil was carried out by applying a temperature of 100° C. and a force of 100N/cm. After the laminating process, a photo mask having a pattern of line/space=100/100 µm was placed thereon. The two-layer sheet placed on the copper foil was exposed to light with the photo mask placed thereon (Light Exposure Condition: light of 400 nm was applied by 300 mJ/cm$^2$). After that, the PET film was peeled off therefrom. Then, the photosensitive film on the copper foil was developed with 1% KOH aqueous solution (at a liquid temperature of 40° C.). The photosensitive film on the copper foil was then cured at 180° C. for 2 hours. The pattern formed on the photosensitive film thus prepared was observed under a microscope. The microscopic observation showed that the pattern of line/space=100/100 µm was formed thereon.

Example 3

Into a separable flask of 2,000 ml provided with a stirring apparatus, 8.61 g (0.02 mol) of BAPS-M, and 260 g of DMF were poured in. Then, 57.65 g (0.1 mol) of ESDA was added quickly therein with a sever stirring. The stirring was continued for another 30 minutes thereafter. Then, 24.9 g (0.03 mol) of KF-8010 (made by Shin-Etsu Silicone) was added therein as a siloxanediamine. 30 minute stirring followed this addition of KF-8010. Then, 9.81 g (0.05 mol) of 2,5-diaminoterephthalic acid polyamic acid solution was obtained. The polyamic acid had an Mw of 53,000. Here, reaction was carried out under cooling with ice water.

The polyamic acid solution was transferred into a vat coated with a fluorine-based resin. The polyamic acid in the vat was heated in a vacuum oven under a reduced pressure of 5 mmHg at a temperate programmed as follows: 150° C. for 10 minutes, 160° C. for 10 minutes, 170° C. for 10 minutes, 180° C. for 10 minutes, 190° C. for 10 minutes, and then 210° C. for 30 minutes.

Then, the vat was taken out of the vacuum oven, thereby obtaining 105 g of a thermoplastic polyimide (silicone polyimide) having a carboxyl group. The polyimide had an Mw of 50,000 (COOH equivalent: 973).

Into 25 g of the silicone polyimide thus prepared, 0.3 g of 4,4'-bis(diethylamino)benzophenone, 1.0 g of BTTB (25% toluene solution; made by NOF Corp.), 20 g of ABE-30 (made by Shin-Nakamura Chemical Co., Ltd.) (bisphenol A EO modified (n≈30) diacrylate), 5 g of ABE-10 (made by Shin-Nakamura Chemical Co., Ltd.) (bisphenol A EO modified (n≈10) diacrylate), and an polymerization inhibitor (10 mg of methoxyphenol) were added. Thereby, a photosensitive resin composition in a solution (varnish) was prepared.

The photosensitive resin composition was applied on a PET film having a 251 μm thickness, and then dried at 45° C. for 5 minutes. Then, the PET film was peeled off therefrom, thereby leaving a film. The film was pinned on a pin frame and then dried at 65° C. for 5 minutes. In this way, a two-layer sheet (laminate) was obtained, which was structured as photosensitive film (60 μm in thickness)/PET (25 μm in thickness).

Then, a flexible copper-clad laminate was obtained by peeling off the PET film and then curing at 180° C. for 2 hours. Note that the flexible copper-clad laminate had a two-layer structure of copper film/photosensitive film, and had not provided with a copper circuit thereon.

It was found that a adhesion strength of the flexible copper-clad laminate was 10.0 N/cm (1.02 kg weight/cm). Moreover, it was observed that 1-minute immersion of the flexible copper-clad laminate in a solder bath at 260° C. gave no defect such as swelling and the like to the flexible copper-clad laminate.

Moreover, the copper foil was removed from the flexible copper-clad laminate by etching, thereby obtaining a cured photosensitive film (cover lay film). It was found that the cover lay film had a degree of elasticity of 1,250N/mm$^2$, extension of 25%, and a thormolysis starting temperature of 380° C.

Furthermore, an FPC was prepared in the same manner as in Example 1. Then an insulating resistance of the FPC was measured, the FPC having been subjected to 24-hour moisture conditioning carried out under the following conditions:

(1) Normal Condition: after moistening at 20° C. in 65% RH for 24 hrs:=7×10$^{15}$Ω.

(2) Moisture Condition: after moistening at 35° C. in 85% RH for 24 hrs:=1×10$^{15}$Ω.

Moreover, the two-layer sheet was placed on a copper foil so that the photosensitive film and the PET film were laminated in this order. Then, laminating process of the two-layer sheet placed on the copper foil was carried out by applying a temperature of 100° C. and a force of 100N/cm. After the laminating process, a photo mask having a pattern of line/space=100/100 μm was placed thereon. The two-layer sheet placed on the copper foil was exposed to light with the photo mask placed thereon (Light Exposure Condition: light of 400 nm was applied by 300 mJ/cm$^2$). After that, the PET film was peeled off therefrom. Then, the photosensitive film on the copper foil was developed with 1% KOH aqueous solution (at a liquid temperature of 40° C.). The photosensitive film on the copper foil was then cured at 180° C. for 2 hours. The pattern formed on the photosensitive film thus prepared was observed under a microscope. The microscopic observation showed that the pattern of line/space=100/100 μm was formed thereon.

Example 4

Example 4 was carried out in the same manner as Example 1, except that a raw material compositional ratio for a silicone polyimide in Example 4 was as follows:

That is, 17.20 g (0.04 mol) of BAPS-M; 24.9 g (0.03 mol) of siloxanediamine (KF-8010 made by Shin-Etsu Silicone), 57.65 g (0.10 mol) of ESDA, 8.6 g (0.03 mol) of bis(4-amino-3carboxy-phenyl)methane.

A polyamic acid thus prepared had an Mw of 59,000. The polyamic acid was imidized as in Example 1, thereby obtaining 104 g of a (A) soluble polyimide (COOH equivalent: 1746).

As in Example 1, a two-layer sheet (laminate) structured as photosensitive film (38 μm in thickness)/PET film (25 μm in thickness). Then, again as in Example 1, a flexible copper-clad laminate was prepared.

The flexible copper-clad laminate had a peel adhesion strength of 11.8 N/cm (1.2 kg weight/cm). Moreover, it was observed that 1-minute immersion of the flexible copper-clad laminate in a solder bath at 260° C. gave no defect such as swelling and the like to the flexible copper-clad laminate.

Moreover, the copper foil was removed from the flexible copper-clad laminate by etching, thereby obtaining a cured photosensitive film (cover lay film). It was found that the cover lay film had a degree of elasticity of 1,0000N/mm$^2$, extension of 25%, and a thormolysis starting temperature of 370° C.

Furthermore, an FPC was prepared as in Example 1, and an insulating resistance of the FPC was measured, the FPC having been subjected to 24-hour moisture conditioning carried out under the following conditions:

(1) Normal Condition: after moistening at 20° C. in 65% RH for 24 hrs:=6×10$^{15}$Ω.

(2) Moisture Condition: after moistening at 35° C. in 85% RH for 24 hrs:=2×10$^{15}$Ω.

Moreover, the two-layer sheet was placed on a copper foil so that the photosensitive film and the PET film were laminated in this order. Then, laminating process of the two-layer sheet placed on the copper foil was carried out by applying a temperature of 100° C. and a force of 100N/cm. After the laminating process, a photo mask having a pattern of line/space=100/100 μm was placed thereon. The two-layer sheet placed on the copper foil was exposed to light with the photo mask placed thereon (Light Exposure Condition: light of 400 nm was applied by 300 mJ/cm2). After that, the PET film was peeled off therefrom. Then, the photosensitive film on the copper foil was developed with 1% KOH aqueous solution (at a liquid temperature of 40° C.). The photosensitive film on the copper foil was then cured at 180° C. for 2 hours. The pattern formed on the photosensitive film thus prepared was observed under a microscope. The microscopic observation showed that the pattern of line/space=100/100 μm was formed thereon.

Comparative Example 1

Comparative Example 1 was carried out as in Example 1, except that a raw material compositional ratio for a silicone polyimide in Comparative Example 1 was as follows:

17.20 g (0.04 mol) of BAPS-M; 24.9 g (0.03 mol) of siloxanediamine (KF-8010 made by Shin-Etsu Silicone); and 57.65 g (0.10 mol) of ESDA.

A polyamic acid thus prepared had an Mw of 90,000. The polyamic acid was imidized as in Example 1, thereby obtaining a (A) soluble polyimide 95 g (COOH equivalent: infinite).

As in Example 1, a two-layer sheet (laminate) was prepared as photosensitive polyimide/PET film. Then, again as in Example 1, a flexible copper-clad laminate was prepared.

The flexible copper-clad laminate had a peel adhesion strength of 3.9N/cm (0.4 kg weight/cm). Moreover, it was observed that 1-minute immersion of the flexible copper-clad laminate in a solder bath at 260° C. gave no defect such as swelling and the like to the flexible copper-clad laminate.

Moreover, the copper foil was removed from the flexible copper-clad laminate by etching, thereby obtaining a cured photosensitive film (cover lay film). It was found that the cover lay film had a degree of elasticity of 1,000N/mm², extension of 25%, and a thormolysis starting temperature of 350° C.

Furthermore, an FPC was prepared as in Example 1, and an insulating resistance of the FPC was measured, the FPC having been subjected to 24-hour moisture conditioning carried out under the following conditions:

(1) Normal Condition: after moistening at 20° C. in 65% RH for 24 hrs:=6×10$^{15}$Ω.

(2) Moisture Condition: after moistening at 35° C. in 85% RH for 24 hrs:=3×10$^{15}$Ω.

Moreover, the two-layer sheet was placed on a copper foil so that the photosensitive film and the PET film were laminated in this order. Then, laminating process of the two-layer sheet placed on the copper foil was carried out by applying a temperature of 100° C. and a force of 100N/cm. After the laminating process, a photo mask having a pattern of line/space=100/100 μm was placed thereon. The two-layer sheet placed on the copper foil was exposed to light with the photo mask placed thereon (Light Exposure Condition: light of 400 nm was applied by 300 mJ/cm2). After that, the PET film was peeled off therefrom. Then, the photosensitive film on the copper foil was post-baked at 100° C. for 3 minutes and developed with 1% KOH aqueous solution (at a liquid temperature of 40° C.). However, no pattern was formed.

[Production of Photosensitive Film]

Unless otherwise specified, photosensitive films in Examples 5 to 28, and Comparative Examples 2 to 14 were carried out as follows.

Into a varnish prepared by dissolving (A) soluble polyimide into a mixture solvent of tetrahydrofuran (THF) and dioxolane to a 30% solid content by weight (Sc), a (B) (meth)acrylic compound, a (C) fire retardant, and a (D) photo reaction initiator were mixed, thereby obtaining a varnish of a photosensitive resin composition. The varnish of the photosensitive resin composition was applied onto a PET film (functioning as a supporting film; 25 μm in thickness) so that a film of the photosensitive resin composition would have a 25 μm thickness after dried. Then, the photosensitive resin composition on the PET film was dried at 65° C. for 5 minutes so as to remove an organic solvent. In this way, a two-layer sheet having a photosensitive film (photosensitive layer) in the B stage condition.

Next, a protect film was laminated on the two-layer sheet, thereby obtaining a three-layer sheet. As the protect film, a protect (#6221F) film (50 μm in thickness) made by Sekisui Chemical Co., Ltd. was used. The protect (#6221F) film was a PE-PE+EVA coextrusion film. The laminating of the protect film was so performed that a (PE+EVA) surface of the protect film was in contact with a photosensitive film surface. Lamination condition was as follows: roll temperature was 40° C.; and nip pressure was 1,500 Pa·m.

[Evaluation of Properties of Photosensitive Film]

Unless otherwise specified, properties of the photosensitive film in Examples 5 to 28, and Comparative Example 2 to 14 were carried out as follows.

<Soldering Heat Resistance>

Firstly, an electrolytic copper foil (35 μm) cut into a square shape of 5 cm×5 cm was soft-etched for 1 minute with a 10% sulfuric acid aqueous solution (soft etching is a step of removing an anti-rusting agent from a surface of the copper foil). After the soft-etching, the copper foil is washed with water. Then, the surface of the copper foil was washed with ethanol and acetone, and then dried. Next, a protective film was removed from a three-layer sheet that had been cut into a square shape of 4 cm×4 cm. On a glossy surface of the electrolytic copper foil (that had been soft-etched), the sheet from which the protective film had been removed was laminated, by applying a temperature of 100° C. and a force of 20,000 Pa·m, in such a manner that a photosensitive film surface thereof was on the glossy surface. Thereby, a laminate was prepared. A photosensitive film surface of the laminate was exposed to light of a wavelength of 400 nm by 300 mJ/cm², and then cured by heating the laminate at 180° C. for 2 hours. Thereby, a sample was prepared.

After (a) subjected to whether (1) Normal Condition: moistening at 20° C. in 40% RH for 24 hrs, or (2) Moisture Condition: moistening at 40° C. in 85% RH for 48 hrs, and then (b) immersed for 1 minute in melt solder having a temperature of 270° C., the sample was observed in terms of whether or not a swelling and/or peeling-off occurred in a boundary between the copper foil and the cured film. The temperature of the melt solder was elevated and the sample was dipped in the metal solder for 30 seconds every 10° C., so as to find out up to which temperature no defect occurred. A highest temperature up to which no defect occurred was determined as a 30-sec dupable temperature.

<Chemical Resistance>

A copper-clad laminate (CCL) on which a pattern circuit made of copper and having a line width/space width=250 μm/250 μm was cut into a square shape of 5 cm×5 cm. Then, onto a photosensitive film surface of a three-layer sheet (cut in a square shape of 4 cm×4 cm) from which a protective film had been peeled off, the CCL was laminated, by applying a temperature of 100° C. and a force of 20,000 Pa·m, in such a manner that the photosensitive film surface faces that surface of the CCL on which the circuit was provided. Thereby, a laminate was formed. A photosensitive film surface of the laminate thus formed was exposed to light of wavelength of 400 nm by 300 mJ/cm². Then, the laminate was cured by heating the laminate at 180° C. for 2 hours.

A sample thus prepared was immersed in each of the following chemicals for 15 minutes, the chemicals having a temperature of 25° C. Then, it was observed in terms of whether or not there is any defect on the cured film. The chemicals used for this test were: (1) isopropanol (IPA), (2) methylethylketone (MEK), (3) hydrochloric acid of 2 mol/L (2 N), (4) sulfuric acid of 1 mol/L (2 N), (5) an aqueous solution of sodium hydroxide of 2 mol/L (2 N), (6) an alternative substance for chlorofluorocarbon (new flon HFC 134a) (Product name: aeroduster ZC-31 (made by Futaba tool Corp.). Judged as "fail" were the following samples: a sample in which the photosensitive film was peeled off from the copper-clad laminate (CCL), a sample whose color was changed, and a sample in which the photosensitive film was dissolved thereby thinning the sample.

<Development Property>

A photosensitive film surface of a three-layer sheet from which a protective film had been peeled off, was laminated on a glossy surface of an electrolysis copper foil by applying a temperature of 100° C. and a force of 20,000 Pa·m. Thereby, a laminate was prepared. A photomask was placed on a supporting film of the laminate. And then, the laminate was exposed to light of wavelength of 400 nm by 300 mJ/cm$^2$. After the supporting film was peeled off therefrom, the sample was developed with 1% aqueous solution of potassium hydroxide (liquid temperature of 40° C.) by using a spray developing apparatus (Etching Machine ES-655D, made by Sunhayato Corp.). The development was carried out at a spray pressure of 0.85 Mpa, and by exposing the sample to a developer for 2 minutes. The photomask placed on the photosensitive film prior to the light exposure had a fine hole of a square shape sized 100 μm×100 μm. After the development, the sample was washed with distilled water so as to remove the developer, then dried. If observation using an optical microscope showed that the hole of the square shape sized 100 μm×100 μm was developed, it was judged that the sample was "pass".

<Flame Resistance Test>

A photosensitive film surface of a three-layer sheet from which a protective film had been peeled off, was laminated on a polyimide film (Apical AH made by Kaneka Corp.) having a 25 μm thickness. The laminating process was carried out by applying a temperature of 100° C. and a force of 75,000 Pa·m. Thereby, a laminate was formed. Next, the laminate was exposed to light of wavelength of 400 nm by 600 mJ/cm$^2$. Then, a supporting film was peeled off from the laminate. The laminate from which the supporting film had been peeled off was heated at 180° C. for 2 hours. Thereby, a laminate sample (polyimide film/cover lay film (cured photosensitive film)) was prepared.

The laminate sample was cut into a size of 1.27 cm width×12.7 cm long. 20 pieces of the cut were thus prepared. 10 of the pieces were subjected to condition (1) "at 23° C. and 50% relative humidity for 48 hours", and the other 10 of the pieces were subjected to condition (2) "at 70° C. for 168 hours". After treated as such, the pieces was cooled for 4 hours or longer, the pieces being contained in a desiccator in which anhydrous calcium chloride was placed.

The samples thus prepared were vertically held by clipping upper parts thereof by using clamps. Then, the samples were lit up by approaching, to a lower part thereof, a burner flame for 10 seconds. After 10 seconds the burner flame was moved away. Then, it was measured how long it took to extinguish a flame of the sample or inflammation of the sample. A sample was judged as "pass" if achieving both that the 10 pieces for each condition (conditions (1) and (2)) were extinguished, on average (average of 10 pieces), within 5 seconds after the burner flame was moved away from the samples, and that each of the samples was self-extinguished by extinguishing the flame or combustion within 10 seconds at maximum. A sample was judged as "fail" if any one of the pieces was not extinguished within 10 seconds, or if at least one of the pieces was so combusted that the flame went up to the upper part thereof where the clamp was.

<Flexibility>

A photosensitive film surface of a three-layer sheet from which a protective film had been peeled off, was laminated on a polyimide film (Apical AH made by Kaneka Corp.) having a 25 μm thickness. The laminating process was carried out by applying a temperature of 100° C. and a force of 75,000 Pa·m. Thereby, a laminate was formed. Next, the laminate was exposed to light of wavelength of 400 nm by 300 mJ/cm$^2$. Then, a supporting film was peeled off from the laminate. The laminate from which the supporting film had been peeled off was heated at 180° C. for 2 hours thereby being cured. Thereby, a laminate sample (polyimide film/cover lay film (cured photosensitive film)) was prepared.

The laminate sample was cut into a size of 2 cm×10 cm.

Samples thus prepared were tested (1) by bending them by 180° with a photosensitive film surface facing outward, or (2) by bending them by 180° with a cover lay film surface facing inward. A sample was judged as "pass" when the sample had no defect, such as cracking on a cured film, after bending of either way. If any defect occurred in the sample after bending of at least one of the ways, it was judged that the sample was "fail".

Example 5

<Synthesis of (A) Soluble Polyimide>

Into a 500 ml separable flask provided with a stirring apparatus, 17.3 g (0.03 mol) of (2,2'-bis(4-hydorxyphenyl) propanedibenzoate)-3,3',4,4'-tetracarboxylic anhydride (ESDA), 30 g of N,N'-dimethylformamide (DMF) were poured, and stirred with the stirring apparatus until being dissolved. Next, a solution thus prepared, a solution in which 5.15 g (0.018 mol) of [bis(4-amino-3-carboxy)phenyl]methane (MBAA) made by Wakayama Seika Kogyo Ltd. was dissolved in 9 g of DMF was added. After that, the solution was stirred vigorously.

To the solution that had been mixed thoroughly, 7.47 g (0.009 mol) of KF-8010 (made by Shin-Etsu Silicone) was further added, and then the solution was vigorous stirred. After the solution was mixed thoroughly, 1.29 g (0.003 mol) of bis[4-(3-aminophenoxy)phenyl]sulfone (BAPS-M) was added finally. Then, the solution was stirred for 1 hour vigorously.

A polyamide solution thus prepared was transferred into a vat coated with a fluorine-based resin. The polyamide solution in the vat was vacuum-dried at 200° C. for 2 hours under a pressure of 660 Pa by using a vacuum oven. Thereby, 26.40 g of a polyimide was synthesized. 50 g of the polyimide was dissolved into 100 g of tetrahydrofuran (at 20° C.). Because 50 g or more was dissolved, the polyimide was employable as a soluble polyimide of the present invention.

<Preparation of Photosensitive Film>

15 g of the soluble polyimide was dissolved into 50 g of dioxolane, thereby preparing a varnish of a soluble polyimide having a solid content % by weight (Sc) of 30%.

Into 80 g of a varnish of the soluble polyimide, the following components were mixed in the following amounts, thereby obtaining a varnish of a photosensitive resin composition.

| | |
|---|---|
| The soluble polyimide (by solid content by weight): | 60 parts by weight, |
| Bisphenol A EO modified (m + n ≈ 30) diacrylate (NK ester A-BPE-30 made by Shin-Nakamura Chemical Co., Ltd.): (where m and n are recurring units of ethyleneoxide modified sites. Hereinafter, m and n mean the same in the following Examples and Comparative Examples), | 10 parts by weight |
| Tribromophenylacrylate (BR-31 made by Dai-Ichi Kogyo Seiyaku Co., Ltd.): | 30 parts by weight, |
| Bis (2,4,6-trimethylbenzoil)phenylphosphineoxide (irgacure 819 made by Ciba Specialty Chemicals K.K.): | 1 part by weight, |

The varnish of the photosensitive resin composition was applied to a PET film (having a 25 μm thickness; acting as a supporting film), so that a film of the varnish would be 25 μm in thickness after dried. Then, the varnish applied on the PET film was subjected to a temperature of 65° C. for 5 minutes so as to remove an organic solvent therefrom. Thereby, a two-layer sheet consistent of a photosensitive film and the PET film (supporting film) was prepared.

<Preparation of Laminate>

After that, a PE-PE+EVA co extruded film (protect (#6221F) film made by Sekisui Chemical Co., Ltd. (having a thickness of 50 μm)) was laminated, as a protective film, on the two-layer sheet in such a manner that a (PE+EVA) copolymerization film surface was in contact with a photosensitive film surface. Thereby, a three-layer sheet (laminate) structured as a supporting film/photosensitive cover lay film/protective film. Laminating process was carried out at a roll temperature of 40° C. and a nip pressure of 1,500 Pa·m.

<Evaluation Result of Laminate>

Soldering heat resistance test of the laminate showed that the laminate got a "pass" until 360° C. under the Normal Condition, and until 350° C. under the Moisture Condition.

Chemical resistance test of the laminate showed that the laminate was resistant against all of the chemicals (1) to (6), and thus "pass" for all of the chemicals (1) to (6).

Development test of the laminate showed that a hole of a square shape sized 100 μm×100 μm was developed successfully, and the laminate got a "pass".

Example 6

<Synthesis of Modified Polyimide>20.5 g (0.020 mol) of the polyimide synthesized in Example 5 was dissolved in 80 g of dioxolane. Then, 0.03 g of 4-methoxy phenol was added therein, and dissolved by moderately heating by using an oil bath of 60° C. Into the solution, a solution prepared by dissolving 3.75 g (0.0264 mol) of glycidyl methacylate in 5 g of dioxolane was added. Further, 0.01 g of triethylamine was added as a catalyst in the solution. Then, the solution was stirred at 60° C. for 6 hours. Thereby a modified polyimide was synthesized.

<Preparation of Photosensitive Film>

The following components in the following amounts were added therein, thereby obtaining a photosensitive resin composition. Then, a three-layer sheet (laminate) was prepared in the same fashion as above.

| | |
|---|---|
| The modified polyimide (by solid content by weight): | 50 parts by weight, |
| Bisphenol A EO modified (m + n ≈ 30) diacrylate (NK ester A-BPE-30 made by Shin-Nakamura Chemical Co., Ltd.): | 5 parts by weight, |
| Bisphenol F EO modified (m + n ≈ 4) diacrylate (allonix M-208 made by Toagosei Co., Ltd.): | 15 parts by weight, |
| Tribromophenylacrylate (BR-31 made by Dai-Ichi Kogyo Seiyaku Co., Ltd.): | 30 parts by weight, |
| 4,4'-bis(diethylamino)benzophenone: | 1 part by weight, |
| 3,3',4,4',-tetra(t-butylperoxycarbonyl) benzophenone: | 1 part by weight. |

<Evaluation Result of Laminate>

Soldering heat resistance test of the laminate showed that the laminate got a "pass" until 360° C. under the Normal Condition, and until 350° C. under the Moisture Condition.

Chemical resistance test of the laminate showed that the laminate was resistant against all of the chemicals (1) to (6), and thus "pass" for all of the chemicals (1) to (6).

Development test of the laminate showed that a hole of a square shape sized 100 μm×100 μm was developed successfully, and the laminate got a "pass".

Example 7

As raw materials of a polyimide, 3,3',4,4'-biphenylethertetracarboxylic anhydride (ODPA) was used. As diamines, BAPS-M, MBAA, and KF-8010 mentioned above were used. As solvent, N,N'-dimethylformamide(DMF) and dioxolane were used.

<Synthesis of Polyimide>

Into a 500 ml separable flask provided with a stirring apparatus, 9.31 g (0.03 mol) of ODPA, and 30 g of DMF were poured, and dissolved with stirring by using the stirring apparatus. Next, into the solution thus prepared, a solution prepared by dissolving 4.29 g (0.015 mol) of MBAA in 10 g of DMF was added as a diamine. Then, the solution was vigorously stirred. After the solution was thoroughly mixed, 7.47 g (0.009 mol) of KF-8010 (made by Shin-Etsu Silicone) was added as siloxanediamine. Then, the solution was vigorously stirred. After the solution was thoroughly mixed, 2.58 g (0.006 mol) of BAPS-M was finally added. Then, the solution was vigorously stirred for 1 hour.

A polyamide solution thus prepared was transferred into a vat coated with a fluorine-based resin. The polyamide solution in the vat was vacuum-dried at 200° C. for 2 hours under a pressure of 660 Pa by using a vacuum oven. Thereby, 21.28 g of a polyimide was synthesized.

50 g or more of the polyimide was dissolved into 100 g of tetrahydrofuran at 20° C. Because 50 g or more was dissolved, the polyimide was a soluble polyimide defined in the present invention.

<Preparation of Photosensitive Film>

21 g of the soluble polyimide was dissolved into 49 g of dioxolane, thereby preparing a varnish of a soluble polyimide having a solid content % by weight (Sc) of 30%.

Into 73 g of a varnish of the soluble polyimide, the following components were mixed in the following amounts, thereby obtaining a varnish of a photosensitive resin composition.

| | |
|---|---|
| The soluble polyimide (by solid content by weight): | 55 parts by weight. |
| Bisphenol A EO modified (m + n ≈ 30) diacrylate (NK ester A-BPE-30 made by Shin-Nakamura Chemical Co., Ltd.): | 10 parts by weight, |
| Bisphenol F EO modified (m + n ≈ 4) diacrylate | 20 parts |

| | |
|---|---|
| (allonix M-208 made by Toagosei Co., Ltd.): | by weight, |
| Siloxane compound (XC99-B5664 made by Toshiba silicones): | 15 parts by weight, |
| 4,4'-bis(diethylamino)benzophenone: | 1 part by weight, |
| 3,3',4,4',-tetra(t-butylperoxycarbonyl) benzophenone: | 1 part by weight. |

<Evaluation Result of Photosensitive Film>

A photosensitive film (laminate) was prepared from the photosensitive resin composition in the same fashion as above. Soldering heat resistance test of the photosensitive film showed that the laminate got a "pass" until 360° C. under the Normal. Condition, and until 330° C. under the Moisture Condition.

Chemical resistance test of the photosensitive film showed that the laminate was resistant against all of the chemicals (1) to (6), and thus "pass" for all of the chemicals (1) to (6).

Development test of the photosensitive film showed that a hole of a square shape sized 100 μm×100 μm was developed successfully, and the photosensitive film got a "pass".

Example 8

As a raw material of a polyimide, 3,3',4,4'-biphenylsulphonetetracarboxylic anhydride (DSDA) was used. As diamines, BAPS-M, MBAA, and KF-8010 mentioned above were used. As solvent, N,N'-dimethylformamide(DMF) and dioxolane were used.

<Synthesis of Polyimide>

Into a 500 ml separable flask provided with a stirring apparatus, 10.75 g (0.030 mol) of DSPA, and 30 g of DMF were poured, and dissolved with stirring by using the stirring apparatus. Next, into the solution thus prepared, a solution prepared by dissolving 4.29 g (0.015 mol) of MBAA, made by Wakayama Seika Kogyo Ltd., in 10 g of DMF was added. Then, the solution was vigorously stirred. After the solution was thoroughly mixed, 7.47 g (0.009 mol) of KF-8010 (made by Shin-Etsu Silicone) was added as siloxanediamine. Then, the solution was vigorously stirred. After the solution was thoroughly mixed, 2.58 g (0.006 mol) of BAPS-M was finally added. Then, the solution was vigorously stirred for 1 hour. A polyamide solution thus prepared was transferred into a vat coated with a fluorine-based resin. The polyamide solution in the vat was vacuum-dried at 200° C. for 2 hours under a pressure of 660 Pa by using a vacuum oven. Thereby, 22.57 g of a polyimide was synthesized. 50 g or more of the polyimide was dissolved into 100 g of tetrahydrofuran at 20° C. Because 50 g or more was dissolved, the polyimide was a soluble polyimide defined in the present invention.

<Preparation of Photosensitive Film>

21 g of the soluble polyimide was dissolved into 49 g of dioxolane, thereby preparing a varnish of a soluble polyimide having a solid content % by weight (Sc) of 30%.

Into 53 g of a varnish of the soluble polyimide, the following components were mixed in the following amounts, thereby obtaining a varnish of a photosensitive resin composition.

| | |
|---|---|
| The soluble polyimide (by solid content by weight): | 40 parts by weight, |
| Bisphenol A EO modified (m + n ≈ 30) diacrylate (NK ester A-BPE-30 made by Shin-Nakamura Chemical Co., Ltd.): | 5 parts by weight, |
| Bisphenol F EO modified (m + n ≈ 4) diacrylate (allonix M-208 made by Toagosei Co., Ltd.): | 30 parts by weight, |
| Tribromophenylacrylate (BR-31 made by Dai-Ichi Kogyo Seiyaku Co., Ltd.): | 25 parts by weight, |
| 4,4'-bis(diethylamino)benzophenone: | 1 part by weight, |
| 3,3',4,4'-tetra(t-butylperoxycarbonyl)benzophenone: | 1 part by weight. |

<Evaluation Result of Photosensitive Film>

A photosensitive film (laminate) was prepared from the photosensitive resin composition in the same fashion as above. Soldering heat resistance test of the photosensitive film showed that the laminate got a "pass" until 350° C. under the Normal Condition, and until 340° C. under the Moisture Condition.

Chemical resistance test of the photosensitive film showed that the laminate was resistant against all of the chemicals (1) to (6), and thus "pass" for all of the chemicals (1) to (6). Development test of the photosensitive film showed that a hole of a square shape sized 100 μm×100 μm was developed successfully, and the photosensitive film got a "pass".

Example 9

As raw materials of a polyimide, 4,4'-(4,4'-isopropylidenediphenoxy)bisphthalic anhydride (BSAA), and 3.3°, 4,4'-biphenyltetracarboxilic dianhydride (s-BPDA) were used. As diamines, BAPS-M, MBAA, and KF-8010 mentioned above were used. As solvent, N,N'-dimethylformamide (DMF) and dioxolane were used.

<Synthesis of Polyimide>

Into a 500 ml separable flask provided with a stirring apparatus, 26.02 g (0.050 mol) of BSAA, and 30 g of DMF were poured, and dissolved with stirring by using the stirring apparatus. After dissolved, into the solution thus prepared, a solution prepared by dissolving 14.71 g (0.050 mol) of s-BPDA and 20 g of DMF were added. Then, the solution was further stirred vigorously. Then, into the solution thus prepared, a solution prepared by dissolving 14.30 g (0.050 mol) of MBAA, made by Wakayama Seika Kogyo Ltd., in 30 g of DMF was added. Then, the solution was vigorously stirred. After the solution was thoroughly mixed, 24.90 g (0.030 mol) of KF-8010 (made by Shin-Etsu Silicone) was added as siloxanediamine. Then, the solution was vigorously stirred. After the solution was thoroughly mixed, 8.61 g (0.020 mol) of BAPS-M was finally added. Then, the solution was vigorously stirred for 1 hour. A polyamide solution thus prepared was transferred into a vat coated with a fluorine-based resin. The polyamide solution in the vat was vacuum-dried at 200° C. for 2 hours under a pressure of 660 Pa by using a vacuum oven. Thereby, 80.0 g of a polyimide was synthesized.

50 g or more of the polyimide was dissolved into 100 g of tetrahydrofuran at 20° C. Because 50 g or more was dissolved, the polyimide was a soluble polyimide defined in the present invention.

<Preparation of Photosensitive Film>

21 g of the soluble polyimide was dissolved into 49 g of dioxolane, thereby preparing a varnish of a soluble polyimide having a solid content % by weight (Sc) of 30%.

A photosensitive resin composition was prepared by mixing the same components in the same way as in Example 8, except that a polyimide (a copolymer of two kinds of acid dianhydrides) thus synthesized by the above mentioned method was used instead of the polyimide of Example 8. Then, a photosensitive film (laminate) was prepared by the method mentioned above.

<Evaluation Result of Photosensitive Film>

Soldering heat resistance test of the photosensitive film showed that the laminate got a "pass" until 340° C. under the Normal Condition, and until 330° C. under the Moisture Condition.

Chemical resistance test of the photosensitive film showed that the laminate was resistant against all of the chemicals (1) to (6), and thus "pass" for all of the chemicals (1) to (6). Development test of the photosensitive film showed that a hole of a square shape sized 100 μm×100 μm was developed successfully, and the photosensitive film got a "pass".

Example 10

As raw materials of a polyimide, BSAA, s-BPDA, BAPS-M, KF-8010, and 2,2'-bis(3-amino-4-hydroxyphenyl) hexafluoropropane were used. As solvent, N,N'-dimethylformamide (DMF) and dioxolane were used.

<Synthesis of Polyimide>

Into a 500 ml separable flask provided with a stirring apparatus, 26.02 g (0.050 mol) of BSAA, and 30 g of DMF were poured, and dissolved with stirring by using the stirring apparatus. After dissolved, into the solution thus prepared, a solution prepared by dissolving 14.71 g (0.050 mol) of s-BPDA in 20 g of DMF was added. Then, the solution was vigorously stirred. Into the solution that had been thoroughly mixed, a solution prepared by dissolving 18.31 g (0.050 mol) of diamine (2,2'-bis(3-amino-4-hydroxyphenyl) hexafluoropropane) in 30 g of DMF was added. Then, the solution was vigorously stirred. When the solution was thoroughly mixed, 24.90 g (0.030 mol) of KF-8010 (made by Shin-Etsu Silicone) was added as siloxanediamine. Then, the solution was vigorously stirred. After the solution was thoroughly mixed, 8.61 g (0.020 mol) of BAPS-M was finally added. Then, the solution was vigorously stirred for 1 hour. A polyamide solution thus prepared was transferred into a vat coated with a fluorine-based resin. The polyamide solution in the vat was vacuum-dried at 200° C. for 2 hours under a pressure of 660 Pa by using a vacuum oven. Thereby, 83.5 g of a polyimide was synthesized.

50 g or more of the polyimide was dissolved into 100 g of tetrahydrofuran at 20° C. Because 50 g or more was dissolved, the polyimide was a soluble polyimide defined in the present invention.

<Preparation of Photosensitive Film>

30 g of the soluble polyimide was dissolved into 70 g of dioxolane, thereby preparing a varnish of a soluble polyimide having a solid content % by weight (Sc) of 30%.

A photosensitive resin composition was prepared by mixing the same components in the same way as in Example 8, except that a polyimide thus synthesized by the above mentioned method was used instead of the polyimide of Example 8. Then, a photosensitive film (laminate) was prepared by the method mentioned above.

<Evaluation Result of Photosensitive Film>

Soldering heat resistance test of the photosensitive film showed that the laminate got a "pass" until 350° C. both under the Normal Condition, and under the Moisture Condition.

Chemical resistance test of the photosensitive film showed that the laminate was resistant against all of the chemicals (1) to (6), and thus "pass" for all of the chemicals (1) to (6). Development test of the photosensitive film showed that a hole of a square shape sized 100 μm×100 μm was developed successfully, and the photosensitive film got a "pass".

Comparative Example 2

A photosensitive resin composition was prepared by mixing the following components in the following amounts. Then, a photosensitive film (laminate) was prepared in the above-mentioned method.

| | |
|---|---|
| A copolymer synthesized by copolymerizing methylmethacrylate, n-butylmethacrylate, 2-ethylhexylacrylate, and methacrylic acid, in a copolymerization ratio (by weight) of 55:8:15:22: | 50 parts by weight, |
| Bisphenol A EO modified (m + n ≈ 30) diacrylate (NK ester A-BPE-30 made by Shin-Nakamura Chemical Co., Ltd.): | 10 parts by weight, |
| Bisphenol F EO modified (m + n ≈ 4) diacrylate (allonix M-208 made by Toagosei Co., Ltd.): | 10 parts by weight, |
| Tribromophenylacrylate (BR-31 made by Dai-Ichi Kogyo Seiyaku Co., Ltd.): | 30 parts by weight, |
| Bis(2,4,6-trimethylbenzoil)phenylphosphineoxide (irgacure 819 made by Ciba Specialty Chemicals K.K.): | 1 part by weight. |

Soldering heat resistance test of the photosensitive film got a "pass" until 280° C. under the Normal Condition, and until 250° C. under the Moisture Condition. Thus, the photosensitive film was poor in the heat resistance.

Moreover, as to chemical resistance test, the photosensitive film got a "pass" for (3) hydrochloric acid of 2 mol/L and (4) sulfuric acid of 1 mol/L. However, the photosensitive film was swollen when immersed in (1) isopropanol (IPA) and (2) methylethylketone (MEK). When immersed in (5) aqueous solution of sodium hydroxide of 2 mol/L, the photosensitive film was dissolved, thereby reducing its thickness by 40% or more. Thus, the photosensitive film got a "fail" for those chemicals. In development. Development test of the laminate showed that a hole of a square shape sized 100 μm×100 μm was developed successfully, and the photosensitive film got a "pass".

As described above, the photosensitive film prepared from the copolymer that is not a polyimide was poor in the heat resistance and the chemical resistance.

Comparative Example 3

A photosensitive resin composition was prepared by mixing the following components in the following amounts. Then, a photosensitive film (laminate) was prepared in the above-mentioned method.

| | |
|---|---|
| A copolymer synthesized by copolymerizing methylmethacrylate, n-butylmethacrylate, 2-ethylhexylacrylate, and methacrylic acid, in a copolymerization ratio (by weight) of 55:8:15:22: | 60 parts by weight, |
| Bisphenol F EO modified (m + n ≈ 4) diacrylate (allonix M-208 made by Toagosei Co., Ltd.): | 15 parts by weight, |
| Epoxy resin (epicoat 828 made by Toagosei Co., Ltd.): | 5 parts by weight, |
| tribromophenylacrylate (BR-31 made by Dai-Ichi Kogyo Seiyaku Co., Ltd.): | 15 parts by weight, |
| Bis(2,4,6-trimethylbenzoil)phenylphosphineoxide (irgacure 819 made by Ciba Specialty Chemicals K.K.): | 1 part by weight. |

Soldering heat resistance test of the photosensitive film got a "pass" until 310° C. under the Normal Condition, and until 280° C. under the Moisture Condition. Thus, the photosensitive film was poor in the heat resistance.

Moreover, as to chemical resistance test, the photosensitive film got a "pass" for (3) hydrochloric acid of 2 mol/L and (4) sulfuric acid of 1 mol/L. However, the photosensitive film was peeled off when immersed in (1) isopropanol (IPA). The photosensitive film was swollen when immersed in (2) methylethylketone (MEK). When immersed in (5) aqueous solution of sodium hydroxide of 2 mol/L, the photosensitive film was dissolved, thereby reducing its thickness by 40% or more. Thus, the photosensitive film got a "fail" for those chemicals. In developing. Development test of the laminate showed that a hole of a square shape sized 100 μm×100 μm was developed successfully, and the photosensitive film got a "pass".

As described above, the photosensitive film prepared from a copolymer that is not a polyimide was poor in the heat resistance and the chemical resistance.

Example 11

As raw materials of a polyimide, BAPS-M, MBAA, KF-8010 were used. As solvent, N,N'-dimethylformamide (DMF) and dioxolane were used.

<Synthesis of Polyimide>

Into a 500 ml separable flask provided with a stirring apparatus, 17.3 g (0.030 mol) of ESDA, and 30 g of DMF were poured, and dissolved with stirring by using the stirring apparatus. After dissolved, into the solution thus prepared, a solution prepared by dissolving 5.15 g (0.018 mol) of diamine MBAA (made by Wakayama Seika Kogyo Ltd.) in 9 g of DMF was added. Then, the solution was vigorously stirred. When the solution was thoroughly mixed, 7.47 g (0.009 mol) of KF-8010 (made by Shin-Etsu Silicone) was added as siloxanediamine. Then, the solution was vigorously stirred. After the solution was thoroughly mixed, 1.29 g (0.003 mol) of BAPS-M was finally added. Then, the solution was vigorously stirred for 1 hour. A polyamide solution thus prepared was transferred into a vat coated with a fluorine-based resin. The polyamide solution in the vat was vacuum-dried at 200° C. for 2 hours under a pressure of 660 Pa by using a vacuum oven. Thereby, 26.40 g of a soluble polyimide was obtained.

50 g or more of the polyimide was dissolved into 100 g of tetrahydrofuran (at 20° C.). Because 50 g or more was dissolved, the polyimide came under a soluble polyimide defined in the present invention.

<Production of Laminate>

15 g of the soluble polyimide was dissolved into 35 g of dioxolane, thereby preparing a varnish of a solid content % by weight (Sc) of 30%.

A photosensitive resin composition was prepared by mixing the following components in the following amounts. Then, the photosensitive resin composition was applied on a PET film in the method mentioned above, thereby obtaining a photosensitive film in the B stage condition. Further, a protective film was laminated on the photosensitive film, thereby obtaining a three-layer sheet (laminate) of PET film/photosensitive film/protective film.

| | |
|---|---|
| The soluble polyimide (by solid content by weight) | 50 parts by weight, |
| Imidoacrylate (allonix TO-1429, made by Toagosei Co., Ltd.) represented by the following formula (119) | 40 parts by weight: |

(119)

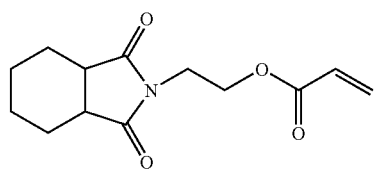

| -continued | |
|---|---|
| Bisphenol A EO modified (recurring units of ethyleneoxide modified sites; m + n ≈ 4) diacrylate (allonix M-211B, made by Toagosei Co., Ltd.): | 10 parts by weight, |
| Bis(2,4,6-trimethylbenzoil)phenylphosphineoxide (irgacure 819 made by Ciba Specialty Chemicals K.K.): | 1 part by weight. |

The photosensitive film had a compression-bondable temperature of 120° C. with respect to a polyimide film and a glossy surface of a copper foil. Soldering heat resistance test of the photosensitive film showed that the photosensitive film got a "pass" until 370° C. under the Normal Condition, and until 360° C. under the Moisture Condition. Moreover, flame resistance test of the photosensitive film showed that the photosensitive film was extinguished in 4.5 seconds on average and got a "pass". Further, flexibility test of the photosensitive film showed that no crack was caused in the photosensitive film, thus the photosensitive film got a "pass". Development test of the photosensitive film showed that a hole of a square shape sized 100 μm×100 μm was developed successfully, and the photosensitive film got a "pass".

Example 12

<Synthesis of Modified Polyimide>

20.8 g (0.020 mol) of the polyimide synthesized in Example 11 was dissolved in 80 g of dioxolane. Then, 0.030 g of 4-methoxyphenol was added therein, and dissolved by moderately heating by using an oil bath of 60° C. Into a solution thus prepared, a solution thus prepared by dissolving 3.75 g (0.0264 mol) of glycidyl methacrylate in 5 g of dioxolane. Further, 0.01 g of triethylamine was added therein as a catalyst. Then, a solution thus prepared was heated at 60° C. for 6 hours with stirring. Thereby, a modified polyimide was synthesized.

<Preparation of Photosensitive Film>

A photosensitive resin composition was prepared by mixing the following components in the following amounts. Then, a three-layer sheet (laminate) was prepared in the above-mentioned method.

| | |
|---|---|
| The modified polyimide (by solid content by weight): | 60 parts by weight, |
| Imideacrylate (allonix TO-1429, made by Toagosei Co., Ltd.): | 20 parts by weight, |
| Bisphenol A EO modified (recurring units of ethyleneoxide modified sites; m + n ≈ 30) diacrylate (NK ester A-BPE-30, made by Shin-Nakamura Chemical Co., Ltd.): | 10 parts by weight, |
| Bis(2,4,6-trimethylbenzoil)phenylphosphineoxide (irgacure 819 made by Ciba Specialty Chemicals K.K.): | 1 part by weight, |
| Bis(2-vinylphenoxy) phosphazen (polymerization degree of 3): | 10 parts by weight. |

The photosensitive film had a compression-bondable temperature of 100° C. with respect to a polyimide film and a glossy surface of a copper foil. Soldering heat resistance test of the photosensitive film showed that the photosensitive film got a "pass" until 360° C. under the Normal Condition, and until 350° C. under the Moisture Condition. Moreover, flame resistance test of the photosensitive film showed that the photosensitive film was extinguished in 4.0 seconds on average and got a "pass". Further, flexibility test of the photosensitive film showed that utterly no crack was caused in the photosensitive film, thus the photosensitive film got a "pass". Development test of the photosensitive film showed that a hole of a square shape sized 100 μm×100 μm was developed successfully, and the photosensitive film got a "pass".

Example 13

As a raw material of a polyimide, 3,3',4,4'-biphenylethertetracarboxylic anhydride (ODPA) was used. As diamines, BAPS-M, MBAA, And KF-8010 mentioned above were used. As solvents, N,N'-dimethylformamide (DMF) and dioxolane were used.

<Synthesis of Polyimide>

Into a 500 ml separable flask provided with a stirring apparatus, 9.31 g (0.030 mol) of ODPA, and 30 g of DMF were poured, and dissolved with stirring by using the stirring apparatus. After dissolved, into the solution thus prepared, a solution prepared by dissolving 4.29 g (0.015 mol) of diamine MBAA (made by Wakayama Seika Kogyo Ltd.) in 10 g of DMF was added. Then, the solution was vigorously stirred. When the solution was thoroughly mixed, 7.47 g (0.009 mol) of KF-8010 (made by Shin-Etsu Silicone) was added as siloxanediamine. Then, the solution was vigorously stirred. After the solution was thoroughly mixed, 2.58 g (0.006 mol) of BAPS-M was finally added. Then, the solution was vigorously stirred for 1 hour. A polyamide solution thus prepared was transferred into a vat coated with a fluorine-based resin. The polyamide solution in the vat was vacuum-dried at 200° C. for 2 hours under a pressure of 660 Pa by using a vacuum oven. Thereby, 21.28 g of a soluble polyimide was obtained.

50 g or more of the polyimide was dissolved into 10 g of tetrahydrofuran (at 20° C.). Because 50 g or more was dissolved, the polyimide came under a soluble polyimide defined in the present invention.

<Preparation of Photosensitive Film>

21 g of the soluble polyimide was dissolved into 49 g of dioxolane, thereby preparing a varnish of a solid content % by weight (Sc) of 30%.

A photosensitive resin composition was prepared by mixing the following components in the following amounts. Then, a photosensitive film was prepared by the method described above.

| | |
|---|---|
| The soluble polyimide (by solid content by weight): | 40 parts by weight, |
| Imidoacrylate (allonix TO-1429, made by Toagosei Co., Ltd.): | 30 parts by weight, |
| Bisphenol A EO modified (m + n ≈ 4) diacrylate (allonix M-211B, made by Toagosei Co., Ltd.): | 10 parts by weight, |
| Bis(2,4,6-trimethylbenzoil)phenylphosphineoxide (irgacure 819 made by Ciba Specialty Chemicals K.K.): | 1 part by weight, |
| EO modified tribromophenylacrylate (BR-31, made by Dai-Ichi Kogyo Seiyaku Co., Ltd.): | 20 parts by weight. | by Dai-Ichi Kogoyo Seiyaku Co., Ltd.): 20 parts by weight.

The photosensitive film had a compression-bondable temperature of 90° C. with respect to a polyimide film and a glossy surface of a copper foil. Soldering heat resistance test of the photosensitive film showed that the photosensitive film got a "pass" until 360° C. under the Normal Condition, and until 350° C. under the Moisture Condition. Moreover, flame resistance test of the photosensitive film showed that the photosensitive film was extinguished in 2.0 seconds on average and got a "pass". Further, flexibility test of the photosensitive film showed that utterly no crack was caused in the photosensitive film, thus the photosensitive film got a "pass". Development test of the photosensitive film showed that a hole of a square shape sized 100 μm×100 μm was developed successfully, and the photosensitive film got a "pass".

Example 14

<Synthesis of N-(Acryloyloxy)-4-methyl Hexahydrophthalimide>

16 ml (0.26 mol) of hydroxylamine (50% aqueous solution thereof) was poured into a 100 ml flask. Then, 33.4 g (0.2 mol) of 4-methylhexahydrophthalic anhydride was dropped in at a room temperature with stirring. After the dropping, a solution thus prepared was gradually heated and reacted for 1 hour at 100° C. After the reaction, a hydrochloric acid aqueous solution of 4 mol/L (4 N) was added into a reaction liquid, thereby acidifying the reaction liquid.

A target substance was extracted from thus prepared reaction mixture by using chloroform, and an organic layer was separated. The organic layer was dried with anhydrous magnesium sulfate. Then, chloroform was separated from the reaction mixture, thereby obtaining 32.4 g (yield 89%) of N-hydroxy-4-methylhexahydrophthalimide (a viscous liquid of transparent and colorless).

Next, 10.07 g (0.055 mol) of N-hydroxy-4-methylhexahydrophthalimide, 15 ml (0.11 mol) of triethylamine, and 50 ml of 1,2-dichloroethane were poured in a 100 ml flask. Then, 7.2 ml (0.090 mol) of acrylyl chloride was slowly dropped therein at a room temperature under nitrogen with stirring. After the dropping, a mixture thus prepared was reacted for one hour at a room temperature. A reaction mixture was washed with water so as to separate an organic layer therefrom. Then, the organic layer was washed with a 5% sodium hydrogen carbonate aqueous solution. The organic layer separated from the 5% sodium hydrogen carbonate aqueous solution was dried with magnesium sulfate, and then a solvent was removed from the organic layer. 11.8 g of N-(acryloyloxy)-4-methylhexahydrophthalimide (viscous liquid of dark yellow color) was thereby obtained. N-(acryloyloxy)-4-methylhexahydrophthalimide is represented by the following formula (120):

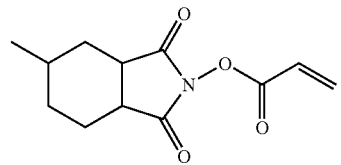

(120)

<Preparation of Photosensitive Film>

A photosensitive resin composition was prepared by mixing the same component in the same manner as in Example 12, except that N-(acryloyloxy)-4-methylhexahydrophthalimide thus synthesized above was used as an imide acrylate. Then, a photosensitive film was prepared in the fashion mentioned above.

The photosensitive film had a compression-bondable temperature of 100° C. with respect to a polyimide film and a glossy surface of a copper foil. Soldering heat resistance test of the photosensitive film showed that the photosensitive film got a "pass" until 360° C. under the Normal Condition, and until 350° C. under the Moisture Condition. Moreover, flame resistance test of the photosensitive film showed that the photosensitive film was extinguished in 2.8 seconds on average and got a "pass". Further, flexibility test of the photosensitive film showed that utterly no crack was caused in the photosensitive film, thus the photosensitive film got a "pass". Development test of the photosensitive film showed that a hole of a square shape sized 100 μm×100 μm was developed successfully, and the photosensitive film got a "pass".

Example 15

As a raw material of a polyimide, 3,3',4,4'-biphenylsulfonetetracarboxylic anhydride (DSDA) was used. As diamines, BAPS-M and MBAA were used. As solvents, N,N'-dimethylformamide (DMF) and dioxolane.

<Synthesis of Polyimide>

Into a 500 ml separable flask provided with a stirring apparatus, 10.75 g (0.030 mol) of DSDA, and 30 g of DMF were poured, and dissolved with stirring by using the stirring apparatus. After dissolved, into the solution thus prepared, a solution prepared by dissolving 4.29 g (0.015 mol) of diamine MBAA (made by Wakayama Seika Kogyo Ltd.) in 10 g of DMF was added. Then, the solution was vigorously stirred. When the solution was thoroughly mixed, 7.47 g (0.009 mol) of KF-8010 (made by Shin-Etsu Silicone) was added as siloxanediamine. Then, the solution was vigorously stirred. After the solution was thoroughly mixed, 2.58 g (0.006 mol) of BAPS-M was finally added. Then, the solution was vigorously stirred for 1 hour. A polyamide solution thus prepared was transferred into a vat coated with a fluorine-based resin. The polyamide solution in the vat was vacuum-dried at 200° C. for 2 hours under a pressure of 660 Pa by using a vacuum oven. Thereby, 22.57 g of a soluble polyimide was obtained.

50 g or more of the polyimide was dissolved into 100 g of tetrahydrofuran (at 20° C.). Because 50 g or more was dissolved, the polyimide was employable as a soluble polyimide of the present invention.

<Preparation of Photosensitive Film>

21 g of the soluble polyimide was dissolved into 49 g of dioxolane, thereby preparing a varnish of a soluble polyimide having a solid content % by weight (Sc) of 30%.

By adding the following components in the following amount, a photosensitive resin composition was prepared. Then, a photosensitive film was prepared by the method mentioned above.

| | |
|---|---|
| The soluble polyimide (by solid content by weight): | 40 parts by weight, |
| N-(acryloyloxy)-4-methylhexahydrophthalimide: | 10 parts by weight, |
| Bisphenol A EO modified (m + n ≈ 4) diacrylate (allonix M-211B, made by Toagosei Co., Ltd.): | 10 parts by weight, |
| Bis (2,4,6-trimethylbenzoil)phenylphosphineoxide (irgacure 819 made by Ciba Specialty Chemicals K.K.): | 1 part by weight, |
| EO modified tribromophenylacrylate (BR-31, made by Dai-Ichi Kogyo Seiyaku Co., Ltd.): | 20 parts by weight. |

The photosensitive film had a compression-bondable temperature of 130° C. with respect to a polyimide film and a glossy surface of a copper foil. Soldering heat resistance test of the photosensitive film showed that the photosensitive film got a "pass" until 360° C. under the Normal Condition, and until 350° C. under the Moisture Condition. Moreover, flame resistance test of the photosensitive film showed that the photosensitive film was extinguished in 4.0 seconds on average and got a "pass". Further, flexibility test of the photosensitive film showed that utterly no crack was caused in the photosensitive film, thus the photosensitive film got a "pass". Development test of the photosensitive film showed that a hole of a square shape sized 100 μm×100 μm was developed successfully, and the photosensitive film got a "pass".

Example 16

<Synthesis of N-acryloyloxyethylphthalic imide>

Into a 100 ml flask, a solution of 14.81 g (0.10 mol) of anhydrous phthalic acid was dissolved in 30 g of dioxolane was poured. Then, 6.11 g (0.10 mol) of amino ethanol was dropped therein at a room temperature with stirring. After the dropping, a solution thus prepared was gradually heated and reacted at 60° C. for one hour. After the reaction, hydrochloric aqueous solution of 4 mol/L (4 N) was added into a reaction liquid, which was thereby acidified. In this way, N-hydroxyethylphthalic imide (a colorless solid) was obtained.

16.71 g (0.087 mol) of N-hydroxyethylphthalic imide thus obtained, 9 ml (0.0066 mol) of triethylamine, and 50 ml of 1,2-dichloroethane were poured into a 100 ml flask. Then, 7.9 ml (0.090 mol) of acrylyl chloride was slowly dropped therein at a room temperature under nitrogen with stirring. After dropping, a solution thus prepared was reacted at a room temperature for one hour. After that, a reaction mixture was washed with water so as to separate an organic layer. Then, the organic layer was washed with a 5% sodium hydrogen carbonate aqueous solution. The organic layer separated from the 5% sodium hydrogen carbonate aqueous solution was dried with magnesium sulfate, and then a solvent was removed from the organic layer. Thereby, 15.4 g of N-acryloyloxyethylphthalic imide (viscous liquid of dark yellow color) was obtained. N-acryloyloxyethylphthalic imide is represented by the following Formula (121):

(121)

Preparation of Photosensitive Film>

A photosensitive resin composition was prepared by mixing the same component in the same manner as in Example 12, except that N-acryloyloxyethylphthalic imide thus sythesided above was used as an imide acrylate. Then, a photosensitive film was prepared in the fashion mentioned above.

The photosensitive film had a compression-bondable temperature of 100° C. with respect to a polyimide film and a glossy surface of a copper foil. Soldering heat resistance test of the photosensitive film showed that the photosensitive film got a "pass" until 360° C. under the Normal Condition, and until 350° C. under the Moisture Condition. Moreover, flame resistance test of the photosensitive film showed that the photosensitive film was extinguished in 3.5 seconds on average and got a "pass". Further, flexibility test of the photosensitive film showed that utterly no crack was caused in the photosensitive film, thus the photosensitive film got a "pass". Development test of the photosensitive film showed that a hole of a square shape sized 100 μm×100 μm was developed successfully, and the photosensitive film got a "pass".

Example 17

<Synthesis of N,N'-bis(acryloxyethyl)oxydiphthalic imide>

Into a 100 ml flask, a solution prepared by dissolving 31.0 g (0.1 mol) of 3,3',4,4'-biphenylethertetracarboxylic anhydride (ODPA) in 30 g of dioxolane was poured. 15.9 g (0.26 mol) of aminoethanol was dropped, at a room temperature, into the solution being stirred. After the dropping, the solution thus prepared was gradually heated and reacted at 100° C. for 1 hour. After the reaction, hydrochloric aqueous solution of 4 mol/L (4 N) was added in a reaction liquid, which was thereby acidified. A target substance was extracted with chloroform from a reaction mixture thus prepared, thereby separating an organic layer therefrom. The organic layer was dried with anhydrous magnesium sulfate. Then, chloroform was removed from the organic layer. Thereby, 36.8 g (yield 93%) of N,N'-bis(hydroxyethyl) oxydiphthalic imide (viscous liquid of transparent and colorless) was obtained.

Next, 21.8 g (0.055 mol) of N,N'-bis(hydroxyethyl)oxydiphthalic imide, 15 ml (0.11 mol) of triethylamine, and 50 ml of 1,2-dichloroethane were poured in a 100 ml flask. Then, 14.4 ml (0.180 mol) of acrylyl chloride was slowly dropped therein at a room temperature under nitrogen with stirring. After the dropping, a mixture thus prepared was reacted for one hour at a room temperature. A reaction mixture was washed with water so as to separate an organic layer therefrom. Then, the organic layer was washed with a 5% sodium hydrogen carbonate aqueous solution. The organic layer separated from the 5% sodium hydrogen carbonate aqueous solution was dried with magnesium sulfate, and then a solvent was removed from the organic layer. 20.8 g of N,N-bis(acryloyloxyethyl)oxydiphthalic imide (viscous liquid of dark yellow color) was thereby obtained. N,N-bis(acryloyloxyethyl)oxydiphthalic imide is represented by the following formula (122):

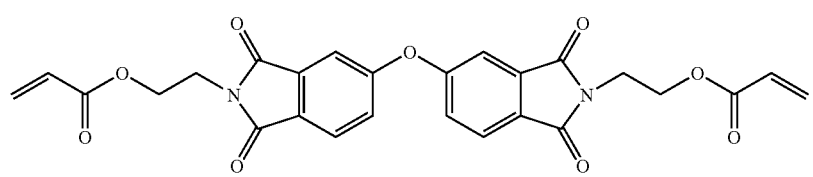

(122)

<Preparation of Photosensitive Film>

A photosensitive resin composition was prepared by mixing the same component in the same manner as in Example 12, except that N,N-bis(acryloyloxyethyl)oxydiphthalic imide thus synthesized above was used as an imide acrylate. Then, a photosensitive film was prepared in the fashion mentioned above.

The photosensitive film had a compression-bondable temperature of 90° C. with respect to a polyimide film and a glossy surface of a copper foil. Soldering heat resistance test of the photosensitive film showed that the photosensitive film got a "pass" until 360° C. under the Normal Condition, and until 350° C. under the Moisture Condition. Moreover, flame resistance test of the photosensitive film showed that the photosensitive film was extinguished in 4.5 seconds on average and got a "pass". Further, flexibility test of the photosensitive film showed that utterly no crack was caused in the photosensitive film, thus the photosensitive film got a "pass". Development test of the photosensitive film showed that a hole of a square shape sized 100 μm×100 μm was developed successfully, and the photosensitive film got a "pass".

Example 18

<Synthesis of N,N'-bis(acryloyloxy)-benzophenon-3,4,3',4'-tetracarboxylic imide>

Into a 100 ml flask, a solution prepared by dissolving 64.45 g (0.2 mol) of benzophenone-benzophenone-3,4,3',4'-tetracarboxylic anhydride (BTDA) in 30 g of DMF was poured. 16 ml (0.26 mol) of hydroxylamine (50% aqueous solution) was dropped, at a room temperature, in the solution being stirred. After the dropping, the solution was gradually heated up, and reacted at 100° C. for one hour. After the reaction, hydrochloric acid aqueous solution of 4 mol/L (4 N) was added into a reaction liquid, which was thereby acidified. A target substance was extracted with chloroform from a reaction mixture thus prepared, thereby separating an organic layer therefrom. The organic layer was dried with anhydrous magnesium sulfate. Then, chloroform was removed from the organic layer. Thereby, 65.51 g (yield 93%) of N,N'-bis(hydroxyethyl)-benzophenone-3,4,3',4'-tetracarboxylic imide (viscous material of transparent and colorless).

Next, 35.22 g (0.10 mol) of N,N'-bis(hydroxyethyl)-benzophenone-3,4,3',4'-tetracarboxylic imide, 30 ml (0.22 mol) of triethylamine, and 100 ml of 1,2-dichloroethane were poured in a 100 ml flask. Then, 28.8 ml (0.360 mol) of acrylyl chloride was slowly dropped therein at a room temperature under nitrogen with stirring. After the dropping, a mixture thus prepared was reacted for one hour at a room temperature. A reaction mixture was washed with water so as to separate an organic layer therefrom. Then, the organic layer was washed with a 5% sodium hydrogen carbonate aqueous solution. The organic layer separated from the 5% sodium hydrogen carbonate aqueous solution was dried with magnesium sulfate, and then a solvent was removed from the organic layer. 35.66 g of N,N'-bis(acryloyloxy)-benzophenone-3,4,3',4'-tetracarboxylic imide (viscous liquid of dark yellow color) was thereby obtained. N,N'-bis(acryloyloxy)-benzophenone-3,4,3',4'-tetracarboxylic imide is represented by the following formula (123):

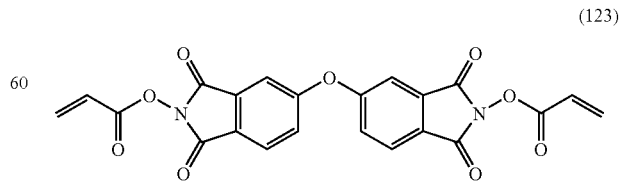

(123)

<Preparation of Photosensitive Film>A photosensitive resin composition was prepared by mixing the same component in the same manner as in Example 11, except that N,N'-bis(acryloyloxy)-benzophenone-3,4,3',4'-tetracarboxylic imide thus synthesized above was used as an imide acrylate. Then, a photosensitive film was prepared in the fashion mentioned above.

The photosensitive film had a compression-bondable temperature of 110° C. with respect to a polyimide film and a glossy surface of a copper foil. Soldering heat resistance test of the photosensitive film showed that the photosensitive film got a "pass" until 360° C. under the Normal Condition, and until 350° C. under the Moisture Condition. Moreover, flame resistance test of the photosensitive film showed that the photosensitive film was extinguished in 4.5 seconds on average and got a "pass". Further, flexibility test of the photosensitive film showed that utterly no crack was caused in the photosensitive film, thus the photosensitive film got a "pass". Development test of the photosensitive film showed that a hole of a square shape sized 100 μm×100 μm was developed successfully, and the photosensitive film got a "pass".

Comparative Example 4

A photosensitive resin composition was prepared by mixing the same components in the same manner as in Example 11, except that a copolymer synthesized by copolymerizing methylmethacrylate, n-butylmethacrylate, 2-ethylhexylacrylate, and methacrylic acid, in a copolymerization ratio (by weight) of 55:8:15:22 was used instead of the soluble polyimide. Then, a photosensitive film was prepared by the method described above.

The photosensitive film had a compression-bondable temperature of 80° C. with respect to a polyimide film and a glossy surface of a copper foil. Soldering heat resistance test of the photosensitive film showed that the photosensitive film got a "pass" until 320° C. under the Normal Condition, and until 310° C. under the Moisture Condition. However, flame resistance test of the photosensitive film showed that the photosensitive film was not extinguished within 10 seconds and was burned up with a large flame up to positions of clamps. Thus, the photosensitive film got a "fail" in the flame resistance test. Further, flexibility test of the photosensitive film showed that utterly no crack was caused in the photosensitive film, thus the photosensitive film got a "pass". Development test of the photosensitive film showed that a hole of a square shape sized 100 μm×100 μm was developed successfully, and the photosensitive film got a "pass".

As described above, a photosensitive film in which the polymer that was not the soluble polyimide was poor in the flame resistance.

Comparative Example 5

A photosensitive resin composition was prepared by mixing the components in the following amounts. Then, a photosensitive film was prepared, in which a soluble polyimide and an imide(meth)acrylate compound were not used.

| | |
|---|---|
| A copolymer synthesized by copolymerizing methylmethacrylate, n-butylmethacrylate, 2-ethylhexylacrylate, and methacrylic acid, in a copolymerization ratio (by weight) of 55:8:15:22: | 70 parts by weight, |
| Bisphenol A EO modified (m + n ≈ 30) diacrylate (NK ester A-BPE-30, made by Shin-Nakamura Chemical Co., Ltd.): | 10 parts by weight, |
| Bisphenol A EO modified (m + n ≈ 4) diacrylate (allonix M-211B, made by Toagosei Co., Ltd.): | 20 parts by weight, |
| Bis(2,4,6-trimethylbenzoil)phenylphosphineoxide (irgacure 819 made by Ciba Specialty Chemicals K.K.): | 1 part by weight. |

The photosensitive film had a compression-bondable temperature of 100° C. with respect to a polyimide film and a glossy surface of a copper foil. Soldering heat resistance test of the photosensitive film showed that the photosensitive film got a "pass" until 270° C. under the Normal Condition, and until 250° C. under the Moisture Condition. However, flame resistance test of the photosensitive film showed that the photosensitive film was not extinguished within 10 seconds and was burned up with a large flame up to positions of clamps. Thus, the photosensitive film got a "fail" in the flame resistance test. Further, flexibility test of the photosensitive film showed that cracks were caused in a cover lay film both by folding the photosensitive film with a cover lay film surface facing outward, and by folding the photosensitive film with a cover lay film surface facing inward. Thus the photosensitive film got a "fail" in the flexibility test. Development test of the photosensitive film showed that a hole of a square shape sized 100 μm×100 μm was developed successfully, and the photosensitive film got a "pass".

As described above, the photosensitive film in which the soluble polyimide and imide acrylate were not used was poor in heat resistance, flame resistance, and flexibility attained after being cured.

Comparative Example 6

A photosensitive resin composition was prepared by mixing the same components in the same method as in Example 13, except that a copolymer synthesized by copolymerizing methylmethacrylate, n-butylmethacrylate, 2-ethylhexylacrylate, and methacrylic acid in a copolymerization ratio (by weight) of 55:8:15:22 was used as a soluble polyimide. Then, a photosensitive film was prepared by the method described above.

The photosensitive film had a compression-bondable temperature of 80° C. with respect to a polyimide film and a glossy surface of a copper foil. Soldering heat resistance test of the photosensitive film showed that the photosensitive film got a "pass" until 280° C. under the Normal Condition, and until 270° C. under the Moisture Condition. However, flame resistance test of the photosensitive film showed that the photosensitive film was not extinguished within 10 seconds and was burned up with a large flame up to positions of clamps. Thus, the photosensitive film got a "fail" in the flame resistance test. Further, flexibility test of the photosensitive film showed that utterly no crack was caused in the photosensitive film, thus the photosensitive film got a "pass". Development test of the photosensitive film showed that a hole of a square shape sized 100 μm×100 μm was developed successfully, and the photosensitive film got a "pass".

As described above, poor in the heat resistance and the flame resistance was the photosensitive film in which the copolymer that was not a polyimide was used.

[Preparation of Photosensitive Film]

In Examples 19 to 24 and Comparative Examples 7 to 10, photosensitive films were prepared in a manner basically same as in the above-mentioned <Preparation of Photosensitive Film>. As to 10% weight loss temperature of phosphorous compound used as (D) fire retardants, the photosensitive films were evaluated as follows.

<10% Weight Loss Temperature of Phosphorous Compound>

By using a differential scanning calorimeter (TG/DTA 220 made by Seiko Corp.), a temperature range from 20° C. to 600° C. was measured at a temperature elevation rate of 20° C./min in a presence of air. A temperature at which a weight of a sample was reduced by 10% was determined as a 10% weight loss temperature (10% mass reduction temperature).

Example 19

As raw materials of a polyimide, ESDA, BAPS-M, MBAA, and KF-8010 mentioned above, were used. As solvents, N,N'-dimethylformamide (DMF) and dioxolane were used.

<Synthesis of Polyimide>

Into a 500 ml separable flask provided with a stirring apparatus, 17.3 g (0.030 mol) of ESDA, and 30 g of DMF were poured, and dissolved with stirring by using the stirring apparatus. Next, into the solution thus prepared, 5.15 g (0.018 mol) of diamine MBAA dissolved in 9 g of DMF was added. Then, the solution was vigorously stirred. After the solution was thoroughly mixed, 7.47 g (0.009 mol) of KF-8010 (made by Shin-Etsu Silicone) was added as siloxanediamine. Then, the solution was vigorously stirred. After the solution was thoroughly mixed, 1.29 g (0.003 mol) of BAPS-M was finally added. Then, the solution was vigorously stirred for 1 hour. A polyamide solution thus prepared was transferred into a vat coated with a fluorine-based resin. The polyamide solution in the vat was vacuum-dried at 200° C. for 2 hours under a pressure of 660 Pa by using a vacuum oven. Thereby, 26.40 g of a soluble polyimide was synthesized.

50 g or more of the polyimide was dissolved into 100 g of tetrahydrofuran (at 20° C.). Because 50 g or more was dissolved, the polyimide came under a soluble polyimide defined in the present invention.

<Preparation of Photosensitive Film>

15 g of the soluble polyimide was dissolved into 35 g of dioxolane, thereby preparing a varnish of a soluble polyimide having a solid content % by weight (Sc) of 30%. A photosensitive resin composition was prepared by adding the following components in the following amounts.

| The soluble (by solid content by weight): | 60 parts by weight, |
|---|---|
| Bisphenol A EO modified (m + n ≈ 30) diacrylate (NK ester A-BPE-30 made by Shin-Nakamura Chemical Co., Ltd.): | 5 parts by weight, |
| Bisphenol A EO modified (m + n ≈ 4) diacrylate (allonix M-221B, made by Toagosei Co., Ltd.): | 5 parts by weight, |
| Diphenoxy phosphazen (degree of polymerization = 3&4, SP-134, made by Otsuka Chemical Co., Ltd.) (having 10% weight loss temperature of 370° C.): | 30 parts by weight, |
| Bis(2,4,6-trimethylbenzoil)phenylphosphineoxide (irgacure 819 made by Ciba Specialty Chemicals K.K.): | 1 part by weight. |

A photosensitive film in the B stage condition was prepared by applying the photosensitive resin composition on a PET film in the manner mentioned above. Further, a protective film was laminated thereon, thereby obtaining a three-layer sheet (laminate).

The photosensitive film had a compression-bondable temperature of 110° C. with respect to a polyimide film and a glossy surface of a copper foil. Flame resistance test of the photosensitive film showed that the photosensitive film was extinguished in 2.5 seconds on average. Thus, the photosensitive film got a "pass" in the flame resistance test. Soldering heat resistance test of the photosensitive film showed that the photosensitive film got a "pass" until 360° C. under the Normal Condition, and until 350° C. under the Moisture Condition. Development test of the photosensitive film showed that a hole of a square shape sized 100 µm×100 µm was developed successfully, and the photosensitive film got a "pass".

Example 20

<Synthesis of Modified Polyimide>

20.8 g (0.020 mol) of the polyimide synthesized in Example 19 was dissolved in 80 g of dioxolane. Then, 0.030 g of 4-methoxy phenol was added therein, and dissolved by moderately heating by using an oil bath of 60° C. Into a solution thus prepared, 3.75 g (0.0264 mol) of glycidyl methacrylate dissolved in 5 g of dioxolane was added. Further, as a catalyst, 0.01 g of triethylamine was added in the solution. Then, the solution was heated at 60° C. for 6 hours with stirring. In this way, a modified polyimide was synthesized.

<Preparation of Photosensitive Film>

A photosensitive resin composition was prepared by mixing the following components in the following amounts. Then, a photosensitive film/three-layer sheet was prepared in the manner mentioned above.

| The modified polyimide (by solid content by weight): | 50 parts by weight, |
|---|---|
| Bisphenol A EO modified (m + n ≈ 30) diacrylate (NK ester A-BPE-30, made by Shin-Nakamura Chemical Co., Ltd.): | 5 parts by weight, |
| Bisphenol A EO modified (m + n ≈ 4) diacrylate (allonix M-211B, made by Toagosei Co., Ltd.): | 15 parts by weight, |
| Diphenoxy phosphazen (degree of polymerization = 3 to 10, SP-100, made by Otsuka Chemical Co., Ltd.) (having 10% weight loss temperature of 370° C.): | 30 parts by weight, |
| Bis(2,4,6-trimethylbenzoil)phenylphosphineoxide (irgacure 819 made by Ciba Specialty Chemicals K.K.): | 1 part by weight. |

The photosensitive film had a compression-bondable temperature of 80° C. with respect to a polyimide film and a glossy surface of a copper foil. Flame resistance test of the photosensitive cover lay film showed that the photosensitive cover lay film was extinguished in 4.0 seconds on average. Thus, the photosensitive film got a "pass" in the flame resistance test. Soldering heat resistance test of the photosensitive film showed that the photosensitive film got a "pass" until 360° C. under the Normal Condition, and until 350° C. under the Moisture Condition. Development test of the photosensitive film showed that a hole of a square shape sized 100 µm×100 µm was developed successfully, and the photosensitive film got a "pass".

Example 21

As a raw material of a polyimide, 3,3',4,4'-biphenylethertetracarboxylic anhydride (ODPA) was used. As diamines, BAPS-M, MBAA, and KF-8010 were used. As solvents, N,N'-dimethylformamide (DMF) and a dioxalane.

<Synthesis of Polyimide>

Into a 500 ml separable flask provided with a stirring apparatus, 9.31 g (0.030 mol) of ODPA, and 30 g of DMF were poured, and dissolved with stirring by using the stirring apparatus. Next, into the solution thus prepared, a solution prepared by dissolving 4.29 g (0.015 mol) of MBAA, made by Wakayama Seika Kogyo Ltd., in 10 g of DMF was added as a diamine. Then, the solution was vigorously stirred. After the solution was thoroughly mixed, 7.47 g (0.009 mol) of KF-8010 (made by Shin-Etsu Silicone) was added as siloxanediamine. Then, the solution was vigorously stirred. After the solution was thoroughly mixed, 2.58 g (0.006 mol) of BAPS-M was finally added. Then, the solution was vigorously stirred for 1 hour. A polyamide solution thus prepared was transferred into a vat coated with a fluorine-based resin. The polyamide solution in the vat was vacuum-dried at 200° C. for 2 hours under a pressure of 660 Pa by using a vacuum oven. Thereby, 21.28 g of a soluble polyimide was synthesized.

50 g or more of the polyimide was dissolved into 100 g of tetrahydrofuran (at 20° C.). Because 50 g or more was dissolved, the polyimide came under a soluble polyimide defined in the present invention.

<Preparation of Photosensitive Film>

21 g of the soluble polyimide was dissolved into 49 g of dioxolane, thereby preparing a varnish of a soluble polyimide having a solid content % by weight (Sc) of 30%. Then, a photosensitive resin composition was prepared by adding the following compounds in the following amounts, and a photosensitive film/three-layer sheet was prepared by the method described above.

| The soluble polyimide (by solid content by weight): | 55 parts by weight, |
|---|---|
| Bisphenol A EO modified (m + n ≈ 30) diacrylate (NK ester A-BPE-30 made by Shin-Nakamura Chemical Co., Ltd.): | 5 parts by weight, |
| Bisphenol A EO modified (m + n ≈ 4) diacrylate (allonix M-211B made by Toagosei Co., Ltd.): | 10 parts by weight, |
| Bis(2-vinylphenoxy) phosphazen (degree of polymerization = 3) (10% weight loss temperature = 380° C.): | 30 parts by weight, |
| 4,4'-bis(diethylamino)benzophenone: | 1 part by weight, |
| 3,3',4,4'-tetra(t-butylperoxycarbonyl)benzophenone: | 1 part by weight. |

The photosensitive film had a compression-bondable temperature of 90° C. with respect to a polyimide film and a glossy surface of a copper foil. Flame resistance test of the photosensitive film showed that the photosensitive film was extinguished in 2.0 seconds on average. Thus, the photosensitive film got a "pass" in the flame resistance test. Soldering heat resistance test of the photosensitive film showed that the photosensitive film got a "pass" until 360° C. under the Normal Condition, and until 350° C. under the Moisture Condition. Development test of the photosensitive film showed that a hole of a square shape sized 100 μm×100 μm was developed successfully, and the photosensitive film got a "pass".

Example 22

As a raw material of a polyimide, 3,3',4,4'-biphenylsulfonetetracarboxylic anhydride (DSDA) was used. As diamines, BAPS-M, MBAA, and KF-8010 mentioned above were used. As solvents, N,N'-dimethylformamide (DMF) and dioxolane were used.

<Synthesis of Polyimide>

Into a 500 ml separable flask provided with a stirring apparatus, 10.75 g (0.030 mol) of DSDA, and 30 g of DMF were poured, and dissolved with stirring by using the stirring apparatus. Next, into the solution thus prepared, 4.29 g (0.015 mol) of diamine MBAA (made by Wakayama Seika Kogyo Ltd.) dissolved in 10 g of DMF was added. Then, the solution was vigorously stirred. After the solution was thoroughly mixed, 7.47 g (0.009 mol) of KF-8010 (made by Shin-Etsu Silicone) was added as siloxanediamine. Then, the solution was vigorously stirred. After the solution was thoroughly mixed, 2.58 g (0.006 mol) of BAPS-M was finally added. Then, the solution was vigorously stirred for 1 hour. A polyamide solution thus prepared was transferred into a vat coated with a fluorine-based resin. The polyamide solution in the vat was vacuum-dried at 200° C. for 2 hours under a pressure of 660 Pa by using a vacuum oven. Thereby, 22.57 g of a soluble polyimide was obtained.

50 g or more of the polyimide was dissolved into 100 g of tetrahydrofuran (at 20° C.). Because 50 g or more was dissolved, the polyimide came under a soluble polyimide defined in the present invention.

<Preparation of Photosensitive Film>

21 g of the soluble polyimide was dissolved into 49 g of dioxolane, thereby preparing a varnish of a soluble polyimide having a solid content % by weight (Sc) of 30%. A photosensitive resin composition was prepared by adding the following components in the following amounts, and a photosensitive film/three-layer sheet was prepared by the method described above.

| The soluble polyimide (by solid content by weight): | 40 parts by weight. |
|---|---|
| Bisphenol A EO modified (m + n ≈ 30) diacrylate (NK ester A-BPE-30 made by Shin-Nakamura Chemical Co., Ltd.): | 5 parts by weight, |
| Bisphenol A EO modified (m + n ≈ 4) diacrylate (allonix M-211B, made by Toagosei Co., Ltd.): | 5 parts by weight, |
| Isocyanuric acid EO modified diacrylate (allonix M-215, made by Toagosei Co., Ltd.): | 5 parts by weight, |
| Polyphosphoric melamine (PMP-100, made by Nissan Chemical Industries Ltd.) (having a 10% weight loss temperature of 380° C.): | 25 parts by weight, |
| 4,4'-bis(diethylamino)benzophenone: | 1 part by weight, |
| 3,3',4,4'-tetra(t-butylperoxycarbonyl)benzophenone: | 1 part by weight. |

The photosensitive film had a compression-bondable temperature of 130° C. with respect to a polyimide film and a glossy surface of a copper foil. Flame resistance test of the photosensitive film showed that the photosensitive film was extinguished in 4.0 seconds on average. Thus, the photosensitive film got a "pass" in the flame resistance test. Soldering heat resistance test of the photosensitive film showed that the photosensitive film got a "pass" until 360° C. under the Normal Condition, and until 350° C. under the Moisture Condition. Development test of the photosensitive film showed that a hole of a square shape sized 100 μm×100 μm was developed successfully, and the photosensitive film got a "pass".

Example 23

A photosensitive resin composition was prepared by mixing the same components in the same manner as in Example 20, except that polyphosphoric ammonium (sumisave PM made by Sumitomo Chemical Co., Ltd.) (having a 10% weight loss temperature of 375° C. was used instead of diphenoxyphosphazen. Then, a photosensitive film/three-layer sheet was prepared by the method mentioned above.

The photosensitive film had a compression-bondable temperature of 100° C. with respect to a polyimide film and a glossy surface of a copper foil. Flame resistance test of the photosensitive film showed that the photosensitive film was extinguished in 2.8 seconds on average. Thus, the photosensitive film got a "pass" in the flame resistance test. Soldering heat resistance test of the photosensitive film showed that the photosensitive film got a "pass" until 360° C. under the Normal Condition, and until 350° C. under the Moisture Condition. Development test of the photosensitive film showed that a hole of a square shape sized 100 µm×100 µm was developed successfully, and the photosensitive film got a "pass".

Example 24

The above-mentioned BSAA, s-BPDA, BAPS-M, 2,2'-bis(3-amino-4-hydroxyphenyl)hexafluoropropane, and KF-8010 were used as raw materials of a polyimide. As solvents, N,N'-dimethylformamide (DMF) and dioxolane were used.

<Synthesis of Polyimide>

Into a 500 ml separable flask provided with a stirring apparatus, 26.02 g (0.050 mol) of BSAA, and 30 g of DMF were poured, and dissolved with stirring by using the stirring apparatus. After they were dissolved, 14.71 g (0.050 mol) of s-BPDA and 20 g of DMF were added thereto. Then, a solution was vigorously stirred again. Then, as diamines, 18.31 g (0.050 mol) of 2,2'-bis(3-amino-4-hydroxyphenyl) hexafluoropropane dissolved in 30 g of DMF was added, and the solution was vigorously stirred. After the solution was thoroughly mixed, 24.90 g (0.030 mol) of KF-8010 (made by Shin-Etsu Silicone) was added as siloxanediamine. Then, the solution was vigorously stirred. After the solution was thoroughly mixed, 8.61 g (0.020 mol) of BAPS-M was finally added. Then, the solution was vigorously stirred for 1 hour. A polyamide solution thus prepared was transferred into a vat coated with a fluorine-based resin. The polyamide solution in the vat was vacuum-dried at 200° C. for 2 hours under a pressure of 660 Pa by using a vacuum oven. Thereby, 83.5 g of a soluble polyimide was obtained.

50 g or more of the polyimide was dissolved into 100 g of tetrahydrofuran. Because 50 g or more was dissolved, the polyimide was a soluble polyimide defined in the present invention.

<Preparation of Photosensitive Film>

30 g of the soluble polyimide was dissolved into 70 g of dioxolane, thereby preparing a varnish of a soluble polyimide having a solid content % by weight (Sc) of 30%. Then, a photosensitive resin composition was prepared by adding the following components in the same manner as in Example 19, except that the above-mentioned soluble polyimide was used, instead of the polyimide used in Example 19. Then, a photosensitive film/three-layer sheet was prepared in the above-mentioned method.

The photosensitive film had a compression-bondable temperature of 100° C. with respect to a polyimide film and a glossy surface of a copper foil. Flame resistance test of the photosensitive film showed that the photosensitive film was extinguished in 4.0 seconds on average. Thus, the photosensitive film got a "pass" in the flame resistance test. Soldering heat resistance test of the photosensitive film showed that the photosensitive film got a "pass" until 360° C. under the Normal Condition, and until 350° C. under the Moisture Condition. Development test of the photosensitive film showed that a hole of a square shape sized 100 µm×100 µm was developed successfully, and the photosensitive film got a "pass".

Comparative Example 7

A photosensitive resin composition was prepared by mixing the same components in the same manner as in Example 19, except that EO modified tribromophenylacrylate (BR-31 made by Dai-Ichi Kogyo Seiyaku Co., Ltd.) was used, instead of diphenoxy phosphazen. Then, a photosensitive film/three-layer sheet was prepared by the method mentioned above.

The photosensitive film had a compression-bondable temperature of 120° C. with respect to a polyimide film and a glossy surface of a copper foil. Flame resistance test of the photosensitive film showed that the photosensitive film was extinguished in 4.0 seconds on average. Thus, the photosensitive film got a "pass" in the flame resistance test. Soldering heat resistance test of the photosensitive film showed that the photosensitive film got a "pass" until 360° C. under the Normal Condition, and until 350° C. under the Moisture Condition. Development test of the photosensitive film showed that a hole of a square shape sized 100 µm×100 µm was developed successfully, and the photosensitive film got a "pass". A hole of a square shape sized 100 µm×100 µm was developed successfully, and the photosensitive film got a "pass".

However, because a halogen compound is used therein, combustion of the photosensitive film would be possibly accompanied with generation of a poisonous gas of halogen type.

Comparative Example 8

A photosensitive resin composition was prepared by mixing the same component in the same manner as in Example 19, except that a copolymer synthesized by copolymerizing methylmethacrylate, n-butylmethacrylate, 2-ethylhexylacrylate, and methacrylic acid in a copolymerization ratio (by weight) of 55:8:15:22 was used instead of the polyimide of Example 19. Then, a photosensitive film/three-layer sheet was prepared by the method mentioned above.

The photosensitive film had a compression-bondable temperature of 80° C. with respect to a polyimide film and a glossy surface of a copper foil. Flame resistance test of the photosensitive film showed that the photosensitive film was not extinguished within 10 seconds and was burned up with a large flame up to positions of clamps. Thus, the photosensitive film got a "fail" in the flame resistance test.

As described above, a photosensitive film in which a copolymer that is not a polyimide is used is poor in flame resistance even if a phosphazen compound is used.

Comparative Example 9

A photosensitive resin composition was prepared by mixing the same component in the same manner as in Example 22, except that a copolymer synthesized by copolymerizing methylmethacrylate, n-butylmethacrylate, 2-ethylhexylacrylate, and methacrylic acid in a copolymerization ratio (by weight) of 55:8:15:22 was used instead of the polyimide of Example 22. Then, a photosensitive film/three-layer sheet was prepared by the method mentioned above.

The photosensitive film had a compression-bondable temperature of 80° C. with respect to a polyimide film and a glossy surface of a copper foil. Flame resistance test of the photosensitive film showed that the photosensitive film was not extinguished within 10 seconds and was burned up with a large flame up to positions of clamps. Thus, the photosensitive film got a "fail" in the flame resistance test.

As described above, poor in flame resistance is a photosensitive film in which a copolymer that is not a polyimide is used, even if a polyphosphoric melamine compound is used therein.

Comparative Example 10

A photosensitive resin composition was prepared by mixing the same component in the same manner as in Example 22, except that a copolymer synthesized by copolymerizing methylmethacrylate, n-butylmethacrylate, 2-ethylhexylacrylate, and methacrylic acid in a copolymerization ratio (by weight) of 55:8:15:22 was used instead of the polyimide of Example 22, and that EO modified tribromophenyl acrylate (BR-31 made by Dai-Ichi Kogyo Seiyaku Co., Ltd.) instead of diphenoxy phosphazen. Then, a photosensitive film/three-layer sheet was prepared by the method mentioned above.

The photosensitive film had a compression-bondable temperature of 90° C. with respect to a polyimide film and a glossy surface of a copper foil. Flame resistance test of the photosensitive film showed that the photosensitive film was extinguished in 8.0 seconds on average. Thus, the photosensitive film got a "fail" in the flame resistance test.

As shown above, the photosensitive film in which a copolymer that is not a polyimide is poor in flame resistance even if a bromine-based fire retardant is used. Further, combustion of the photosensitive film would be possibly accompanied with generation of a poisonous gas of halogen type.

[Evaluation of Property of Photosensitive Film]

In the following Examples 25 to 28, evaluation in soldering heat resistance was carried out basically in the same manner as in the above <Soldering Heat Resistance>. However, a photosensitive film surface was laminated on a glossy surface of an electrolysis copper foil (after soft-etching) by applying a temperature of 100° C. and a force of 75000 Pa·m.

Example 25

As raw materials of a polyimide, ESDA, BAPS-M, MBAA, and KF-8010 mentioned above were used. As solvents, N,N'-dimethylformamide (DMF) and dioxolane were used.

<Synthesis of Polyimide>

Into a 500 ml separable flask provided with a stirring apparatus, 17.3 g (0.030 mol) of ESDA, and 30 g of DMF were poured, so as to prepare a DMF varnish of ESDA. Then, into the DMF varnish, 5.15 g (0.018 mol) of diamine MBAA (made by Wakayama Seika Kogyo Ltd.) dissolved in 9 g of DMF was added. Then, a solution thus prepared was vigorously stirred. After the solution was thoroughly mixed, 7.47 g (0.009 mol) of KF-8010 (made by Shin-Etsu Silicone) was added therein as a siloxanediamine. Then, the solution was vigorously stirred. After the solution was thoroughly mixed, 1.29 g (0.003 mol) of BAPS-M was finally added therein. Then, the solution was vigorously stirred for one hour. A polyimide solution thus prepared was transferred into a vat coated with a fluorine-based resin. The polyamide solution in the vat was vacuum-dried at 200° C. for 2 hours under a pressure of 660 Pa by using a vacuum oven. Thereby, 26.40 g of a polyimide was obtained.

50 g or more of the polyimide was dissolved into 100 g of tetrahydrofuran (at 20° C.). Because 50 g or more was dissolved, the polyimide came under a soluble polyimide defined in the present invention.

15 g of the soluble polyimide was dissolved into 35 g of dioxolane, thereby preparing a varnish of a soluble polyimide having a solid content % by weight (Sc) of 30%. A photosensitive resin composition was prepared by adding the following components in the following amounts. Then, the photosensitive resin composition was applied on a PET film, so as to prepare a photosensitive film in the B stage condition. A protective film was further laminated on the photosensitive film, whereby a photosensitive film/three-layer sheet was prepared.

| | |
|---|---|
| The soluble polyimide (by solid content by weight): | 60 parts by weight, |
| Bisphenol A EO modified (recurring units of ethyleneoxide modified sites; m + n ≈ 30) diacrylate (NK ester A-BPE-30 made by Shin-Nakamura Chemical Co., Ltd.): | 5 parts by weight, |
| Bisphenol A EO modified (the same as above; m + n ≈ 4) diacrylate (allonix M-211B made by Toagosei Co., Ltd.): | 5 parts by weight, |
| Branched methylphenyl siloxane compound (KR-211 made by Shin-Etsu Silicone)(phenyl content: about 70%): | 30 parts by weight, |
| Bis(2,4,6-trimethylbenzoil)phenylphosphineoxide (irgacure 819 made by Ciba Specialty Chemicals K.K.): | 1 part by weight. |

The photosensitive film had a compression-bondable temperature of 100° C. with respect to a polyimide film and a glossy surface of a copper foil. Flame resistance test of the photosensitive film showed that the photosensitive film was extinguished in 4.0 seconds on average. Thus, the photosensitive film got a "pass" in the flame resistance test. Soldering heat resistance test of the photosensitive film showed that the photosensitive film got a "pass" until 360° C. under the Normal Condition, and until 350° C. under the Moisture Condition. Development test of the photosensitive film showed that a hole of a square shape sized 100 μm×100 μm was developed successfully, and the photosensitive film got a "pass".

Example 26

<Synthesis of Modified Polyimide>

20.8 g (0.020 mol) of the polyimide prepared in Example 25 was dissolved in 80 g of dioxolane. Into a solution thus prepared, 0.030 g of 4-methoxy phenol was added and dissolved by moderately heating by using an oil bath of 60° C. Into the solution, 3.75 g (0.0264 mol) of glycidyl methacrylate dissolved in 5 g of dioxolane was added. As a catalyst, 0.01 g of triethylamine was further added therein. Then, the solution was stirred at 60° C. for 6 hours. In this way, a modified polyimide was synthesized.

<Preparation of Photosensitive Film>

A photosensitive resin composition was prepared by mixing the following components in the following amounts. Then, a photosensitive film/three-layer sheet was prepared in the manner mentioned above.

| | |
|---|---|
| The modified polyimide (by solid content by weight): | 50 parts by weight, |
| Bisphenol A EO modified (m + n ≈ 30) diacrylate (NK ester A-BPE-30, made by Shin-Nakamura Chemical Co., Ltd.): | 5 parts by weight, |
| Bisphenol A EO modified (m + n ≈ 4) diacrylate (allonix M-211B, made by Toagosei Co., Ltd.): | 15 parts by weight, |
| Branched methyl phenyl siloxane compound having a vinyl group in a side chain (KR-215 made by Shin-Etsu Chemical Co., Ltd.) (phenyl content: about 70%): | 30 parts by weight, |
| Bis(2,4,6-trimethylbenzoil)phenylphosphineoxide (irgacure 819 made by Ciba Specialty Chemicals K.K.): | 1 part by weight. |

The photosensitive film had a compression-bondable temperature of 110° C. with respect to a polyimide film and a glossy surface of a copper foil. Flame resistance test of the photosensitive cover lay film showed that the photosensitive cover lay film was extinguished in 3.5 seconds on average. Thus, the photosensitive film got a "pass" in the flame resistance test. Soldering heat resistance test of the photosensitive film showed that the photosensitive film got a "pass" until 360° C. under the Normal Condition, and until 350° C. under the Moisture Condition. Development test of the photosensitive film showed that a hole of a square shape sized 100 μm×100 μm was developed successfully, and the photosensitive film got a "pass".

Example 27

As raw materials of a polyimide, ODPA, BAPS-M, MBAA, and KF-8010 mentioned above were used. As solvents, N,N'-dimethylformamide (DMF) and dioxolane were used.

<Synthesis of Polyimide>

Into a 500 ml separable flask provided with a stirring apparatus, 9.31 g (0.030 mol) of ODPA, and 30 g of DMF were poured, so as to prepare a DMF varnish of ODPA. Then, into the DMF varnish, 4.29 g (0.015 mol) of diamine MBAA (made by Wakayama Seika Kogyo Ltd.) dissolved in 10 g of DMF was added. Then, a solution thus prepared was vigorously stirred. After the solution was thoroughly mixed, 7.74 g (0.009 mol) of KF-8010 (made by Shin-Etsu Silicone) was added therein as a siloxanediamine. Then, the solution was vigorously stirred. After the solution was thoroughly mixed, 2.58 g (0.006 mol) of BAPS-M was finally added therein. Then, the solution was vigorously stirred for one hour. A polyamide solution thus prepared was transferred into a vat coated with a fluorine-based resin. The polyamide solution in the vat was vacuum-dried at 200° C. for 2 hours under a pressure of 660 Pa by using a vacuum oven. Thereby, 21.28 g of a soluble polyimide was obtained.

50 g or more of the polyimide was dissolved into 100 g of tetrahydrofuran (at 20° C.). Because 50 g or more was dissolved, the polyimide came under a soluble polyimide defined in the present invention.

<Preparation of Photosensitive Film>

21 g of the soluble polyimide was dissolved into 49 g of dioxolane, thereby preparing a varnish having a solid content % by weight (Sc) of 30%. A photosensitive resin composition was prepared by adding the following components in the following amounts. A photosensitive film/three-layer sheet was prepared in the manner described above.

| | |
|---|---|
| The soluble polyimide (by solid content by weight): | 55 parts by weight, |
| Bisphenol A EO modified (m + n ≈ 30) diacrylate (NK ester A-BPE-30 made by Shin-Nakamura Chemical Co., Ltd.): | 5 parts by weight, |
| Bisphenol A EO modified (the same as above; m + n ≈ 4) diacrylate (allonix M-211B made by Toagosei Co., Ltd.): | 10 parts by weight, |
| Branched methylphenyl siloxane compound (KF-56 made by Shin-Etsu Silicone)(phenyl content: about 25%): | 30 parts by weight, |
| 4,4'-bis(diethylamino)benzophenone: | 1 part by weight, |
| 3,3',4,4'-tetra(t-butylperoxycarbonyl)benzophenone: | 1 part by weight. |

The photosensitive film had a compression-bondable temperature of 90° C. with respect to a polyimide film and a glossy surface of a copper foil. Flame resistance test of the photosensitive film showed that the photosensitive film was extinguished in 3.0 seconds on average. Thus, the photosensitive film got a "pass" in the flame resistance test. Soldering heat resistance test of the photosensitive film showed that the photosensitive film got a "pass" until 360° C. under the Normal Condition, and until 350° C. under the Moisture Condition. Development test of the photosensitive film showed that a hole of a square shape sized 100 μm×100 μm was developed successfully, and the photosensitive film got a "pass".

Example 28

As raw materials of a polyimide, DSDA, BAPS-M, MBAA, and KF-8010 mentioned above were used. As solvents, N,N'-dimethylformamide (DMF) and dioxolane were used.

<Synthesis of Polyimide>

Into a 500 ml separable flask provided with a stirring apparatus, 10.75 g (0.030 mol) of DSDA, and 30 g of DMF were poured, and dissolved with stirring by using the stirring apparatus. Then, 4.29 g (0.015 mol) of diamine MBAA (made by Wakayama Seika Kogyo Ltd.) dissolved in 10 g of DMF was added thereto. After the solution was thoroughly mixed, 7.47 g (0.009 mol) of KF-8010 (made by Shin-Etsu Silicone) was added as siloxanediamine. Then, the solution was vigorously stirred. After the solution was thoroughly mixed, 2.58 g (0.006 mol) of BAPS-M was finally added. Then, the solution was vigorously stirred for 1 hour. A polyamide solution thus prepared was transferred into a vat coated with a fluorine-based resin. The polyamide solution in the vat was vacuum-dried at 200° C. for 2 hours under a pressure of 660 Pa by using a vacuum oven. Thereby, 22.57 g of a soluble polyimide was obtained.

50 g or more of the polyimide was dissolved into 100 g of tetrahydrofuran (at 20° C.). Because 50 g or more was dissolved, the polyimide came under a soluble polyimide defined in the present invention.

<Preparation of Photosensitive Film>

21 g of the soluble polyimide was dissolved into 49 g of dioxolane, thereby preparing a varnish of a soluble polyimide having a solid content % by weight (Sc) of 30%. Then, a photosensitive resin composition was prepared by adding the following components in the following amounts. Then, a photosensitive film/three-layer sheet was prepared in the above-mentioned method.

| | |
|---|---|
| The soluble polyimide (by solid content by weight): | 50 parts by weight, |
| Bisphenol A EO modified (m + n ≈ 30) diacrylate (NK ester A-BPE-30 made by Shin-Nakamura Chemical Co., Ltd.): | 10 parts by weight, |
| Bisphenol A EO modified (m + n ≈ 4) diacrylate (allonix M-211B, made by Toagosei Co., Ltd.): | 5 parts by weight, |
| Isocyanuric acid EO modified diacrylate (allonix M-215, made by Toagosei Co., Ltd.): | 5 parts by weight, |
| Methylphenyl siloxane compound having a branched main chain and a side chain having a methacryl group (KR-217 made by Shin-Etsu Chemical Co., Ltd.)(phenyl content: about 40%): | 30 parts by weight, |
| 4,4'-bis(diethylamino)benzophenone: | 1 part by weight, |
| 3,3',4,4'-tetra(t-butylperoxycaronyl)benzophenone: | 1 part by weight. |

The photosensitive film had a compression-bondable temperature of 130° C. with respect to a polyimide film and a glossy surface of a copper foil. Flame resistance test of the photosensitive cover lay film showed that the photosensitive cover lay film was extinguished in 4.0 seconds on average. Thus, the photosensitive film got a "pass" in the flame resistance test. Soldering heat resistance test of the photosensitive film showed that the photosensitive film got a "pass" until 360° C. under the Normal Condition, and until 350° C. under the Moisture Condition. Development test of the photosensitive film showed that a hole of a square shape sized 100 μm×100 μm was developed successfully, and the photosensitive film got a "pass".

Comparative Example 11

A photosensitive resin composition was prepared by mixing the same components in the same manner as in Example 25, except that a unbranched methylphenyl siloxane compound (HVAC F-5, made by Shin-Etsu Chemical Co., Ltd.) (phenyl group content: 62.5%) was used instead of the branched methylphenyl siloxane compound. Then, a photosensitive film/three-layer sheet was prepared by the method mentioned above.

The photosensitive film had a compression-bondable temperature of 90° C. with respect to a polyimide film and a glossy surface of a copper foil. Flame resistance test of the photosensitive cover lay film showed that the photosensitive cover lay film was not extinguished within 10 seconds and was burned up with a large flame up to positions of clamps. Thus, the photosensitive film got a "fail" in the flame resistance test. Further, soldering heat resistance test of the photosensitive film showed that the photosensitive film got a "pass" until 360° C. under the Normal Condition, and until 350° C. under the Moisture Condition. Development test of the photosensitive film showed that a hole of a square shape sized 100 μm×100 μm was developed successfully, and the photosensitive film got a "pass".

As shown above, it is impossible to realize flame resistance, if an unbranched siloxane oligomer is used.

Comparative Example 12

A photosensitive resin composition was prepared by mixing the same components in the same manner as in Example 25, except that a copolymer synthesized by copolymerizing methylmethacrylate, n-butylmethacrylate, 2-ethylhexylacrylate, and methacrylic acid in a copolymerization ratio (by weight) of 55:8:15:22 was used instead of the polyimide of Example 25. Then, a photosensitive film/three-layer sheet was prepared by the method mentioned above.

The photosensitive film had a compression-bondable temperature of 80° C. with respect to a polyimide film and a glossy surface of a copper foil. Flame resistance test of the photosensitive cover lay film showed that the photosensitive cover lay film was not extinguished within 10 seconds and was burned up with a large flame up to positions of clamps. Thus, the photosensitive film got a "fail" in the flame resistance test.

As shown above, a photosensitive film in which a copolymer that is not a polyimide is used is poor in flame resistance even if a phosphazen compound is used therein.

Comparative Example 13

A photosensitive resin composition was prepared by mixing the same components in the same manner as in Example 28, except that a copolymer synthesized by copolymerizing methylmethacrylate, n-butylmethacrylate, 2-ethylhexylacrylate, and methacrylic acid in a copolymerization ratio (by weight) of 55:8:15:22 was used instead of the polyimide of Example 28. Then, a photosensitive film/three-layer sheet was prepared by the method mentioned above.

The photosensitive film had a compression-bondable temperature of 80° C. with respect to a polyimide film and a glossy surface of a copper foil. Flame resistance test of the photosensitive film showed that the photosensitive film was not extinguished within 10 seconds and was burned up with a large flame up to positions of clamps. Thus, the photosensitive film got a "fail" in the flame resistance test.

As shown above, a photosensitive film in which a copolymer that is not a polyimide is used is poor in flame resistance even if polyphosphoric melamine is used therein.

Comparative Example 14

A photosensitive resin composition was prepared by mixing the same components in the same manner as in Example 28, except that modified dimethyl silicone having an amino group on each terminal (KF-8010 made by Shin-Etsu Silicone) (phenyl content 0%) instead of the branched methylphenyl siloxane compound. Then, a photosensitive film/three-layer sheet was prepared by the method mentioned above.

The photosensitive film had a compression-bondable temperature of 80° C. with respect to a polyimide film and a glossy surface of a copper foil. Flame resistance test of the photosensitive cover lay film showed that the photosensitive cover lay film was extinguished in 9.0 seconds on average. Thus, the photosensitive film got a "fail" in the flame resistance test.

As shown above, it is impossible to realize flame resistance in an arrangement in which a siloxane compound having no branched main chain and no aromatic group is used.

[Preparation of Photosensitive Film]

In Examples 29 to 33, and Comparative Examples 15 to 18, photosensitive films were prepared as follows.

Into a varnish in which a (A) soluble polyimide was dissolved in a mixture solvent of THF and dioxolan so as to attain 30% solid content % (Sc), a (B) (meth)acrylic compound, a (C) photo reaction initiator, and a (D) fire retardant were mixed. A varnish of a photosensitive resin composition was thereby prepared. The varnish of a photosensitive resin composition was applied on a supporting film (PET film having a thickness of 25 μm) so that the photosensitive resin composition thus applied would be 25 μm in thickness after dried. Then, the photosensitive resin composition thus applied on the PET film was dried at 45° C. for 5 minutes and then at 65° C. for 5 minutes, so as to remove an organic solvent. In this way, a photosensitive film in the B stage condition and a two-layer sheet were obtained.

Next, on the photosensitive film, a protective film was laminated, which was a commercially available film: protect (#6221F) film (made by Sekisui Chemical Co., Ltd.; 50 μm in thickness), which is a PE-PE+EVA coextrusion film. With a roll temperature of 40° C. and a nip pressure of 1500 Pa·m, the laminating was carried out in such a manner that a (PE+EVA) copolymer film surface was in contact with a photosensitive film surface. Thereby, a three-layer sheet was prepared.

[Evaluation of Property of Photosensitive Film]

In Examples 29 to 31, and Comparative Examples 15 to 18, properties of the photosensitive films were evaluated as follows.

<Development Property>

The photosensitive film thus prepared in the above [Preparation of photosensitive film] was placed on an electrolysis copper foil (made by Mitsui Mining & smelting Co., Ltd., 3EC-VLP 1 ounce) in such a manner that a photosensitive resin composition surface of the photosensitive film faced a rough surface of the electrolysis copper foil. While shielding the photosensitive film from light, laminating was performed by applying a temperature of 100° C. and a force of 20,000 Pa·m. On the PET film of a laminate thus prepared, a photomask was placed. Then, the laminate was exposed to light of 400 nm by 400 mJ/cm². After the PET film of a sample thus prepared was peeled off, the sample was heated at 100° C. for 2 minutes, and developed for 3 minuets with 1% potassium hydroxide aqueous solution (having a liquid temperature of 40° C.). The photomask that was placed on a cover film prior to the light exposure had fine holes of 500 µmφ, 200 µmφ, and 100 µmφ, and lines so arranged as line/space of 500 µm/500 µm, 200 µm/200 µmφ and 100 µm/100 µm.

A pattern thus formed by the development was washed with distilled water, thereby removing a developer. It was judged as "pass", if at least the hole of 500 µm and the line of 500 µm/500 µm were formed.

<Adhesion Strength>

The photosensitive film thus prepared in the above [Preparation of photosensitive film] was placed on an electrolysis copper foil (made by Mitsui Mining & smelting Co., Ltd., 3EC-VLP 1 ounce) in such a manner that a photosensitive resin composition surface of the photosensitive film faced a glossy surface of the electrolysis copper foil. While shielding the photosensitive film from light, laminating was performed by applying a temperature of 100° C. and a force of 20,000 Pa·m. A laminate was exposed to light of 400 nm by 400 mJ/cm², and then heated at 180° C. for one hour. Peel adhesion strength of the laminate was performed, following JIS C 6481: Peel-Off Strength (180°).

Example 29

As raw materials of a polyimide, ESDA, BAPS-M, MBAA, and KF-8010 mentioned above and diamino benzoic acid were used. As solvents, N,N'-dimethylformamide (DMF) and dioxolane were used.

<Synthesis of Polyimide>

Into a 500 ml separable flask provided with a stirring apparatus, 17.3 g (0.030 mol) of ESDA and 30 g of DMF were poured, and stirred, by the stirring apparatus, until dissolved. Next, into a solution thus prepared, 5.15 g(0.018 mol)) of diamine MBAA (made by Wakayama Seika Kogyo Ltd) dissolved in 9 g DMF was added. Then, the solution was vigorously stirred for one hour.

Further, as a siloxanediamine, 7.47 g (0.009 mol) of KF-8010 (made by Shin-Etsu Silicone) was added into the solution. Then, the solution was stirred for about one hour. Finally, 1.29 g (0.003 mol) of BAPS-M was added into the solution. Then, the solution was stirred vigorously for one hour. In this way, a polyamide solution was prepared The polyamide solution was transferred into a vat coated with fluorine-based resin. The polyamide solution in the vat was vacuum-dried at 200° C. for 2 hours under a pressure of 5000 Pa. Thereby, 26.40 g of a soluble polyimide was obtained.

15 g of a soluble polyimide thus prepared was dissolved in 50 g of dioxolane. A varnish of solid content % (Sc) of 30% was thereby prepared.

<Preparation of Photosensitive Film>

A photosensitive resin composition was prepared by mixing the following components in the following amounts. Then, a photosensitive film in the B stage condition was prepared on a PET film. On the photosensitive film on the PET film, a protective film was laminated thereby obtaining a three-layer sheet (laminate).

| The soluble polyimide (by solid content by weight): | 50 parts by weight, |
|---|---|
| Bisphenol A EO modified (m + n ≈ 30) diacrylate (NK ester A-BPE-30 made by Shin-Nakamura Chemical Co., Ltd.): | 10 part by weight, |
| Allonix M-215 made by Toagosei Co., Ltd.: | 40 parts by weight, |
| 3,3'4,4'-tetra(t-butylperoxycarbonyl)benzophenone: | 1 part by weight, |
| 4,4'-diethylaminobenzophenone: | 1 part by weight. |

Development test of the photosensitive film showed that a fine hole of 100 µmφ and a line of 100 µm/100 µm were developed successfully, and the photosensitive film got a "pass". Moreover, an adhesive strength of the photosensitive film was 500 Pa · m.

Example 30

<Synthesis of Modified Polyimide>

20.8 g (0.020 mol) of the polyimide synthesized in Example 29 was dissolved in 80 g of dioxolane. Into a solution thus prepared, 0.030 g of 4-methoxy phenol was added and dissolved by moderately heating by using an oil bath of 60° C. Into a solution thus prepared, 3.75 g (0.0264 mol) of glycidyl methacrylate dissolved in 5 g of dioxolane was added, and then 0.01 g of triethylamine was further added as a catalyst. With stirring, a solution thus prepared was heated at 60° C. for 6 hours. In this way, a modified polyimide was synthesized.

<Preparation of Photosensitive Film>

A photosensitive resin composition was prepared by mixing the following components in the following amounts. Then, a photosensitive film in the B stage condition was prepared on a PET film. On the photosensitive film on the PET film, a protective film was laminated thereby obtaining a three-layer sheet.

| The soluble polyimide (by solid content by weight): | 50 parts by weight, |
|---|---|
| Bisphenol A EO modified (m + n ≈ 30) diacrylate (NK ester A-BPE-30 made by Shin-Nakamura Chemical Co., Ltd.): | 10 parts by weight, |
| Allonix M-215 made by Toagosei Co., Ltd.: | 10 parts by weight, |
| 3,3'4,4'-tetra(t-butylperoxycarbonyl)benzophenone: | 1 part by weight, |
| 3,3'-carbonylbis(7-diethylamino)coumarin: | 1 part by weight |

Development test of the photosensitive film thus obtained showed that a fine hole of 100 µmφ and a line of 100 µm/100 µm were developed successfully, and the photosensitive film got a "pass". Moreover, an adhesive strength of the photosensitive film was 600 Pa·m.

Example 31

A photosensitive film/three-layer sheet was obtained in the same manner as in Example 30, except that 1 part by weight of bis(2,4,6-trimethylbenzoil)phenylphosphineoxide was used instead of 1 part by weight of 3,3'4,4'-tetra(t-butylperoxycarbonyl)benzophenone.

Development test of the photosensitive film thus obtained showed that a fine hole of 100 µmφ and a line of 100 µm/100

μm were developed successfully, and the photosensitive film got a "pass". Moreover, an adhesive strength of the photosensitive film was 620 Pa·m.

Comparative Example 15

A photosensitive film/three-layer sheet was obtained in the same manner as in Example 30, except that 1 part by weight of benzophenone was used instead of 1 part by weight of 3,3'4,4'-tetra(t-butylperoxycarbonyl)benzophenone.

Development test of the photosensitive film thus obtained showed that a fine hole of 500 μmφ and a line of 500 μm/500 μm were developed unsuccessfully, and the photosensitive film got a "fail". Moreover, an adhesive strength of the photosensitive film was 120 Pa·m.

Comparative Example 16

A photosensitive film/three-layer sheet was obtained in the same manner as in Example 30, except that 1 part by weight of methyl α-oxobenzeneacetate was used instead of 1 part by weight of 3,3'4,4'-tetra(t-butylperoxycarbonyl) benzophenone.

Development test of the photosensitive film thus obtained showed that a fine hole of 500 μmφ and a line of 500 μm/500 μm were developed unsuccessfully, and the photosensitive film got a "fail". Moreover, an adhesive strength of the photosensitive film was 80 Pa·m.

Comparative Example 17

A photosensitive film/three-layer sheet was obtained in the same manner as in Example 30, except that 1 part by weight of benzoin was used instead of 1 part by weight of 3,3'4,4'-tetra(t-butylperoxycarbonyl)benzophenone.

Development test of the photosensitive film thus obtained showed that a fine hole of 500 μmφ and a line of 500 μm/500 μm were developed unsuccessfully, and the photosensitive film got a "fail". Moreover, an adhesive strength of the photosensitive film was 50 Pa·m.

Comparative Example 18

A photosensitive film/three-layer sheet was obtained in the same manner as in Example 30, except that 1 part by weight of 4,4'-diazidochalcone was used instead of 1 part by weight of 3,3'4,4'-tetra(t-butylperoxycarbonyl)benzophenone.

Development test of the photosensitive film thus obtained showed that a fine hole of 500 μmφ and a line of 500 μm/500 μm were developed unsuccessfully, and the photosensitive film got a "fail". Moreover, an adhesive strength of the photosensitive film was 60 Pa·m.

[Evaluation of Property of Photosensitive Film]

Properties of photosensitive films in Examples 32 and 33, and Comparative Example 19 were carried out as follows.

<Flame Resistance Test>

A flame resistance test was carried out as explained below, following flame resistance test standard UL 94 for plastic raw materials.

Firstly, a protective film was peeled off from a three-layer sheet. Then, a photosensitive film surface was laminated on a polyimide film (made by Kaneka Corp., 25AH film) of 25 μm thickness, by applying a temperature of 100° C. and a force of 20,000 Pa·m while shielding from. Next, a laminate thus formed was exposed to light of 400 nm by 600 mJ/cm².

Then, a supporting film was peeled off from the laminate thus exposed to light. The laminate from which the supporting film had been peeled off was thermally cured by heating for 2 hours in an oven kept at 180° C.

Sample thus prepared was cut into a size of 1.27 cm width×12.7 cm length×50 μm thickness (including the thickness of the polyimide film). 20 pieces of the cut were thus prepared.

10 of the 20 pieces were treated under condition (1) (at 23° C./under 50% relative humidity/for 48 hours), and the other 10 pieces were treated under condition (2) (at 70° C. for 168 hours. After treated as such, the pieces was cooled for 4 hours or longer, the pieces being contained in a desiccator in which anhydrous calcium was placed.

The samples thus prepared were vertically held by clipping upper parts thereof by using clamps. Then, the samples were lit up by approaching, to a lower part thereof, a burner flame for 10 seconds. After 10 seconds the burner flame was moved away. Then, it was measured how long it took to extinguish a flame of the sample or inflammation of the sample. A sample was judged as "pass" if achieving both that the 10 pieces for each condition (conditions (1) and (2)) were extinguished, on average (average of 10 pieces), within 5 seconds after the burner flame was moved away from the samples, and that each of the samples was self-extinguished by extinguishing the flame or combustion within 10 seconds at maximum. A sample was judged as "fail" if any one of the pieces was not extinguished within 10 seconds, or if at least one of the pieces was so combusted that the flame went up to the upper part thereof where the clamp was.

<Development Property>

A photosensitive film surface of a three-layer sheet from which a protective film had been peeled off, was placed on an electrolysis copper foil (made by Mitsui Mining & Smelting Co., Ltd., 3EC-VLP 1 ounce) in such a manner that a photosensitive film surface of the photosensitive film faced a rough surface of the electrolysis copper foil. While shielding the photosensitive film from light, laminating was performed by applying a temperature of 100° C. and a force of 20,000 Pa·m. On a supporting film of a laminate thus prepared, a photomask was placed. Then, the laminate was exposed to light of 400 nm by 1800 mJ/cm². After a supporting film of the sample was peeled off, the sample was developed for 3 minutes with 1% potassium hydroxide aqueous solution (having a liquid temperature of 40° C.). The photomask that was placed on the photosensitive film prior to the light exposure had fine holes of a squire shape sized 500 μm×500 μm, of a squire shape sized 200 μm×200 μm, and of a squire shape sized 100 μm×100 μm. A pattern thus formed by the development was washed with distilled water, thereby removing a developer. It was judged as "pass", if at least the hole a squire shape sized 500 μm×500 μm was formed.

<Line-to-Line Insulating Resistance>

A line-to-line insulating resistance indicates how electrically insulating a photosensitive film is. The larger the resistance, the more electrically insulating the photosensitive film.

Figure 2:
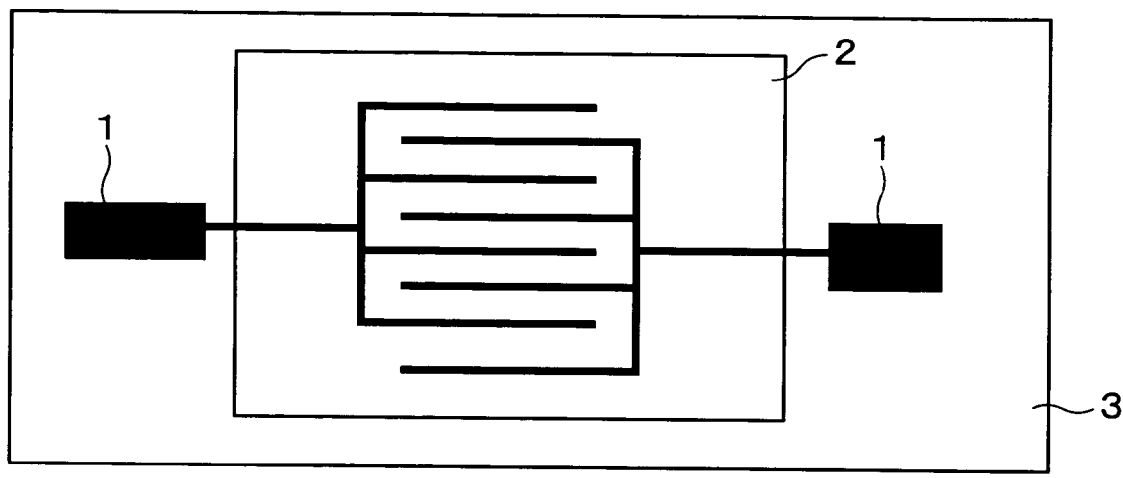
FIG. 2 is a plan view illustrating how to measure line-to-line insulating resistance of the circuit having a comb-shaped pattern for use in an FPC, when using a photosensitive film of another embodiment of the present invention.

A flexible copper-clad laminate (a both-side copper-clad laminate prepared by forming copper foils on both sides of polyimide-based resin) SC 18-25-00WE made by Nippon Steel Chemical Co., Ltd. was etched so as to remove the copper foil on one side thereof. On the thus formed one-side flexible copper-clad laminate, a comb-like shaped pattern of line/space=100 μm/100 μm as shown in FIG. 2 was formed. Note that, in FIG. 2, for the sake of easy explanation, the pattern is so arranged that four lines arranged as line/ space=100 µm/100 µm in a comb-like shape are paired with another four lines similarly arranged in such a manner that each line is alternatively arranged. However, in reality, the pattern is so arranged that ten lines arranged as such are paired with ten lines arranged similarly.

On the pattern of the comb-like shape, a photosensitive film from which a protective film had been peeled off, was laminated, by applying a temperature of 100° C. and a force of 20,000 Pa·m. Then, a laminate thus formed with the pattern was exposed to light of 400 nm by 1800 mJ/cm$^2$. Then, the laminate was heated for 2 hours at 180° C. Thereby, as shown in FIG. 2, a photosensitive film 2 was laminated on a flexible copper-clad laminate 3.

The flexible copper-clad laminate 3 on which the photosensitive film 2 was laminated was subjected to a condition of 65RH % and 20° C. for 24 hours for moisture conditioning. Then, the line-to-line insulating resistance was measured under 65% and 20° C. By using a measurement apparatus in which a digital super resistor R8340A made by Advantest Corp. In a sample box (test fixture R12706A made by Advantest Corp.), an electrode terminal 1 (see FIG. 2) of the flexible copper-clad laminate 3 thus subjected to humidity modification was fixedly attached with a terminal of a test socket. A resistance after 1-minute application of DC 500V after closing the test box was determined as the line-to-line insulating resistance. The higher resistance is more preferable. Here, if a line-to-line insulating resistance was $10 \times 10^{13} \Omega$ or higher, the photosensitive film was judged as "pass". Moreover, as to a duration of the resistance, the photosensitive film was judged as "pass" if a resistance of $10^{10} \Omega$ or higher was sustained for 500 hours.

<Soldering Heat Resistance>

After a protective film was peeled off from a three-layer sheet, a photosensitive film surface thereof was placed on a glossy surface of an electrolysis copper foil of 35 µm, and then laminated thereon by applying a temperature of 100° C. and a force of 20,000 Pa·m. A photosensitive film of a laminate product thus formed, was exposed, via a PET film, to light of a wavelength of 400 nm by 1800 mJ/cm$^2$. After the PET film was peeled off, the laminate product was heated at 180° C. for 2 hours. A laminate sample thus prepared was cut into a square shape of 25 mm×25 mm. After subjected to a condition of 35° C. and 85% humidity for 24 hours for moisture conditioning, The laminate sample of 25 mm×25 mm in size was immersed in a melted solder of 300° C. for 1 minute. Then, the laminate sample was observed for whether the sample had a defect such as swelling, peeling-off, and the like. If no defect was observed, the protective film was judged as "pass".

<Stickiness Strength>

A photosensitive film of a three-layer sheet from which a protective film was peeled off, was placed on a smooth surface of an electrolysis copper-clad foil (3EC-VLP made by Mitsui Mining & Smelting Co., Ltd., 1 ounce), and laminated thereon by applying a temperature of 100° C. and a force of 20,000 Pa·m while shielding light from light. Stickiness strength between the copper foil and the photosensitive film thus laminated was measured.

<Adhesion Strength>

Peel adhesion strength was measured, following JIS C 6481:Peel-off Strength (180°). Note that, in measuring the peel adhesion strength, a width was 1 cm and stickiness strength between the copper film and the photosensitive film was measured.

Example 32

As raw materials of a polyimide, ESDA, BAPS-M, diaminobenzoidic acid, MBAA, and KE-8010 mentioned above were used. As solvents, N,N'-dimethylformamide (DMF) and dioxolane were used.

<Synthesis of Polyimide>

Into a 500 ml separable flask provided with a stirring apparatus, 17.3 g (0.030 mol) of ESDA and 30 g of DMF were poured, and stirred, by the stirring apparatus, until dissolved. Next, into a solution thus prepared, 6.15 g(0.018 mol) of diamine MBAA (made by Wakayama Seika Kogyo Ltd.) dissolved in 9 g DMF was added. Then, the solution was vigorously stirred for one hour. Further, as a siloxanediamine, 7.47 g (0.009 mol) of KF-8010 (made by Shin-Etsu Silicone) was added into the solution. Then, the solution was stirred for about one hour. Finally, 1.29 g (0.003 mol) of BAPS-M was added into the solution. Then, the solution was stirred vigorously for one hour. In this way, a polyamide solution was prepared The polyamide solution was transferred into a vat coated with fluorine-based resin. The polyamide solution in the vat was vacuum-dried at 200° C. for 2 hours under a pressure of 660 Pa by using a vacuum oven. Thereby, 26.40 g of a soluble polyimide was obtained.

15 g of the polyimide thus synthesized was dissolved in 50 g of dioxolane. A varnish of solid content % (Sc) of 30% was thereby prepared.

<Preparation of Photosensitive Film>

A photosensitive resin composition was prepared by mixing the following components in the following amounts. Then, the photosensitive resin composition was applied on a PET film in the method mentioned above, thereby obtaining a photosensitive film in the B stage condition. Further, a protective film was laminated on the photosensitive film, thereby obtaining a three-layer sheet.

| | |
|---|---|
| The soluble polyimide (by solid content by weight): | 50 parts by weight, |
| Phenyl siloxane (KF 56 made by Shin-Etsu Chemical Co., Ltd.): | 25 parts by weight, |
| Phenyl siloxane (KR 211 made by Shin-Etsu Chemical Co., Ltd.): | 5 parts by weight, |
| Bisphenol A EO modified (m + n ≈ 30) diacrylate (NK ester A-BPE-30 made by Shin-Nakamura Chemical Co., Ltd.): | 10 parts by weight, |
| Allonix M-215 made by Toagosei Co., Ltd.: | 10 parts by weight, |
| 3,3',4,4'-tetra(t-butylperoxycarbonyl)benzophenone: | 1 part by weight, |
| 4,4'-diethylaminobenzophenone: | 1 part by weight. |

Flame resistance test of the photosensitive film showed that flame was extinguished in 4 seconds on average. Thus, the photosensitive film passed the UL94V-0 standard. Moreover, development test of the photosensitive film showed that a fine hole of a square sized 100 µm×100 µm was developed successfully. Thus, the photosensitive film got a "pass" in the development test. Further the photosensitive film had an insulating resistance of $2.0 \times 10^{14} \Omega$ in a normal condition, and an adhesion strength of 500 Pa·m. The photosensitive film got a "pass" in soldering heat resistance.

Moreover, prepared was a flexible copper-clad laminate on which the photosensitive film prepared as in the one used in the measurement of the line-to-line insulating resistance was laminated. A resistance of the flexible copper-clad laminate on which the photosensitive film was laminated was measured by applying a DC 100V in a thermo-hygrostat (PL-2FP, made by Tabai Espec Corp.) having a temperature of 80° C. and a humidity of 85% RH. A measuring apparatus used here was ion migration evaluation system AMI-025-PL, made by Tabai Espec Corp. With a migration evaluation system connected with an electrode terminal 1 shown in FIG. 2, a change in measurement values was observed. As a result, a resistance of $10^{10}\Omega$ or more was maintained for 1,000 hours, whereby the photosensitive film got a "pass".

Example 33

<Synthesis of Modified Polyimide>

20.8 g (0.020 mol) of the polyimide synthesized in Example 32 was dissolved in 80 g of dioxolane. Then, 0.030 g of 4-methoxy phenol was added therein, and dissolved by moderately heat application by using an oil bath of 60° C. Into the solution, a solution prepared by dissolving 3.75 g (0.0264 mol) of glycidyl methacrylate in 5 g of dioxolane was added. Further, 0.01 g of triethylamine was added as a catalyst in the solution. Then, the solution was stirred at 60° C. for 6 hours. Thereby a modified polyimide was synthesized.

<Preparation of Photosensitive Film>

The following components in the following amounts were added therein, thereby obtaining a photosensitive resin composition. Then, a photosensitive film/three-layer sheet was prepared in the same fashion as above.

| | |
|---|---|
| The modified polyimide (by solid content by weight): | 50 parts by weight, |
| Phenyl siloxane (KF 56 made by Shin-Etsu Chemical Co., Ltd.): | 5 parts by weight, |
| Phenyl siloxane (KR 211 made by Shin-Etsu Chemical Co., Ltd.): | 5 parts by weight, |
| Bisphenol A EO modified (m + n ≈ 30) diacrylate (NK ester A-BPE-30, made by Shin-Nakamura Chemical Co., Ltd.): | 10 parts by weight, |
| Allonix M-215 made by Toagosei Co., Ltd.: | 10 parts by weight, |
| 3,3',4,4'-tetra(t-butylperoxycarbonyl)benzophenone: | 1 part by weight, |
| 4,4'-diethylaminobenzophenone: | 1 part by weight. |

Flame resistance test of the photosensitive film showed that flame was extinguished in 4 seconds on average. Thus, the photosensitive film passed the UL94V-0 standard. Moreover, development test of the photosensitive film showed that a fine hole of a square sized 100 μm×100 μm was developed successfully. Thus, the photosensitive film got a "pass" in the development test. Further the photosensitive film had an insulating resistance of $7.0 \times 10^{14}\Omega$ in a normal condition, and an adhesion strength of 600 Pa·m. The photosensitive film got a "pass" in soldering heat resistance.

Moreover, prepared was a flexible copper-clad laminate on which the photosensitive film prepared as in the one used in the measurement of the line-to-line insulating resistance was laminated. A resistance of the flexible copper-clad laminate on which the photosensitive film was laminated was measured by applying a DC 100V in a thermo-hygrostat (PL-2FP, made by Tabai Espec Corp.) having a temperature of 85° C. and a humidity of 85% RH. A measuring apparatus used here was ion migration evaluation system AMI-025-PL, made by Tabai Espec Corp. With a migration evaluation system connected with an electrode terminal 1 shown in FIG. 2, a change in measurement values was observed. As a result, a resistance of $10^{10}\Omega$ or more was maintained for 1,000 hours, whereby the photosensitive film got a "pass".

Comparative Example 19

A photosensitive film/three-layer sheet was prepared in the same manner as in Example 32, except that 50 parts by weight of a copolymer solution of methacrylate (methylethyl ketone solution of a ternary copolymer containing methyl methacrylate 57% by weight, methacrylic acid 23% by weight, and butyl acrylate 10% by weight: solid content 32%, Mw=85,000) was added instead of the soluble polyimide.

Flame resistance test of the photosensitive film showed that flame was combusted with flame. Thus, the photosensitive film failed the UL94V-0 standard. Moreover, development test of the photosensitive film showed that a fine hole of a square sized 100 μm×100 μm was developed successfully. Thus, the photosensitive film got a "pass" in the development test (note that the developer used here was 1% aqueous solution of sodium carbonate). Further the photosensitive film had an insulating resistance of $1.0 \times 10^{12}\Omega$ in a normal condition, and an adhesion strength of 400 Pa·m. The photosensitive film was swollen and got a "fail" in soldering heat resistance.

Moreover, prepared was a flexible copper-clad laminate on which the photosensitive film prepared as in the one used in the measurement of the line-to-line insulating resistance was laminated. A resistance of the flexible copper-clad laminate on which the photosensitive film was laminated was measured by applying a DC 100V in a thermo-hygrostat (PL-2FP, made by Tabai Espec Corp.) having a temperature of 85° C. and a humidity of 85% RH. A measuring apparatus used here was ion migration evaluation system AMI-025-PL, made by Tabai Espec Corp. With a migration evaluation system connected with an electrode terminal 1 shown in FIG. 2, a change in measurement values was observed. As a result, a resistance of $10^{10}\Omega$ was not maintained after 100 hours, whereby the photosensitive film got a "fail".

As described above, a photosensitive resin composition and a photosensitive film of the present invention have the following advantages.

(1) By containing the (A) soluble polyimide in its composition, the photosensitive resin composition and the photosensitive film of the present invention are, after cured, excellent in heat resistance, chemical resistance, electronic insulating property, heat resistance, mechanical properties and the like.

(2) Especially, by using an imide(meth)acrylate compound as the (B) (meth)acrylic compound, the photosensitive film has, after cured, flame resistance, soldering heat resistance, flexibility, and chemical resistance.

(3) Because the (C) photo reaction initiator is used therein, the photosensitive resin composition and the photosensitive film of the present invention have higher photosensitivity and allow drawing of fine patterns thereon.

(4) Because the halogen compound, phosphorous compound, and siloxane compound are used as the fire retardant, the photosensitive resin composition and the photosensitive film of the present invention realizes flame resistance, heat resistance and chemical resistance in the cured film. Especially, by using the phosphorous compound, and siloxane compound, it is possible to realize the flame resistance that satisfies the flame resistance standard UL94V-0 for plastic material, without using a halogen compound as the fire retardant.

(5) On the whole, the photosensitive resin composition and the photosensitive film of the present invention are, before being cured, excellent in flowability during the thermal compression bonding and in development property with the alkaline aqueous solution, whereas the photosensitive resin composition and the photosensitive film of the present invention are, after being cured, excellent in flame resistance (flame resistance and self-extinguishing property that satisfy t the flame resistance test standard UL94V-0 for plastic material), heat resistance (soldering heat resistance), chemical resistance (alkaliproof), flexibility, reduction in thickness after imidization, bending resistance (fragility, flexibility), electric insulating property, and mechanical property.

(6) Therefore, the photosensitive resin composition, the photosensitive film, and the laminate of the present invention can be laminated on, as a target object, a flexible printed wiring substrate, or a head of a hard disc apparatus, can be used as a cover lay film for the flexible printed wiring substrate, or the head of the hard disc apparatus, and can be used as a permanent photo resist, and the like.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

As describe above, a photosensitive resin composition, a photosensitive film, and a laminate of the present invention having such excellent property, can be used in the industries for various electronic parts, as well as in the resin industries and chemical industries. Especially, the photosensitive resin composition, the photosensitive film, and the laminate of the present invention can be used in an industry of various printed wiring boards such as flexible printed wiring boards (FPC) and the like, an industry of hard disc apparatuses for use in personal computers and the like (used as a cover lay film in a head part thereof), and the like industries.

What is claimed is:

1. A photosensitive resin composition containing a (A) soluble polyimide and a (B) (meth)acrylic compound, the (A) soluble polyimide (i) being soluble in an organic solvent and (ii) having a structural unit represented by Formula (1):

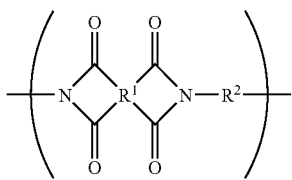

(1)

where $R^1$ is a tetravalent organic group, and $R^2$ is a divalent organic group having a siloxane structure or an aromatic ring structure, and the (B) (meth)acrylic compound containing, as the (A) soluble polyimide having the structural unit represented by Formula (1), a polyimide having a structural unit represented by Formula (3);

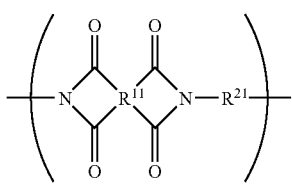

(3)

where $R^{11}$ is a tetravalent organic group containing an aromatic ring structure or an alicyclic structure, $R^{21}$ is at least one of a divalent organic group represented by Formula (4) and a divalent organic group represented by Formula (5):

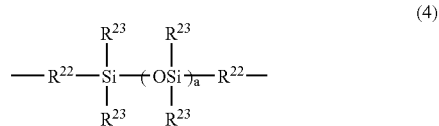

(4)

where each $R^{22}$ is independently a divalent hydrocarbon group or a divalent phenyl group, each $R^{23}$ is independently an alkyl group having 1 to 3 carbon atoms, or a phenyl group, and a is an integer of 3 to 30, and

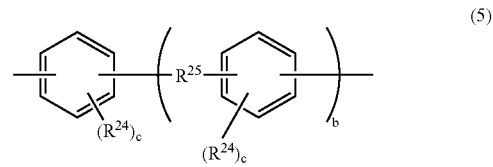

(5)

where each $R^{24}$ is independently a hydroxyl group or a carboxyl group, $R^{25}$ is a direct bond or a divalent organic group selected from the group (6):

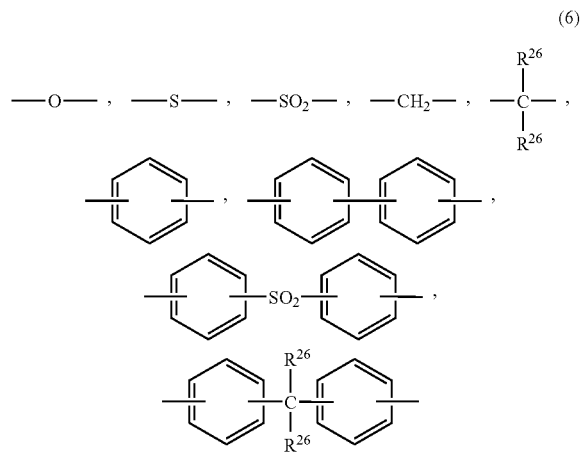

(6)

where each $R^{26}$ is independently a hydrogen atom, a methyl group, or a methyl halide in which 1 to 3 hydrogen atoms are substituted, b is an integer in a range of 0 to 3, and c is an integer of 1 or 2, containing, as the (A) soluble polyimide having the structural unit represented by Formula (3), a first polyimide, a second polyimide and a third polyimide, the first polyimide having a recurring unit having a structure represented by Formula (7):

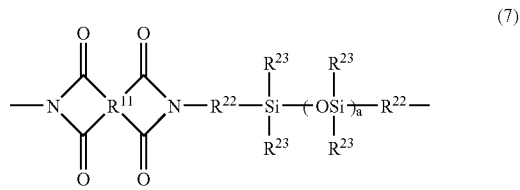

(7)

where $R^{11}$ is identical with $R^{11}$ in Formula (3), $R^{22}$ and $R^{23}$ are identical with $R^{22}$ and $R^{23}$ in Formula (4), and a is an integer of 3 to 30, the second polyimide having a recurring unit having a structure represented by Formula (8):

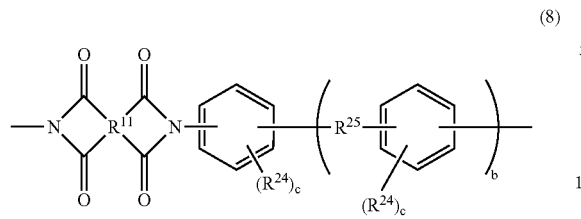
(8)

where $R^{11}$ is identical with $R^{11}$ in Formula (3), $R^{24}$ and $R^{25}$ are respectively identical with $R^{24}$ and $R^{25}$ in Formula (5), b is an integer of 0 to 3, and c is an integer of 1 or 2, the third polyimide having a structure in which $R^{21}$ in Formula (3) excludes a siloxane structure represented by Formula (4), and an aromatic ring structure represented by Formula (5), wherein a first polyimide content is in a range of 5 mol % to 80 mol %, a second polyimide content is in a range of 0.5 mol % to 80 mol %, and third polyimide content is the rest, based on 100 mol % of the (A) soluble polyimide; and wherein a log-mean viscosity (0.5 g/100 ml) of the photosensitive resin composition is 0.16 or more.

2. The photosensitive resin composition as set forth in claim 1, wherein:

in the (A) soluble polyimide having the structural unit represented by Formula (1), $R^1$ in Formula (1) is a tetravalent organic group selected from Group (14):

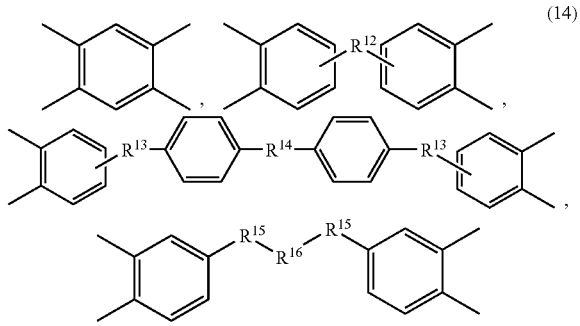
(14)

where $R^{12}$ is a direct bond, —O—, —CH$_2$—, —CO—, —C(CH$_3$)$_2$—, —C(CF$_3$)$_2$—, —SO$_2$, —SO$_2$— or a divalent organic group, each $R^{13}$ is independently —O— or —COO—, $R^{14}$ is a direct bond, —O—, —CH$_2$—, —CO—, —C(CH$_3$)$_2$—, —CH$_2$—C(CH$_3$)$_2$—CH$_2$—, a straight-chain alkyl group having 1 to 20 carbon atoms, —C(CF$_3$)$_2$—, —SO$_2$, SO$_2$—, or a divalent organic group, each $R^{15}$ is independently —COO— or —O—, and each $R^{16}$ is independently —CH$_2$—CH$_2$— or —C$_6$H$_4$—C(CH$_3$)$_2$—C$_6$H$_4$—, or a divalent organic group.

3. The photosensitive resin composition as set forth in claim 2, wherein:

in the (A) soluble polyimide having the structural unit represented by Formula (1), $R^1$ in Formula (1) is a tetravalent organic group selected from Group (15):

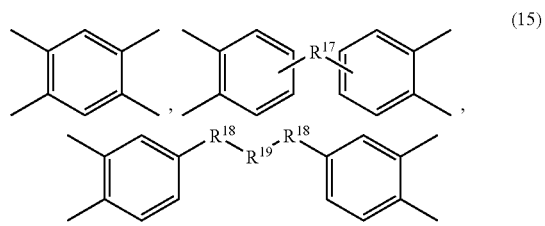
(15)

where $R^{17}$ is any one of a direct bond, —C(CF$_3$)$_2$—, —CO—, and —O—, $R^{18}$ is —COO— or —O—, $R^{19}$ is —CH$_2$CH$_2$—, —C$_6$H$_4$—C(CH$_3$)$_2$—C$_6$H$_4$—, or a divalent organic group, the tetravalent organic group selected from Group (15) comprises 10 mol % or more of the total 100 mol % of $R^1$ in Formula (1).

4. The photosensitive resin composition as set forth in claim 1, wherein:

the (A) soluble polyimide has a boiling point of 120° C. or lower and is soluble in an organic solvent.

5. The photosensitive resin composition as set forth in claim 1, further containing:

a (C) photo reaction initiator.

6. The photosensitive resin composition as set forth in claim 5, wherein:

the (C) photo reaction initiator is a compound that generates a radical by absorbing light of a wavelength in a range of 400 nm to 450 nm.

7. The photosensitive resin composition as set forth in claim 5, wherein:

the (C) photo reaction initiator is an acylphosphineoxide compound or a combination of 3,3',4,4'-tetra(t-butylperoxycarbonyl)benzophenone and a sensitizer.

8. The photosensitive resin composition as set forth in claim 1, further containing:

a (D) fire retardant.

9. The photosensitive resin composition as set forth in claim 8, wherein:

the (D) fire retardant is at least one of (I) a halogen compound containing a halogen atom in its structure, (II) a phosphorous compound containing a phosphorous atom in its structure, and (III) a siloxane containing a siloxane structure in its structure.

10. The photosensitive resin composition as set forth in claim 9, wherein:

the phosphorous compound is contained as the (D) fire retardant, the phosphorous compound is a phosphorous-nitrogen compound having a 10% weight loss temperature not less than 300° C. and not more than 500° C., and containing a phosphorous atom and a nitrogen atom in its one molecule.

11. The photosensitive resin composition as set forth in claim 10, wherein:

the phosphorous-nitrogen compound is at least one kind of compound selected from the group constituting of a phosphazen compound, phosphoric melamine, polyphosphoric melamine, phosphoric ammonium, and polyphosphoric ammonium.

12. The photosensitive resin composition as set forth in claim 10, wherein:

the phosphorous-nitrogen compound is a phosphazen compound represented by Formula (20):

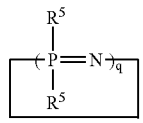

where each $R^5$ is independently a hydrogen atom or a monovalent group containing no halogen atom, and q is an integer of 3 to 30.

13. The photosensitive resin composition as set forth in claim 10, wherein:
the phosphorous-nitrogen compound is contained as the (D) fire retardant,
the (A) soluble polyimide is contained in a range of 30% to 70% by weight,
the (B) (meth)acrylic compound is contained in a range of 1% to 50% by weight, and
the phosphorous-nitrogen compound is contained in a range of 10% to 50% by weight,
based on 100% by weight of a total amount of the (A) soluble polyimide, the (B) (meth)acrylic compound, and the phosphorous-nitrogen compound.

14. The photosensitive resin composition as set forth in claim 9, wherein:
the siloxane compound is contained as the (D) fire retardant,
the siloxane compound is a branched siloxane compound.

15. The photosensitive resin composition as set forth in claim 14, wherein:
the branched siloxane compound contains at least one of T unit and Q unit:

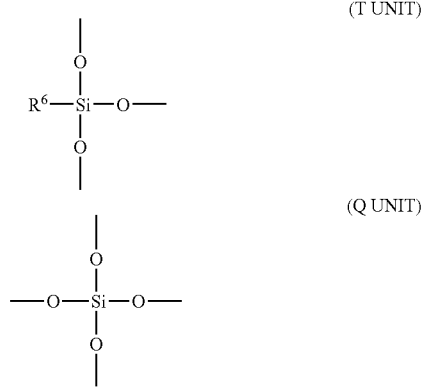

where $R^6$ in T unit is a monovalent organic group; and
a structural unit in which $R^6$ in the T unit is an aromatic group is contained by 20 mol % or more, based on 100 mol % of the T unit.

16. The photosensitive resin composition as set forth in claim 15, wherein:
in the siloxane compound containing the T unit, $R^6$ in the T unit is a phenyl group.

17. The photosensitive resin composition as set forth in claim 14, wherein:
terminal groups of the branched siloxane compound are at least one of a vinyl group and a (meth)acrylic group.

18. The photosensitive resin composition as set forth in claim 14, wherein:
the branched siloxane is contained as the (D) fire retardant,
the (A) soluble polyimide is contained in a range of 30% to 70% by weight,
the (B) (meth)acrylic compound is contained in a range of 1% to 50% by weight, and
the branched siloxane is contained in a range of 10% to 50% by weight,
based on 100% by weight of a total amount of the (A) soluble polyimide, the (B) (meth)acrylic compound, and the branched siloxane.

19. The photosensitive resin composition as set forth in claim 8, wherein:
the (A) soluble polyimide is contained in a range of 30% to 70% by weight,
the (B) (meth)acrylic compound is contained in a range of 5% to 50% by weight, and
the (D) fire retardant is contained in a range of 1% to 50% by weight,
based on 100% by weight of a total amount of the (A) soluble polyimide, the (B) (meth)acrylic compound, and the (D) fire retardant.

20. The photosensitive resin composition as set forth in claim 1, being developable with an alkali aqueous solution after being exposed to light.

21. The photosensitive resin composition as set forth in claim 20, wherein:
the alkali aqueous solution contains at least one of a carbonate of an alkali metal, a hydroxide of an alkali metal, and a tetraammonium hydroxide.

22. The photosensitive resin composition as set forth in claim 1, wherein said composition is applied to a substrate and dried to form a photosensitive film.

23. The photosensitive resin composition as set forth in claim 22, being employed as a photosensitive cover lay film or a photosensitive dry film resist.

24. The photosensitive resin composition as set forth in claim 23, wherein:
the photosensitive film satisfies at least one of properties (1) to (5):
(1) having a curing temperature of 200° C. or less;
(2) having a post-curing thermolysis starting temperature of 300° C. or more;
(3) having a line-to-line insulating resistance of 1013Ω or more after 24-hour moisture conditioning at 20° C. and 65% RH;
(4) being capable of sustaining a resistance of 1010Ω or more for a period of 500 hours or longer at application of a direct current of 100V at 85° C. at 85% RH, in case where the photosensitive film is applied on a cupper-clad board on which a comb-shaped pattern having line/space=100 µm/100 µm is formed; and/or
(5) having a soldering heat resistance of 300° C. or more after 48-hour humidity control at 35° C. at 85% RH.

25. The photosensitive resin composition as set forth in claim 23, wherein:
the photosensitive resin composition is applied to a substrate and dried to form a photo sensitive film,
the photosensitive resin composition is compression-bondable at 150° C. or less onto a target object to which the photosensitive resin composition is to be laminated.

26. The photosensitive resin composition as set forth in claim 25, wherein the target object is a polyimide film or a copper foil having a glossy surface, a compression-bondable temperature in a range of 20° C. to 150° C. when the photosensitive resin composition is in a B stage condition.

27. A photosensitive film produced by applying a photosensitive resin composition to a substrate and dried to form a photo sensitive film, the photosensitive resin composition as set forth in claim 1.

28. The photosensitive film as set forth in claim 27, wherein:
the photosensitive resin composition further contains a (D) fire retardant, which is at least one of (I) a phosphorous compound containing a phosphorous atom in its structure, or (II) a siloxane containing a siloxane structure in its structure.

29. The photosensitive film as set forth in claim 27, being employed as a photosensitive cover lay film or a photosensitive dry film resist.

30. The photosensitive film as set forth in claim 29, being employed as a flexible print wiring substrate or a cover lay film for a head of a hard disc apparatus.

31. A laminate including a photosensitive layer produced from a photosensitive resin composition containing the photosensitive resin composition as set forth in claim 1, and at least one of a (C) photo reaction initiator and a sensitizer.

32. The laminate as set forth in claim 31, being a two-layer sheet formed by laminating a photosensitive layer on a supporting film, or a three-layer sheet formed by laminating a photosensitive layer on a supporting film and further laminating a protective film on the photosensitive layer.

33. The laminate as set forth in claim 32, wherein:
the photosensitive layer is produced by applying, on the supporting film, a resin composition solution, and then drying the resin composition solution on the supporting film, the resin composition solution prepared by dissolving the photosensitive resin composition in an organic solvent.

34. A photosensitive resin composition containing a (A) soluble polyimide and a (B) (meth)acrylic compound, the (A) soluble polyimide (i) being soluble in an organic solvent and (ii) having at least one of a structural unit represented by Formula (1):

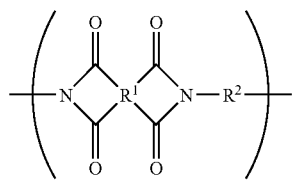

(1)

and a structural unit represented by Formula (2):

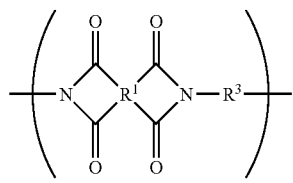

(2)

where, in each formula, $R^1$ is a tetravalent organic group, $R^2$ is a divalent organic group having a siloxane structure or an aromatic ring structure, $R^3$ is a divalent group having, in its structure, a hydroxyl group, a carboxyl group, or a carbonyl group, and
the (B) (meth)acrylic compound containing, as the (B) (meth)acrylic compound an amide(meth)acrylate compound having a structure represented by Formula (16) or Formula (18):

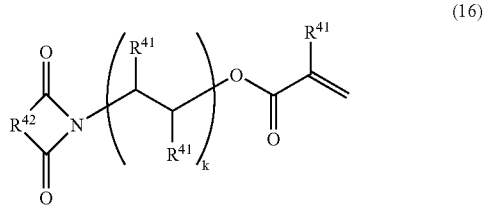

(16)

where each $R^{41}$ is independently a hydrogen atom or a methyl group, $R^{42}$ is a divalent organic group selected from Group (17):

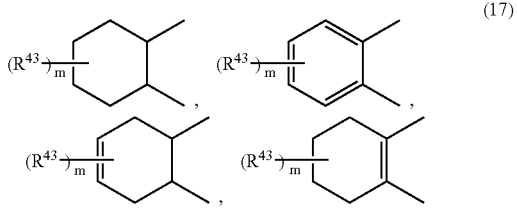

(17)

where $R^{43}$ is a monovalent organic group, m is an integer of 1 to 4) and k is an integer not less than 0,

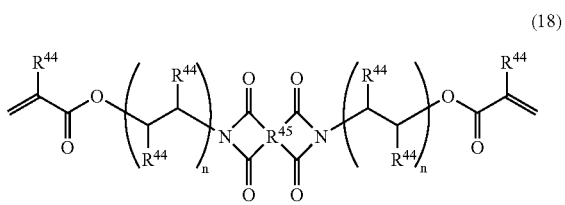

(18)

where each $R^{44}$ is independently a hydrogen atom or a methyl group, and $R^{45}$ is a tetravalent organic group selected from Group (19):

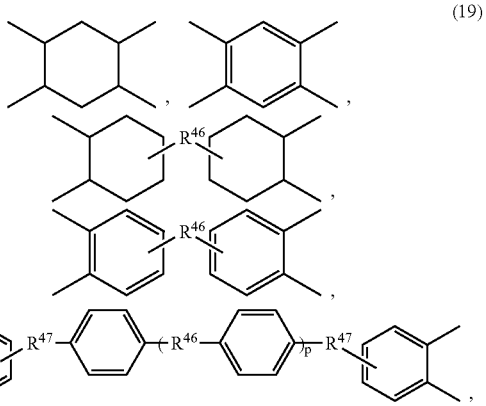

(19)

where each $R^{46}$ and each $R^{47}$ are independently a divalent organic group, and p is an integer of 0 to 5) and n is an integer not less than 0.

35. The photosensitive resin composition as set forth in claim 34, further containing, as the (B) (meth)acrylic compound, a (meth)acrylic compound having a structure having no imide ring.

36. The photosensitive resin composition as set forth in claim 35, wherein:

based on 100% by weight of a total amount of the (A) soluble polyimide and the (B) (meth)acrylic compound, the (A) soluble polyimide is contained in a range of 30% to 70% by weight, and of the (B) (meth)acrylic compound, the imide(meth)acrylate compound is contained in a range of 5% to 60% by weight, and the (meth)acrylic compound having a structure having no imide ring is contained in a range of 1% to 50% by weight.

* * * * *